United States Patent
Furuta et al.

(10) Patent No.: US 9,070,471 B2
(45) Date of Patent: Jun. 30, 2015

(54) SHIFT REGISTER, DISPLAY-DRIVING CIRCUIT, DISPLAYING PANEL, AND DISPLAYING DEVICE

(75) Inventors: Shige Furuta, Osaka (JP); Makoto Yokoyama, Osaka (JP); Yasushi Sasaki, Osaka (JP); Yuhichiroh Murakami, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 125 days.

(21) Appl. No.: 13/377,838

(22) PCT Filed: Mar. 18, 2010

(86) PCT No.: PCT/JP2010/001962
§ 371 (c)(1),
(2), (4) Date: Dec. 13, 2011

(87) PCT Pub. No.: WO2010/146752
PCT Pub. Date: Dec. 23, 2010

(65) Prior Publication Data
US 2012/0081346 A1    Apr. 5, 2012

(30) Foreign Application Priority Data

Jun. 17, 2009    (JP) .................................. 2009-144748

(51) Int. Cl.
*G09G 3/36* (2006.01)
*G06F 3/038* (2013.01)
*G11C 19/28* (2006.01)

(52) U.S. Cl.
CPC .............. *G11C 19/28* (2013.01); *G09G 3/3677* (2013.01); *G09G 2310/063* (2013.01)

(58) Field of Classification Search
CPC ................. G11C 19/28; G09G 3/3688; G09G 2300/0809; G09G 2300/0408; G09G 2310/0286; H02M 3/156; H02M 3/33523; H05B 33/0815; G06F 12/00
See application file for complete search history.

(56) References Cited

U.S. PATENT DOCUMENTS

2001/0022573 A1 *  9/2001  Sasaki et al. .................. 345/100
2001/0052803 A1   12/2001  Ozawa
(Continued)

FOREIGN PATENT DOCUMENTS

JP    2000347627 A    12/2000
JP    2002-141790 A   5/2002
(Continued)

OTHER PUBLICATIONS

International Search Report

*Primary Examiner* — Alexander Eisen
*Assistant Examiner* — Nan-Ying Yang
(74) *Attorney, Agent, or Firm* — Harness, Dickey & Pierce, P.L.C.

(57) ABSTRACT

Provided is a shift register of a display-driving circuit which carries out simultaneous selection of a plurality of signal lines by using a simultaneous selection signal. A stage of the shift register includes (i) a set-reset type flip-flop and (ii) a signal generating circuit which generates an output signal of the stage by selectively outputting a signal in response to an output of the flip-flop. The output signal of the stage (i) becomes active due to an activation of the simultaneous selection signal and then (ii) remains active while the simultaneous selection is being performed, and the output from the flip-flop is inactive during a period in which a setting signal and a resetting signal are both being active. This makes it possible to quickly carry out the simultaneous selection of all the signal lines and the initialization of the shift register.

30 Claims, 34 Drawing Sheets

(56) References Cited

U.S. PATENT DOCUMENTS

| | | | |
|---|---|---|---|
| 2002/0039096 A1* | 4/2002 | Katsutani | 345/204 |
| 2002/0140689 A1* | 10/2002 | Huang et al. | 345/208 |
| 2002/0154084 A1* | 10/2002 | Tanaka et al. | 345/92 |
| 2003/0030616 A1* | 2/2003 | Maeda et al. | 345/98 |
| 2004/0150610 A1* | 8/2004 | Zebedee et al. | 345/100 |
| 2005/0036078 A1 | 2/2005 | Tsunashima et al. | |
| 2005/0184784 A1 | 8/2005 | Washio et al. | |
| 2006/0227096 A1 | 10/2006 | Fujita | |
| 2009/0109161 A1 | 4/2009 | Yamamoto et al. | |
| 2009/0121998 A1* | 5/2009 | Ohkawa et al. | 345/100 |
| 2010/0128009 A1 | 5/2010 | Okada et al. | |
| 2010/0158186 A1* | 6/2010 | Moon et al. | 377/76 |

FOREIGN PATENT DOCUMENTS

| | | |
|---|---|---|
| JP | 2004227751 A | 8/2004 |
| JP | 2005-049849 A | 2/2005 |
| JP | 2005244956 A | 9/2005 |
| JP | 2006-313319 A | 11/2006 |
| WO | WO-2007010835 A1 | 1/2007 |
| WO | WO 2007108177 A1 * | 9/2007 |
| WO | WO-2007108177 A1 | 9/2007 |
| WO | WO-2009028353 A1 | 3/2009 |
| WO | WO-2009/050926 A1 | 4/2009 |

* cited by examiner

SHIFT REGISTER, DISPLAY-DRIVING CIRCUIT, DISPLAYING PANEL, AND DISPLAYING DEVICE

TECHNICAL FIELD

The present invention relates to a shift register and various kinds of display drivers.

BACKGROUND ART

Patent Literature 1 (see FIG. 34) discloses a configuration in which an output of each stage of a shift register included in a gate driver is supplied to an NAND circuit, and a DCG signal is also supplied to the NAND circuit. Moreover, an output of the NAND circuit is supplied to a corresponding scanning signal line. With the configuration, by causing the DCG signal to be active when a power supply of a liquid crystal display device is turned on or off, it is possible to simultaneously select all the scanning signal lines so that a Vcom (common electrode electric potential) is written into all pixels.

Patent Literature 2 (see FIG. 35) discloses a gate driver which includes a shift register having a plurality of stages. Each of the plurality of stages has (i) a set-reset type flip-flop and (ii) a gate circuit including an analog switch 43 and an n-channel transistor 45. Moreover, a clock signal CK is supplied to the analog switch 43, a source of an n-channel transistor 44 is connected to a VSS, and an output of each of the stages is supplied to a corresponding scanning signal line. In the configuration, when a power supply of a liquid crystal display device is turned on or off, output signals of all the stages become active by causing a setting signal to the first stage of the shift register to become active while the clock signal CK is being fixedly active. This makes it possible to simultaneously select all the scanning signal lines so that a Vcom (common electrode electric potential) is written into all pixels.

CITATION LIST

Patent Literature

Patent Literature 1

Japanese Patent Application Publication, Tokukai, No. 2000-347627 (Publication Date: Dec. 15, 2000)

Patent Literature 2

International Publication NO. WO2007/108177 (Publication Date: Sep. 27, 2007)

SUMMARY OF INVENTION

Technical Problem

The conventional gate driver has a problem that setup time for turning on or off the power supply is prolonged because it is necessary to initialize the flip-flop (i.e., to cause the output to be inactive) of each of the stages of the shift register after all the scanning signal lines are simultaneously selected.

An object of the present invention is to provide a shift register and various kinds of drives each of which quickly carries out (i) simultaneous selection of a plurality of signal lines and (ii) initialization of the shift register.

Solution to Problem

A shift register of the present invention is, for example, a shift register for use in a display-driving circuit which carries out simultaneous selection of a plurality of signal lines at a predetermined timing, wherein: a stage of the shift register includes (i) a set-reset type flip-flop and (ii) a signal generating circuit receiving a simultaneous selection signal, the signal generating circuit generating an output signal of the stage by use of an output of the flip-flop; the output signal of the stage (i) becomes active due to an activation of the simultaneous selection signal and then (ii) remains active during the simultaneous selection; and the output of the flip-flop is inactive during a period in which a setting signal and a resetting signal are both being active.

During the period in which the simultaneous selection is being carried out, the output signal of the each of the stages is being active. This causes both the setting signal and the resetting signal, which are supplied to the flip-flop of the each of the stages, to be active. The configuration employs the flip-flop which remains inactive during a period in which both the setting signal and the resetting signal are being active. Accordingly, the flip-flop of the each of the stages is initialized (i.e., caused to be inactive) while the simultaneous selection is carried out. This makes it possible to quickly complete the simultaneous selection and the initialization of the shift register because the shift register is initialized while the simultaneous selection is carried out. Moreover, it is possible to reduce a size of each of various kinds drives encompassing the shift register, because it is not necessary to provide a configuration for generating and transmitting a signal for initializing the shift register.

Advantageous Effects of Invention

As described above, the present invention makes it possible to quickly carry out (i) the simultaneous selection of the plurality of signal lines and (ii) the initialization of the shift register.

DESCRIPTION OF EMBODIMENTS

The following describes embodiments of the present invention with reference to FIGS. 1 through 33. Note that, in the following descriptions, it is assumed that a set-reset type flip-flop (hereinafter, sometimes abbreviated to "FF") has (i) a set terminal (an S-terminal or an SB-terminal) to which a setting signal (an S-signal or an SB-signal) is supplied, (ii) a reset terminal (an R-terminal or an RB-terminal) to which a resetting signal (an R-signal or an RB-signal) is supplied, (iii) an output terminal (a Q-terminal) from which a Q-signal is outputted, and (iv) an inverted-output terminal (a QB-terminal) from which a QB-signal is outputted. Note that an electric potential of a high potential side power supply (VDD) is referred to as "Vdd" (hereinafter, sometimes referred to also as "High"), and an electric potential of a low potential side power supply (VSS) is referred to as "Vss" (hereinafter, sometimes referred to also as "Low"). The S-signal (the setting signal), the R-signal (the resetting signal), and the Q-signal (an output signal) become High when each of these signals is in an active state. The SB-signal (a set bar signal), the RB-signal (a reset bar signal), and the QB-signal (an inverted-output signal) become Low when each of these signals is in an active state.

Embodiment 1

Figure 1:
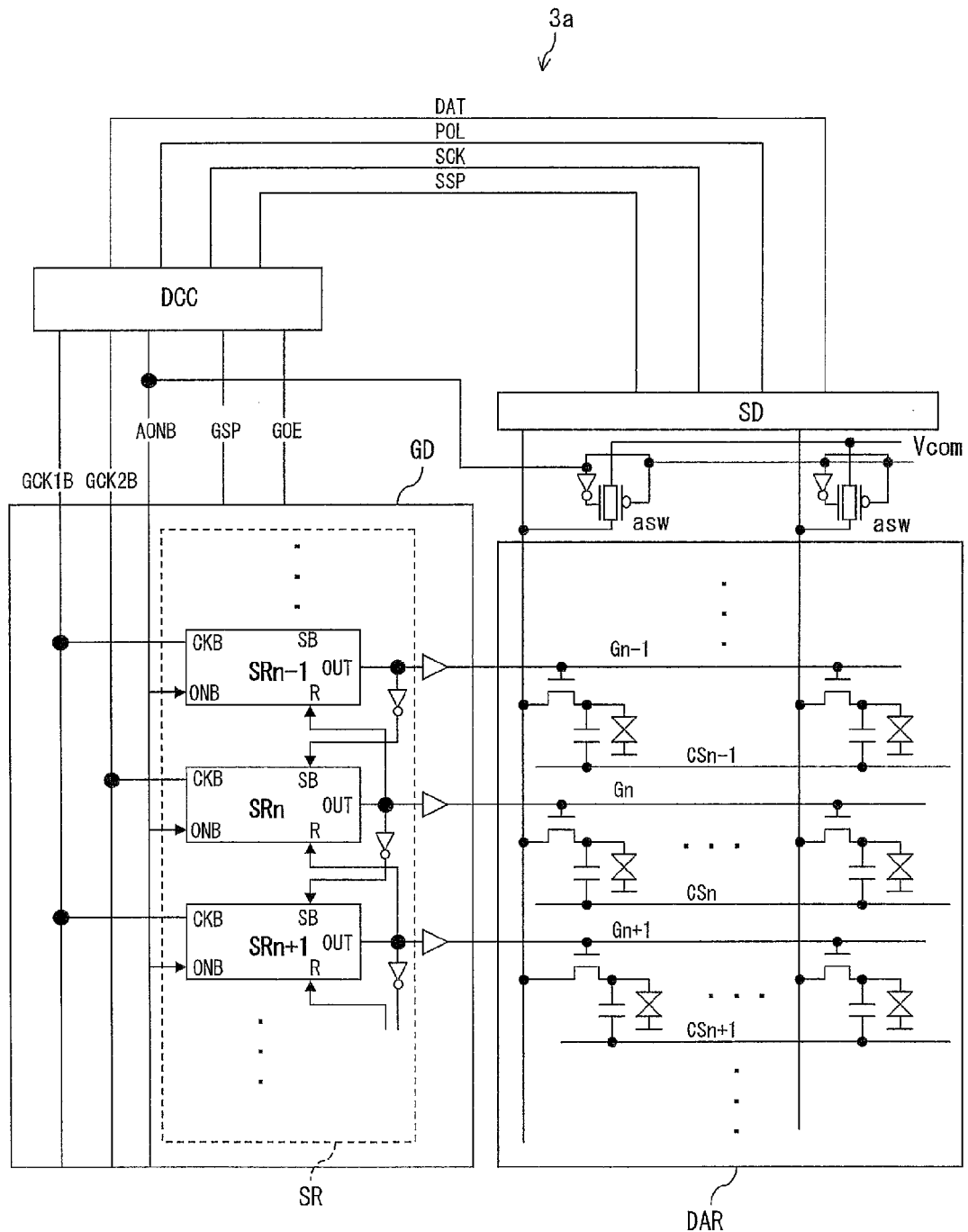
FIG. 1 is a schematic view illustrating a configuration of a liquid crystal display device of Embodiment 1 of the present invention.

FIG. 1 is a circuit diagram illustrating a configuration of a liquid crystal display device 3a of the present invention. The liquid crystal display device 3a includes a display section DAR, a gate driver GD, a source driver SD, and a display control circuit DCC. The display control circuit DCC supplies, to the gate driver GD, an AONB-signal (all-ON signal), a gate start pulse GSP, a gate on enable signal GOE, and gate clock signals GCK1B and GCK2B. Moreover, the display control circuit DCC supplies, to the source driver SD, a source start pulse SSP, digital data DAT, a polarity signal POL, and a source clock signal SCK. The gate driver GD includes a shift register SR having a plurality of stages. Hereinafter, an i-th stage (i=1, ... n−1, n, n+1, ...) of the shift register is shortly referred to as "i-th stage SRi", as appropriate.

An output signal (OUT-signal) of the i-th stage SRi of the shift register is supplied to a scanning signal line Gi of the display section DAR via a buffer. For example, an OUT-signal of an n-th stage SRn is supplied to a scanning signal line Gn via a buffer. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

Figure 2:
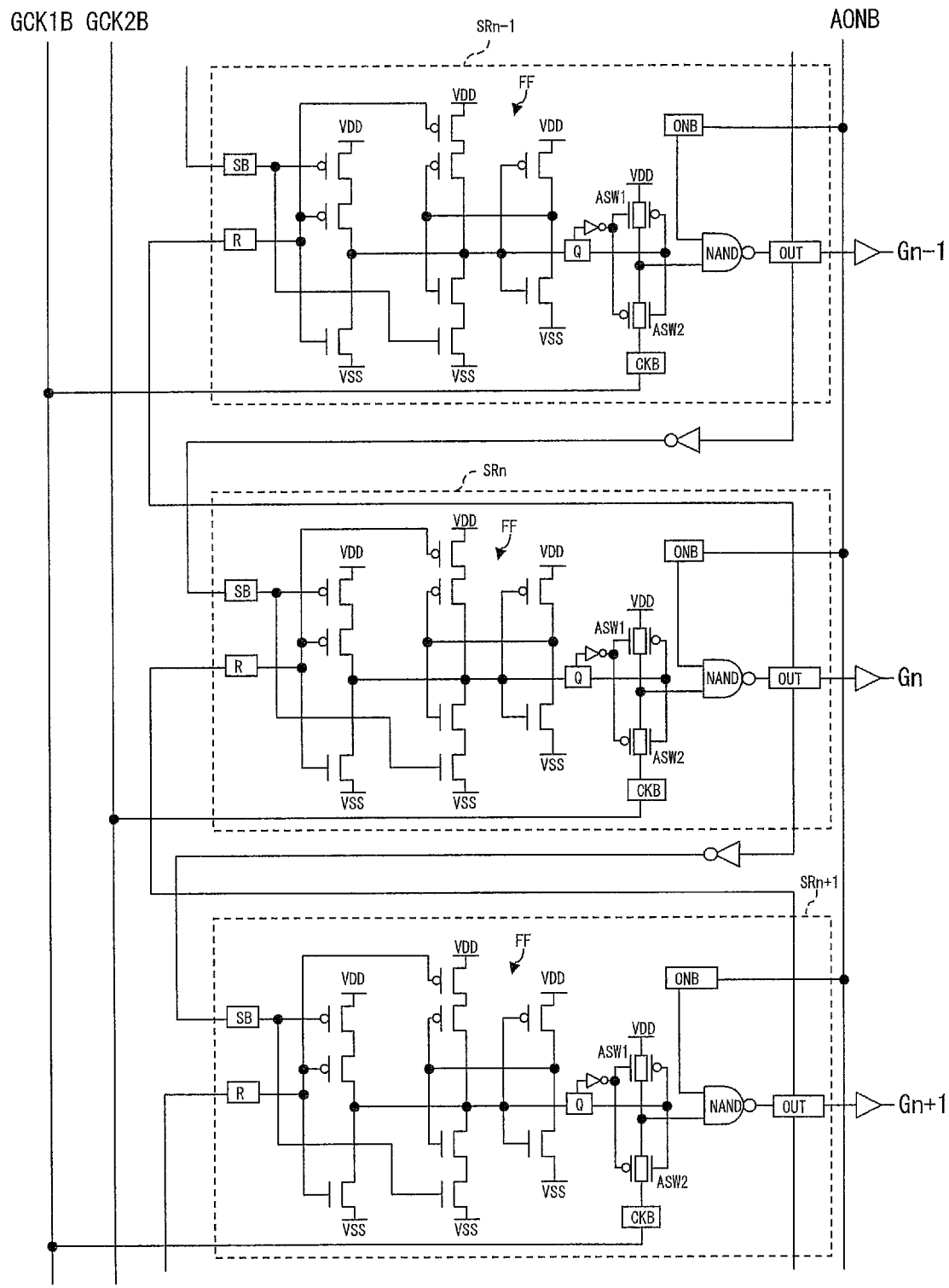
FIG. 2 is a circuit diagram partially illustrating a shift register of the liquid crystal display device shown in FIG. 1.

FIG. 2 is a circuit diagram partially illustrating a concrete configuration of the shift register SR. As shown in FIG. 2, each of the stages of the shift register includes (i) a set-reset type flip-flop FF having an SB-terminal and an R-terminal, (ii) two analog switches ASW1 and ASW2, (iii) an NAND circuit, (iv) two inverters, (v) a CKB terminal, (vi) an ONB terminal, and (vii) an OUT terminal. A Q-terminal of the flip-flop FF is connected to a p-channel side gate of the analog switch ASW1, an n-channel side gate of the analog switch ASW2, and an input terminal of one of the two inverters. An output terminal of the one of the two inverters is connected to an n-channel side gate of the analog switch ASW1 and a p-channel side gate of the analog switch ASW2. One conduction electrode of the analog switch ASW1 is connected to the VDD, and one conduction electrode of the analog switch ASW2 is connected to the CKB terminal. The other conduction electrode of the analog switch ASW1, the other conduction electrode of the analog switch ASW2, and one input terminal of the NAND circuit are connected with each other. The other input terminal of the NAND circuit is connected with the ONB terminal. An output terminal of the NAND circuit is connected to the OUT terminal, which serves as an output terminal of that stage.

In the shift register SR, each of the stages has (i) an OUT terminal which is connected to an SB-terminal of a following stage of the stage via the other of the two inverter and (ii) an R-terminal which is connected to an OUT terminal of the following stage of the stage. For example, an OUT terminal of the n-th stage SRn is connected to an SB-terminal of an (n+1)th stage SRn+1 via an inverter, and an OUT terminal of the (n+1)th stage SRn+1 is connected to an R-terminal of the n-th stage SRn. Note that a first stage SR1 of the shift register SR has an SB-terminal to which a GSPB signal is supplied. In the gate driver GD, a CKB terminal of an odd-numbered stage is connected to a GCK line (via which the gate clock signal GCK is supplied) which is different from a GCK line to which a CKB terminal of an even-numbered stage is connected. For example, a CKB terminal of the n-th stage SRn is connected to a GCK2B signal line, and a CKB terminal of the (n+1)th stage SRn+1 is connected to a GCK1B signal line.

Figure 3:
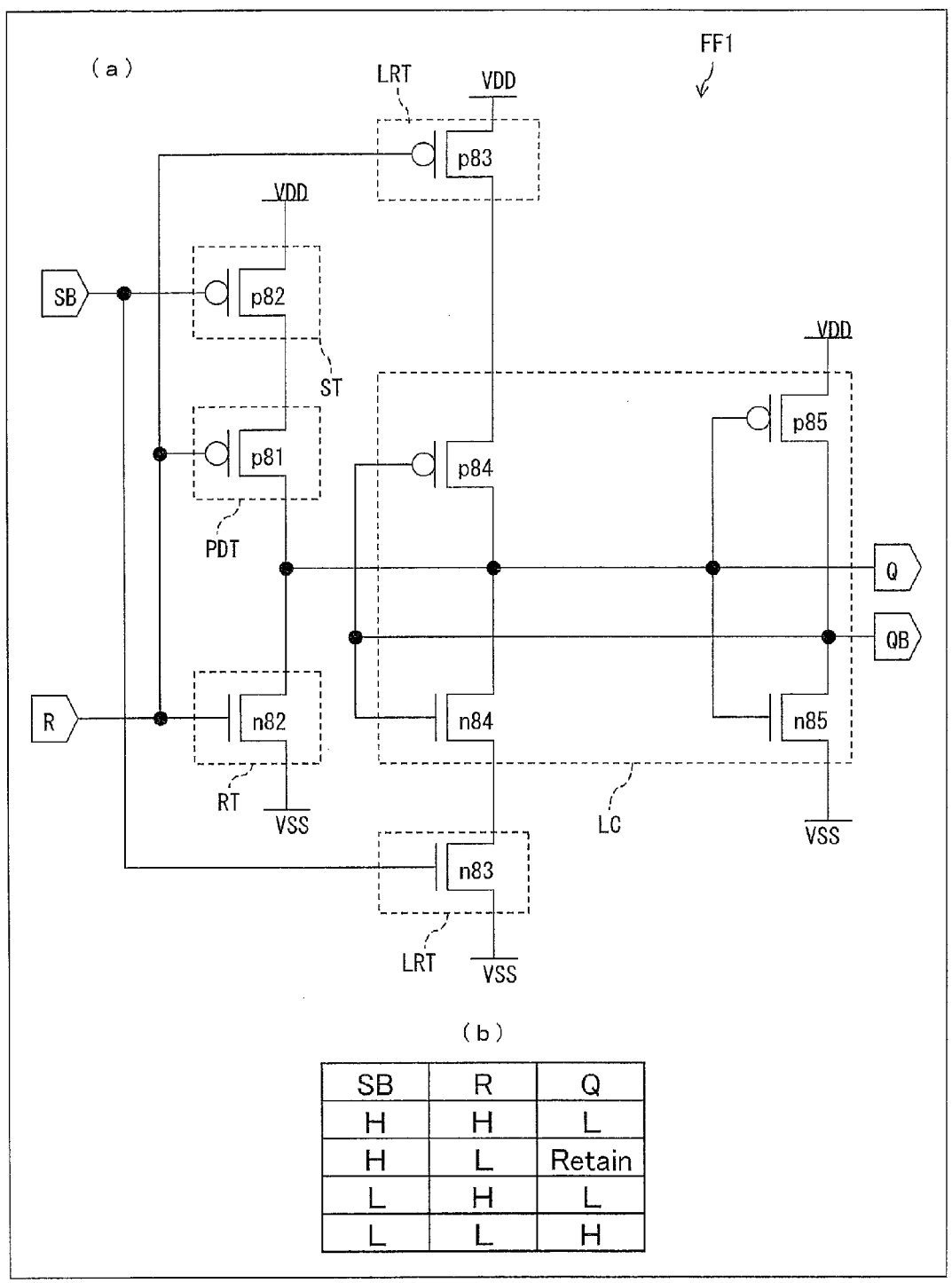
FIG. 3 (a) is a circuit diagram of a flip-flop of the shift register shown in FIG. 2, and (b) is a truth table of the flip-flop.

As the flip-flop FF shown in FIG. 2, a flip-flop FF1 shown in FIG. 3 is used. As shown in FIG. 3, the flip-flop FF1 includes (i) a p-channel transistor p84 and an n-channel transistor n84 which constitute a CMOS circuit, (ii) a p-channel transistor p85 and an n-channel transistor n85 which constitute a CMOS circuit, (iii) p-channel transistors p81, p82, and p83, (iv) n-channel transistors n82 and n83, and (v) an SB-terminal, an R-terminal, a Q-terminal, and a QB-terminal. A gate of the transistor p84, a gate of the transistor n84, a drain of the transistor p85, a drain of the transistor n85, and the QB-terminal are connected with each other. A drain of the transistor p84, a drain of the transistor n84, a drain of the transistor p81, a drain of the transistor n82, a gate of the transistor p85, a gate of the transistor n85, and the Q-terminal are connected with each other. A source of the transistor n84 is connected to a drain of the transistor n83. A source of the transistor p84 is connected to a drain of the transistor p83. A source of the transistor p81 is connected to a drain of the transistor p82. The SB-terminal is connected to a gate of the transistor p82 and a gate of the transistor n83. The R-terminal is connected to a gate of the transistor n82, a gate of the transistor p81, and a gate of the transistor p83. A source of the transistor n85 is connected to the VSS. Sources of the transistors p82, p83, and p85 are connected to the VDD. Sources of the transistors n82 and n83 are connected to the VSS. Here, the transistors p84, n84, p85, and n85 constitute a latch circuit LC, the transistor p82 serves as a set transistor ST, the transistor n82 serves as a reset transistor RT, each of the transistors p83 and n83 serves as a latch release transistor LRT, and the transistor p81 serves as a priority determining transistor PDT.

(b) of FIG. 3 is a truth table of the flip-flop FF1. A Q-signal of the flip-flop FF1 is to have a state as follows (see (b) of FIG. 3): during a period in which an SB-signal is High (inactive) and an R-signal is High (active), the Q-signal is Low (inactive); during a period in which the SB-signal is High (inactive) and the R-signal is Low (inactive), the Q-signal is in a retention state; during a period in which the SB-signal is Low (active) and the R-signal is High (active), the Q-signal is Low (inactive); and during a period in which the SB-signal is Low (active) and the R-signal is Low (inactive), the Q-signal is High (active). In the flip-flop FF1, the transistor n82 is turned on when the SB-signal and the R-signal both become active, and accordingly the Q-signal is caused to have the Vss (Low). This causes the R-signal (reset) to have priority.

Figure 4:
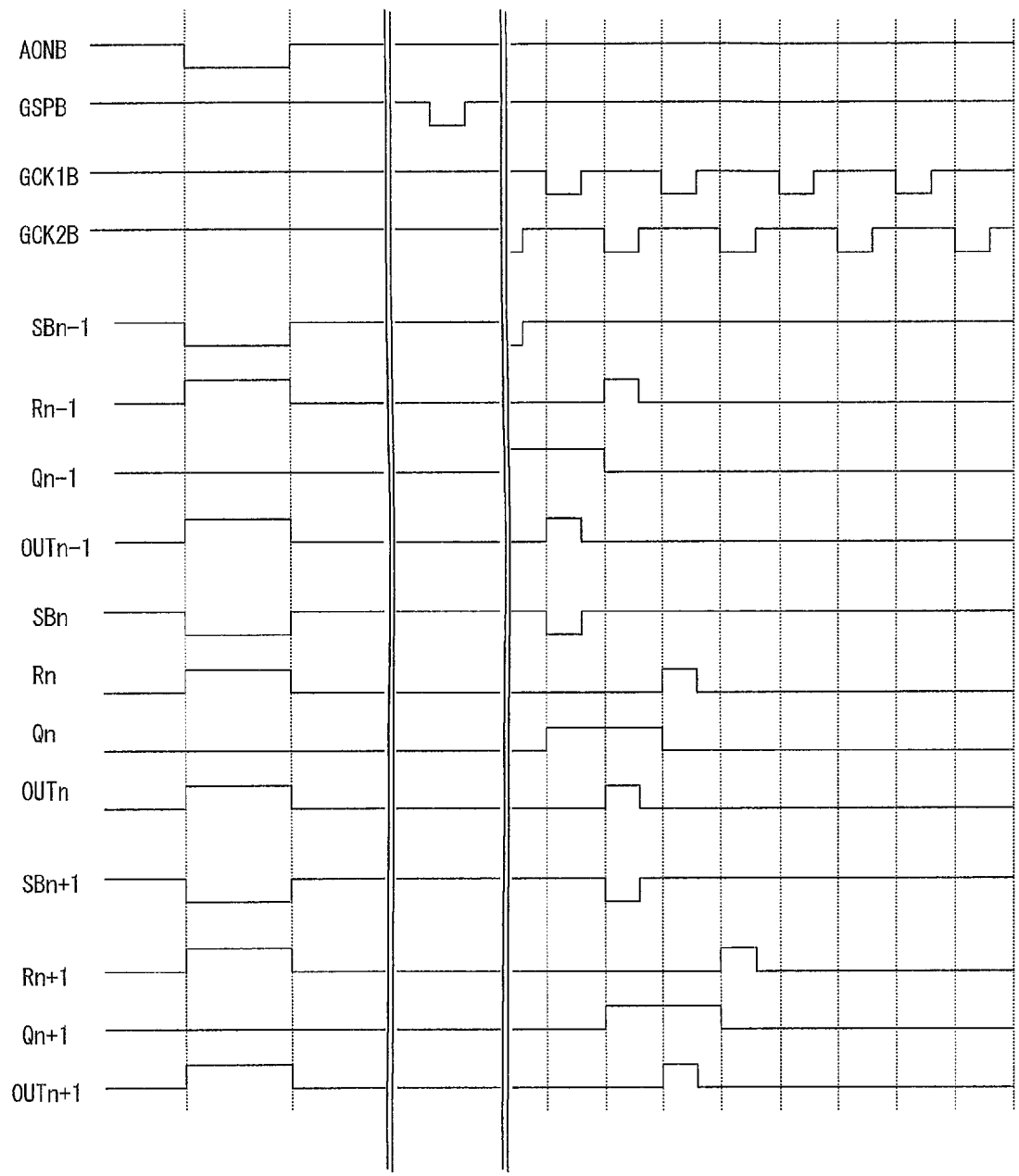
FIG. 4 is a timing chart illustrating how the liquid crystal display device shown in FIG. 1 is driven.

FIG. 4 is a timing chart illustrating how the liquid crystal display device 3a is driven. Note that, in FIG. 4, "AONB" indicates an AONB-signal (all-ON signal), "GSPB" indicates a gate start pulse bar signal, "GCK1B" indicates a GCK1B signal, "GCK2B" indicates a GCK2B signal. Moreover, "SBi", "Ri", "Qi", and "OUTi" (i=n−1, n, n+1) indicate an SB-signal (i.e., an electric potential at the SB-terminal), an R-signal (i.e., an electric potential at the R-terminal), a Q-signal (i.e., an electric potential at the Q-terminal), and an OUT-signal (i.e., an electric potential at the OUT terminal) in the i-th stage SRi, respectively.

In the liquid crystal display device 3a, the following display preparation operation is carried out prior to the first frame (vertical scan period) of a displayed video. Specifically, the AONB-signal is caused to be active (Low) for a predetermined period of time. In each of the stages of the shift register SR, one of the inputs to the NAND circuit becomes low, and accordingly an output of the NAND circuit becomes High. This causes the OUT-signals of all the stages become active (High), and accordingly all the scanning signal lines are selected. At the time, the analog switches asw provided for the respective data signal lines are turned on, and accordingly the Vcom is applied to all the data signal lines. Moreover, the SB-signal supplied to the flip-flop FF of each of the stages becomes active (Low) and the R-signal supplied to the flip-flop FF also becomes active (High), and accordingly the Q-signal of the flip-flop FF becomes inactive (Low). This is because, in the flip-flop FF, the R-signal (reset) has priority in the case where the SB-signal and the R-signal simultaneously become active. After the display preparation operation is ended (i.e., after the AONB-signal becomes inactive), the Vcom is written into all the pixels PIX in the display section DAR, and the Q-signals of the respective flip-flops FF in the shift register SR become inactive (Low).

Moreover, in the shift register SR of the liquid crystal display device 3a, the following operation is carried out in each vertical scan period (at which a frame is displayed). Specifically, each stage of the shift register SR is configured as follows. When an SB-signal supplied to a stage in the shift register SR becomes active (=Low), a flip-flop FF of the stage is set and accordingly a Q-signal becomes High (active). This causes a GCKB signal to be received by the stage via an analog switch ASW2. When the GCKB signal in the stage becomes active (=Low), an OUT-signal of the stage becomes active (High) and an SB-signal in a following stage of the stage becomes active. This causes an OUT-signal of a flip-flop FF of the following stage of the stage to become active, and accordingly a GCKB signal is received by the following stage of the stage. When the GCKB signal in the following stage of the stage becomes active (=Low), the flip-flop FF of the stage is reset and accordingly the Q-signal becomes Low (inactive). This causes an analog switch ASW1 of the stage to be turned on. At the time, the AOB-signal is High, and accordingly both inputs to an NAND circuit of the stage become High and an output of the NAND circuit becomes Low. This causes the OUT-signal of the stage to become Low (inactive, i.e., the flip-flop FF is initialized).

In the liquid crystal display device 3a, for example, it is possible to apply an identical electric potential (e.g., Vcom) to all the pixels by simultaneously selecting all the scanning signal lines before starting a display. This makes it possible to prevent a disordered screen caused before the display is started or after the display is ended. Moreover, the shift register is initialized (the flip-flops of the respective stages are initialized) when the simultaneous selection of all the scanning signal lines is carried out. This makes it possible to carry out the preparation operation before starting the display more quickly, as compared to the conventional liquid crystal display device which separately carries out the simultaneous selection of all the scanning signal lines and the initialization of the shift register. Further, it is not necessary to prepare configurations for generating and transmitting an initialization signal for the shift register, and it is therefore possible to reduce a size of the gate driver.

Figure 5:
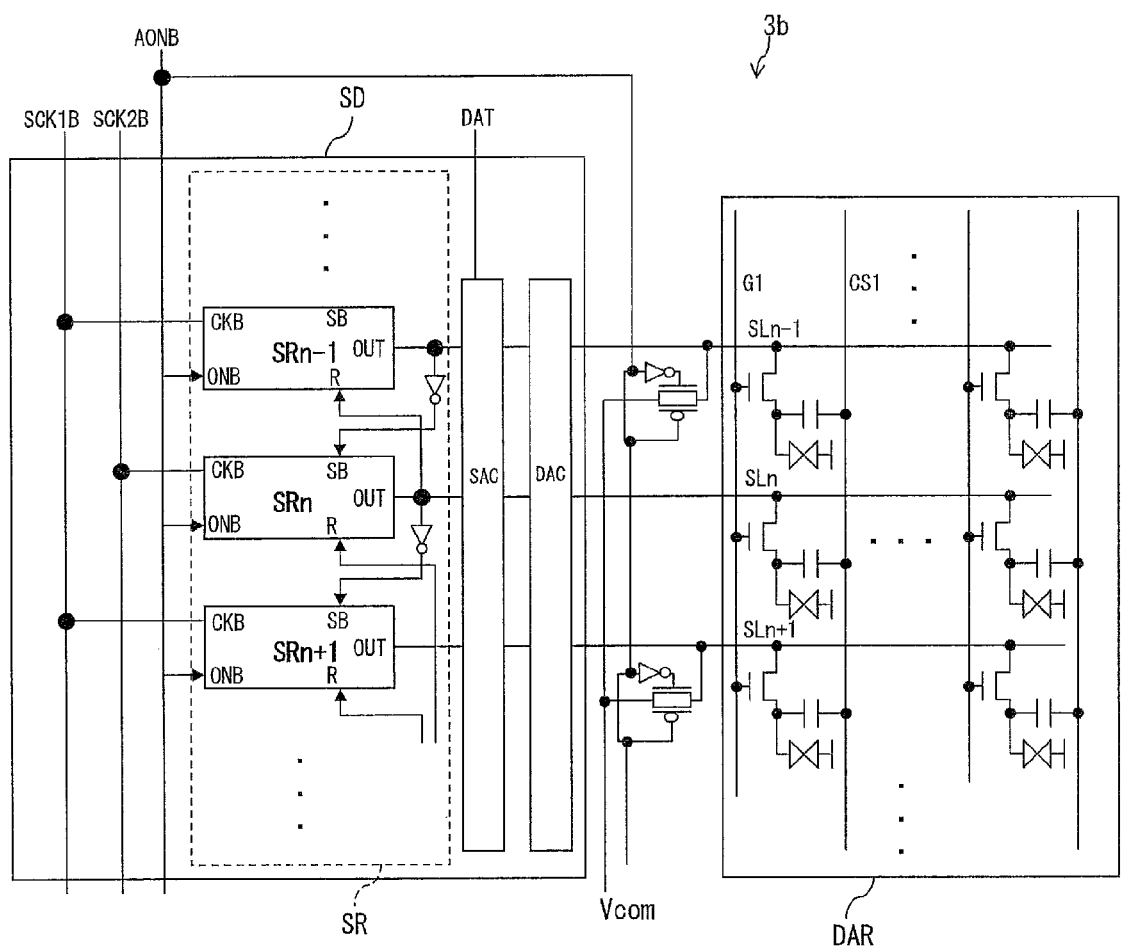
FIG. 5 is a schematic view illustrating another configuration of the liquid crystal display device of Embodiment 1 of the present invention.

FIG. 5 is a circuit diagram illustrating a configuration of a liquid crystal display device 3b in which the shift register SR shown in FIG. 1 is provided on a source driver side. In the configuration, a source start pulse SSP is supplied to the first stage of the shift register SR, and a source clock bar signal SCK1B or SCK2B is supplied to the CKB terminal of the each stage. Moreover, the OUT-signal outputted from the i-th stage SRi is supplied to a sampling circuit SAC, and data sampled based on the OUT-signal is supplied to a data signal line SLi of the display section DAR via a DAC. For example, the OUT-signal of the n-th stage SRn is supplied to the sampling circuit SAC, and then data sampled based on the OUT-signal is supplied to a data signal line SLn of the display section DAR via the DAC. In the display section DAR, the data signal line SLn is connected to a source of a transistor connected with a pixel electrode in the pixel PIXn.

Figure 6:
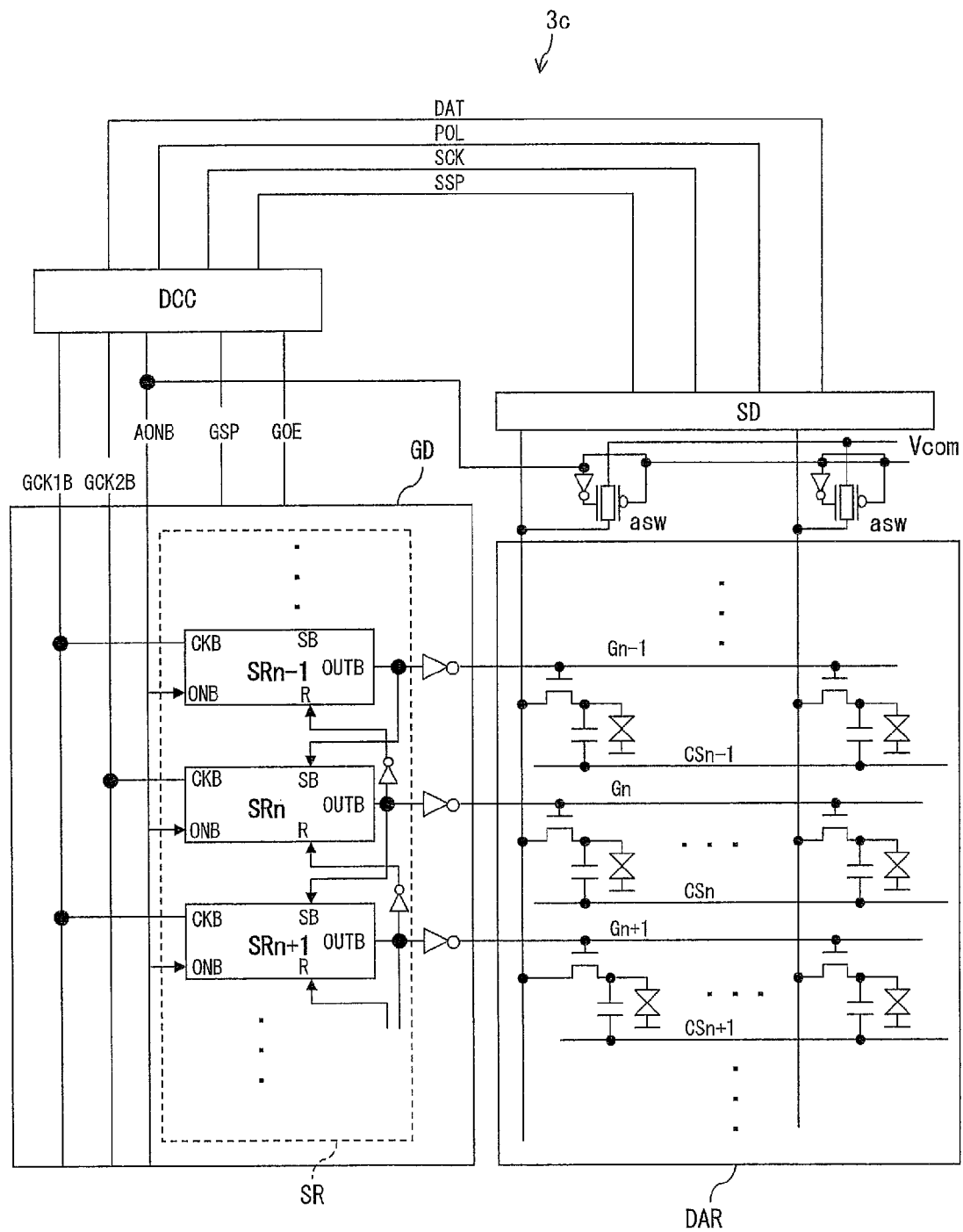
FIG. 6 is a schematic view illustrating yet another configuration of the liquid crystal display device of Embodiment 1 of the present invention.

FIG. 6 is a circuit diagram illustrating a configuration of a liquid crystal display device 3c which is configured by modifying the liquid crystal display device 3a. In the liquid crystal display device 3c, an output signal (OUTB-signal) of the i-th stage SRi of the shift register is supplied to the scanning signal line Gi of the display section DAR via an inverter. For example, an OUTB-signal of an n-th stage SRn is supplied to a scanning signal line Gn via an inverter. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Figure 7:
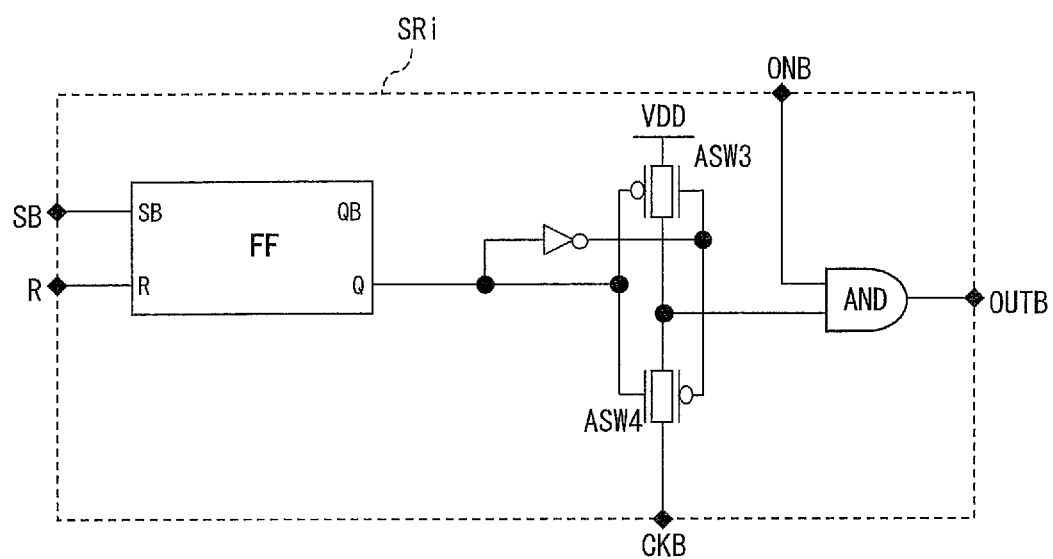
FIG. 7 is a circuit diagram illustrating each stage of the shift register of the liquid crystal display device shown in FIG. 6.

FIG. 7 is a circuit diagram illustrating a configuration of the i-th stage SRi of the shift register SR. As shown in FIG. 7, the i-th stage SRi includes (i) a set-reset type flip-flop FF having an SB-terminal and an R-terminal, (ii) two analog switches ASW3 and ASW4, (iii) an AND circuit, (iv) an inverter, and (v) a CKB terminal, an ONB terminal, and an OUTB terminal. A Q-terminal of the flip-flop FF is connected to a p-channel side gate of the analog switch ASW3, an n-channel side gate of the analog switch ASW4, and an input terminal of the inverter. An output terminal of the inverter is connected to an n-channel side gate of the analog switch ASW3 and a p-channel side gate of the analog switch ASW4. One conduction electrode of the analog switch ASW3 is connected to the VDD, and one conduction electrode of the analog switch ASW4 is connected to the CKB terminal. The other conduction electrode of the analog switch ASW3, the other conduction electrode of the analog switch ASW4, and one input terminal of the AND circuit are connected with each other. The other input terminal of the AND circuit is connected with the ONB terminal. An output terminal of the AND circuit is connected with the OUTB terminal, which serves as an output terminal of that stage.

In the shift register SR, each of the stages has (i) an OUTB terminal which is connected to an SB-terminal of a following stage and (ii) an R-terminal which is connected to an OUTB terminal of the following stage via an inverter. For example, an OUTB terminal of an n-th stage SRn is connected to an SB-terminal of an (n+1)th stage SRn+1, and an OUTB terminal of the (n+1)th stage SRn+1 is connected to an R-terminal of the n-th stage SRn via an inverter. Note that a first stage SR1 of the shift register SR has an SB-terminal to which a GSPB signal is supplied. In the gate driver GD, a CKB terminal of an odd-numbered stage is connected to a GCK line (via which the gate clock signal GCK is supplied) which is different from a GCK line to which a CKB terminal of an even-numbered stage is connected. For example, a CKB terminal of the n-th stage SRn is connected to a GCK2B signal line, and a CKB terminal of the (n+1)th stage SRn+1 is connected to a GCK1B signal line.

Figure 8:
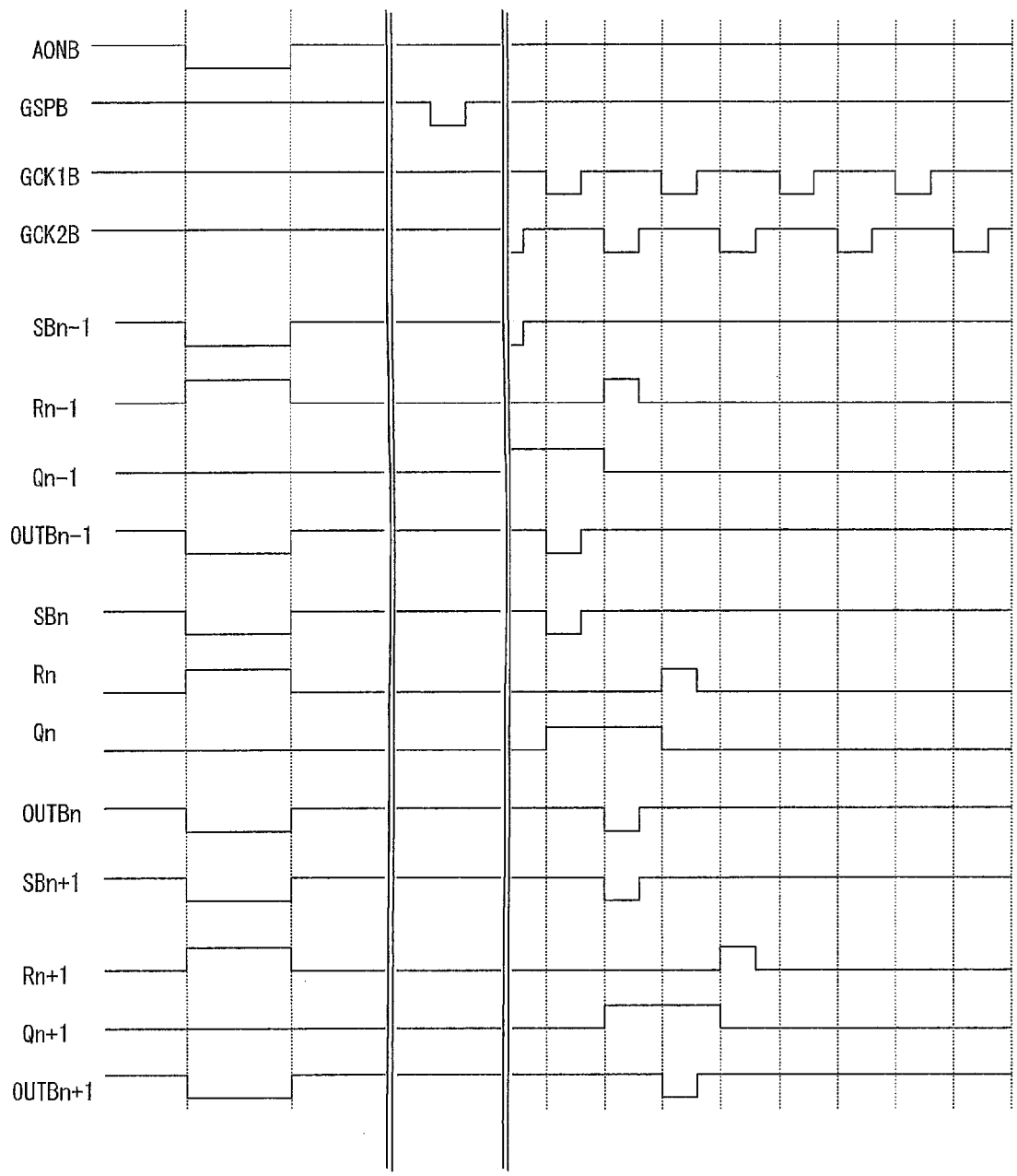
FIG. 8 is a timing chart illustrating how the liquid crystal display device shown in FIG. 6 is driven.

FIG. 8 is a timing chart illustrating how the liquid crystal display device 3c is driven. In the liquid crystal display device 3c, the following display preparation operation is carried out prior to the first frame (vertical scan period) of a displayed video. Specifically, the AONB-signal is caused to be active (Low) for a predetermined period of time, and, in each of the stages of the shift register SR, one of the inputs of the AND circuit becomes Low and accordingly the output of the AND circuit becomes Low. This causes the OUTB-signals of all the stages to become active (Low), and accordingly all the scanning signal lines are selected. At the time, the analog switches asw provided for the respective data signal lines are turned on, and accordingly the Vcom is applied to all the data signal lines. Moreover, the SB-signal supplied to each of the stages becomes active (Low) and the R-signal supplied to each of the stages also becomes active (High), and accordingly the Q-signal of the flip-flop FF becomes inactive (Low). This is because, in the flip-flop FF, the R-signal (reset) has priority and therefore the Q-signal becomes inactive, in the case where the SB-signal and the R-signal simultaneously become active. After the end of the display preparation operation (i.e., after the AONB-signal becomes inactive), the Vcom is written into all the pixels PIX of the display section DAR, and the Q-signal outputted from the flip-flop FF in each of the stages of the shift register becomes inactive (Low).

Moreover, in the shift register SR of the liquid crystal display device 3c, the following operation is carried out in each vertical scan period (at which a frame is displayed). Specifically, each stage of the shift register SR is configured as follows. When an SB-signal supplied to a stage in the shift register SR becomes active (=Low), a flip-flop FF of the stage is set and accordingly a Q-signal becomes High (active). This causes a GCKB signal to be received by the stage via an analog switch ASW4. When the GCKB signal in the stage becomes active (=Low), an OUTB-signal of the stage becomes active (Low) and an SB-signal of a following stage of the stage becomes active. This causes an OUTB-signal of a flip-flop FF of the following stage of the stage to become active, and accordingly a GCKB signal is received by the following stage of the stage. When the GCKB signal in the following stage of the stage becomes active (=Low), the flip-flop FF of the stage is reset and accordingly the Q-signal becomes Low (inactive). This causes an analog switch ASW3 to be turned on. At the time, the AON-signal is High, and accordingly both inputs to an AND circuit of the stage become High and an output of the AND circuit becomes High. This causes the OUTB-signal of the stage to become High (inactive).

The liquid crystal display device 3c brings about the following effect, in addition to an effect similar to that of the liquid crystal display device 3a. Specifically, when the AOB-signal returns to inactive (i.e., when the shift register returns from the simultaneous selection of all the scanning signal lines), the SB-signal and the R-signal which are supplied to the flip-flop FF both return to inactive. At the time, the R-signal returns to inactive after the SB-signal returns to inactive because the inverter is provided between the OUTB terminal and the R-terminal. This makes it possible to prevent the flip-flop FFa from being undesirably set to active (because the SB-signal returns to inactive after the R-signal returns to inactive) when the AOB-signal returns to inactive.

Figure 9:
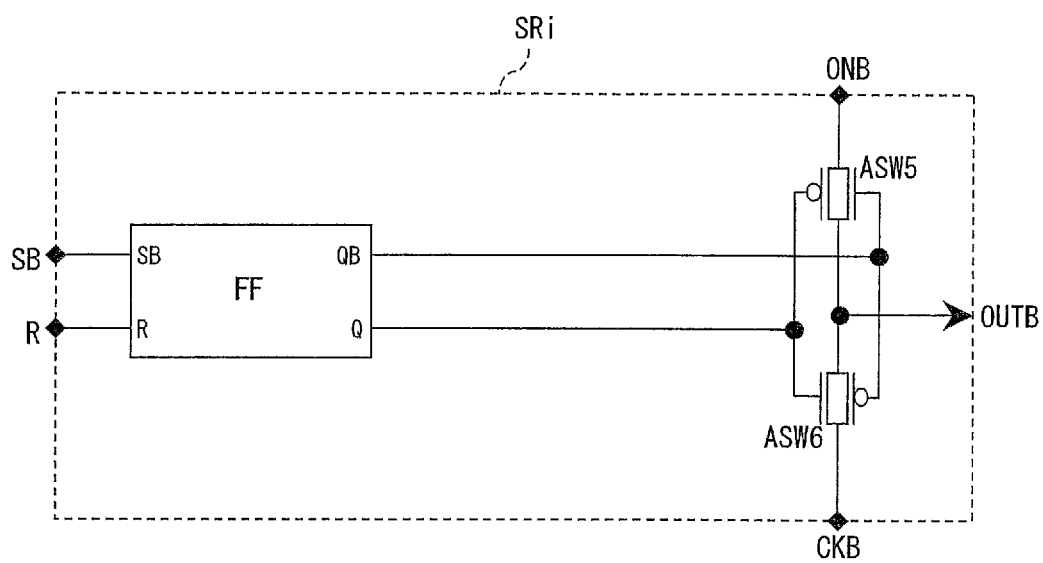
FIG. 9 is a circuit diagram illustrating each stage of the shift register of the liquid crystal display device shown in FIG. 6.

The i-th stage SRi of the shift register SR of the liquid crystal display device 3c can also be configured as shown in FIG. 9. In the configuration shown in FIG. 9, the i-th stage SRi of the shift register includes (i) a flip-flop FF having an SB-terminal and an R-terminal, (ii) analog switches ASW5 and ASW6, and (iii) an ONB terminal, a CKB terminal and an OUTB terminal. A QB-terminal of the flip-flop FF is connected to an n-channel side gate of the analog switch ASW5 and a p-channel side gate of the analog switch ASW6. A Q-terminal of the flip-flop FF is connected to a p-channel side gate of the analog switch ASW5 and an n-channel side gate of the analog switch ASW6. The OUTB terminal, which serves as an output terminal of that stage, is connected to one conduction electrode of the analog switch ASW5 and one conduction electrode of the analog switch ASW6. The other conduction electrode of the analog switch ASW5 is connected to the ONB terminal. The other conduction electrode of the analog switch ASW6 is connected to the CKB terminal to which the clock signal is supplied.

In a case where the i-th stage SRi of the shift register is configured as shown in FIG. 9, while the AONB-signal is being active (Low) for a predetermined period of time, an AON-signal is outputted from the OUTB terminal of each of the stages of the shift register SR via the analog switch ASW5, and the OUTB-signal becomes Low (active). This causes all the scanning signal lines to be selected. At the time, the analog switches asw provided for the respective data signal lines are turned on, and accordingly the Vcom is applied to all the data signal lines. Moreover, the SB-signal supplied to each of the stages becomes active (Low) and the R-signal supplied to the stage also becomes active (High), and accordingly the Q-signal of the flip-flop FF becomes inactive (Low) (therefore, the analog switch ASW5 remains being turned on). After the end of the display preparation operation (i.e., after the AONB-signal becomes inactive), the Vcom is written into all the pixels PIX in the display section DAR, and the Q-signals, which are outputted from the respective flip-flops FF provided in the respective stages of the shift register, become inactive (Low).

Moreover, in the i-th stage SRi shown in FIG. 9, when an SB-signal supplied to each of the stages becomes active (=Low) in each vertical scan period, a flip-flop FF of the stage is set and accordingly a Q-signal becomes High (active). This causes a GCKB signal to be received by the stage via an analog switch ASW6. When the GCKB signal in the stage becomes active (=Low), an OUTB-signal of the stage becomes active (Low) and an SB-signal of a following stage of the stage becomes active. This causes an OUTB-signal of a flip-flop FF of the following stage of the stage to become active, and accordingly a GCKB signal is received by the following stage of the stage. When the GCKB signal in the following stage of the stage becomes active (=Low), the flip-flop FF of the stage is reset and accordingly the Q-signal becomes Low (inactive). This causes an analog switch ASW5 of the stage to be turned on. At the time, the AON-signal is High, and accordingly the OUTB-signal of the stage becomes High (inactive).

Each of the stages of the shift register, which is configured as shown in FIG. 9, makes it possible to reduce a size of the shift register while bringing about an effect similar to that of the shift register shown in FIG. 2.

Embodiment 2

Figure 10:
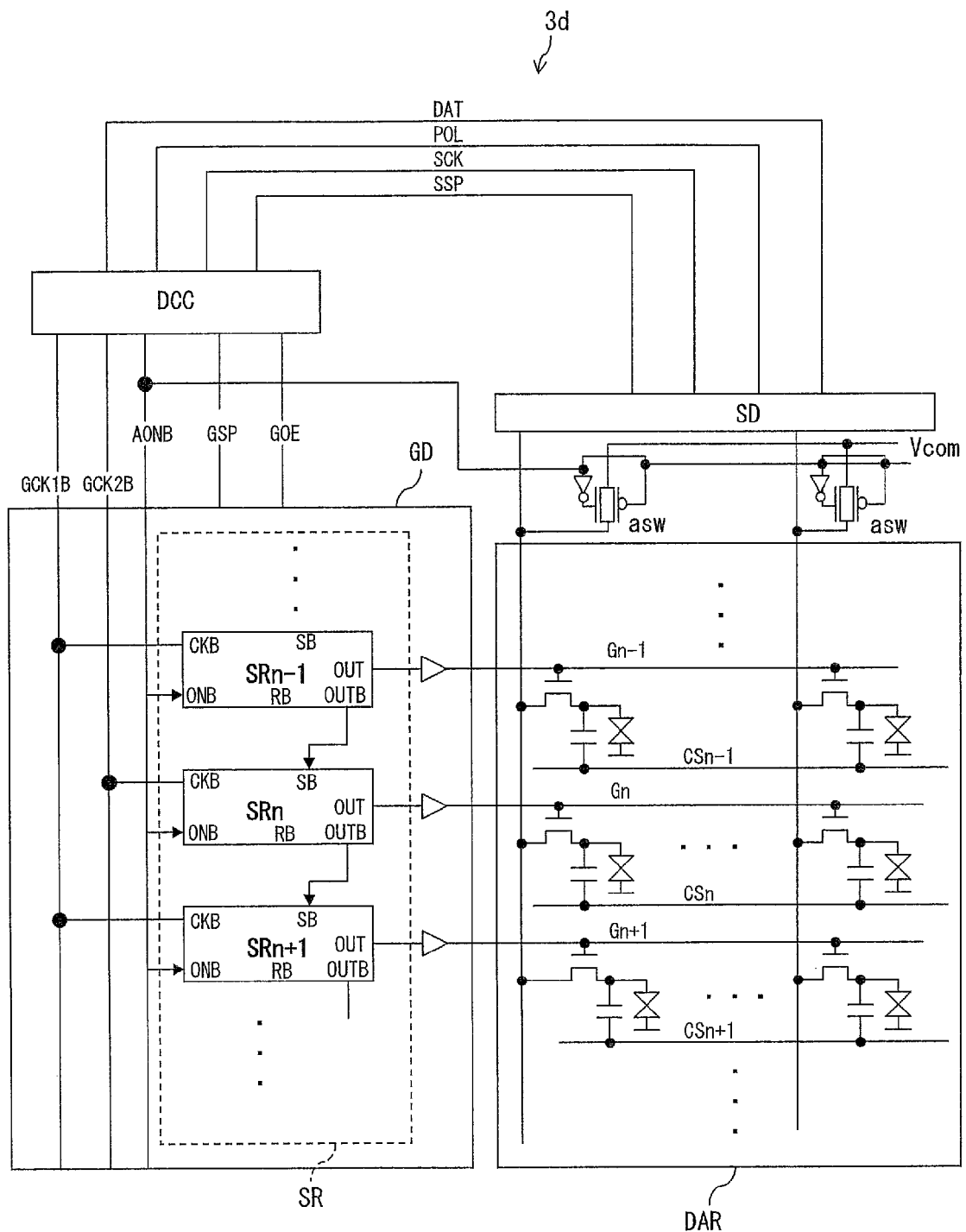
FIG. 10 is a schematic view illustrating a configuration of a liquid crystal display device of Embodiment 2 of the present invention.

FIG. 10 is a circuit diagram illustrating a configuration of a liquid crystal display device 3d of the present invention. The liquid crystal display device 3d includes a display section DAR, a gate driver GD, a source driver SD, and a display control circuit DCC. The display control circuit DCC supplies, to the gate driver GD, an AONB-signal (all-ON signal), a gate start pulse GSP, a gate on enable signal GOE, and gate clock signals GCK1B and GCK2B. Moreover, the display control circuit DCC supplies, to the source driver SD, a source start pulse SSP, digital data DAT, a polarity signal POL, and a source clock signal SCK. The gate driver GD includes a shift register SR having a plurality of stages. Hereinafter, an i-th stage (i=1, ... n−1, n, n+1, ... ) of the shift register is shortly referred to as "i-th stage SRi", as appropriate.

An output signal (OUT-signal) of the i-th stage SRi of the shift register is supplied to a scanning signal line Gi of the display section DAR via a buffer. For example, an OUTB-signal of an n-th stage SRn is supplied to a scanning signal line Gn via a buffer. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

Figure 11:
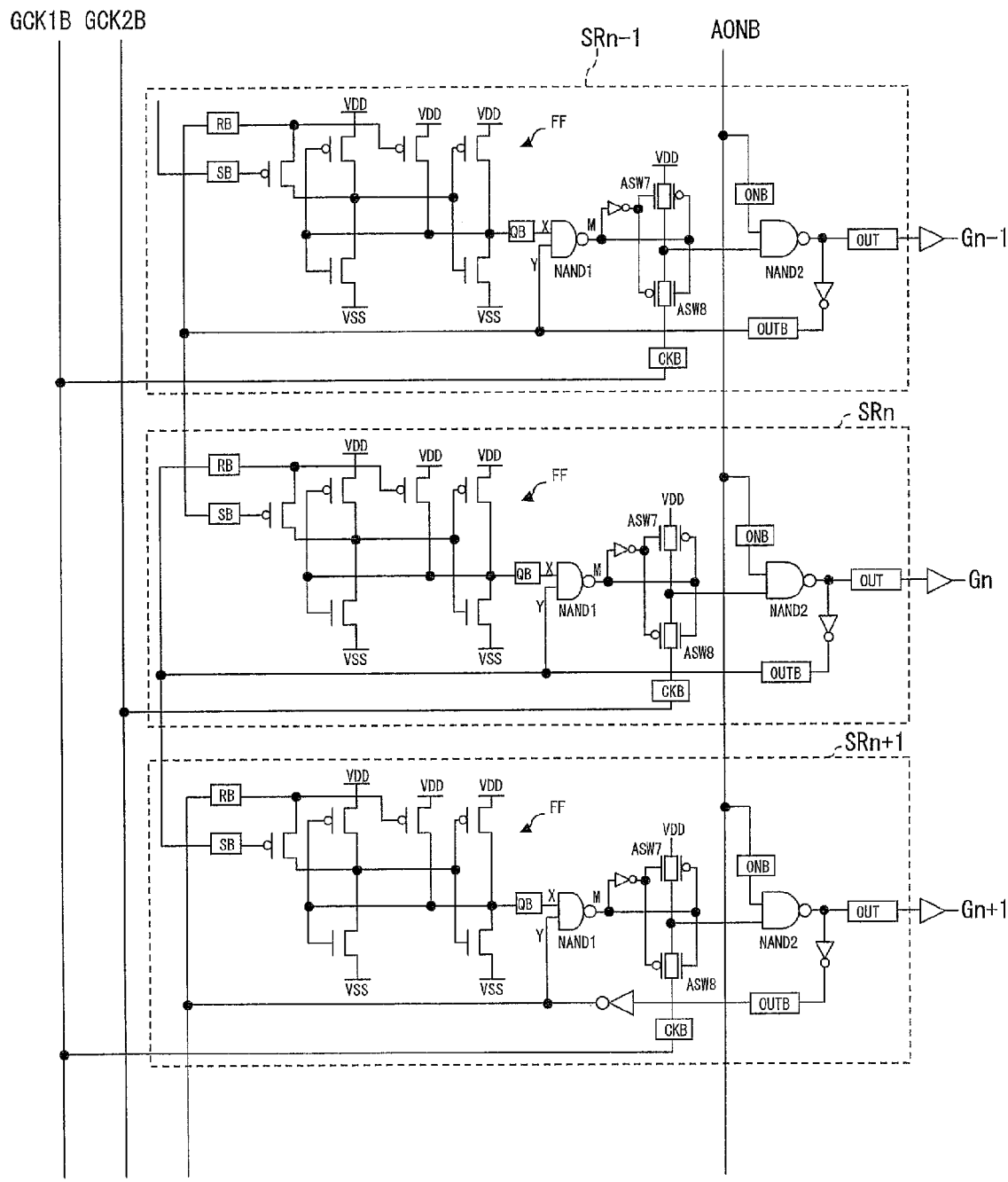
FIG. 11 is a circuit diagram partially illustrating a shift register of the liquid crystal display device shown in FIG. 10.

FIG. 11 is a circuit diagram partially illustrating a concrete configuration of the shift register SR. As shown in FIG. 11, each stage of the shift register includes (i) a flip-flop FF having an SB-terminal and an RB-terminal, (ii) two analog switches ASW7 and ASW8 (gate circuit), (iii) an NAND circuit 1 (logical circuit) and an NAND circuit 2 (outputting circuit), (iv) a first inverter and a second inverter, (v) a CKB terminal, (vi) an ONB terminal, and (vii) an OUT terminal. A QB-terminal of the flip-flop FF is connected to one input terminal of the NAND circuit 1, and an output terminal of the NAND circuit 1 is connected to an input terminal of the first inverter, a p-channel side gate of the analog switch ASW7, and an n-channel side gate of the analog switch ASW8. An output terminal of the first inverter is connected to an n-channel side gate of the analog switch ASW7 and a p-channel side gate of the analog switch ASW8. One conduction electrode of the analog switch ASW7 is connected to the VDD, and one conduction electrode of the analog switch ASW8 is connected to the CKB terminal. The other conduction electrode of the analog switch ASW7, the other conduction electrode of the analog switch ASW8, and one input terminal of the NAND circuit 2 are connected with each other. The other input terminal of the NAND circuit 2 is connected with the ONB terminal. An output terminal of the NAND circuit 2, an input terminal of the second inverter, and the OUTB terminal, which serves as an output terminal of that stage, are connected with each other. An output terminal of the second inverter, the RB terminal of the flip-flop FF, and the other input terminal of the NAND circuit 1 are connected with each other. Here, the analog switches ASW7 and ASW8 (gate circuit), the NAND circuit 1 (logical circuit), and the NAND circuit 2 (outputting circuit) constitute a signal generating circuit which generates an OUT-signal.

In the shift register SR, each of the stages has an OUTB terminal which is connected to an SB-terminal of a following stage. For example, an OUTB terminal of an n-th stage SRn is connected to an SB-terminal of an (n+1)th stage SRn+1. Note that a first stage SR1 of the shift register SR has an SB-terminal to which a GSPB signal is supplied. In the gate driver GD, a CKB terminal of an odd-numbered stage is connected to a GCK line (via which the gate clock signal GCK is supplied) which is different from a GCK line to which a CKB terminal of an even-numbered stage is connected. For example, a CKB terminal of the n-th stage SRn is connected to a GCK2B signal line, and a CKB terminal of the (n+1)th stage SRn+1 is connected to a GCK1B signal line.

Figure 12:
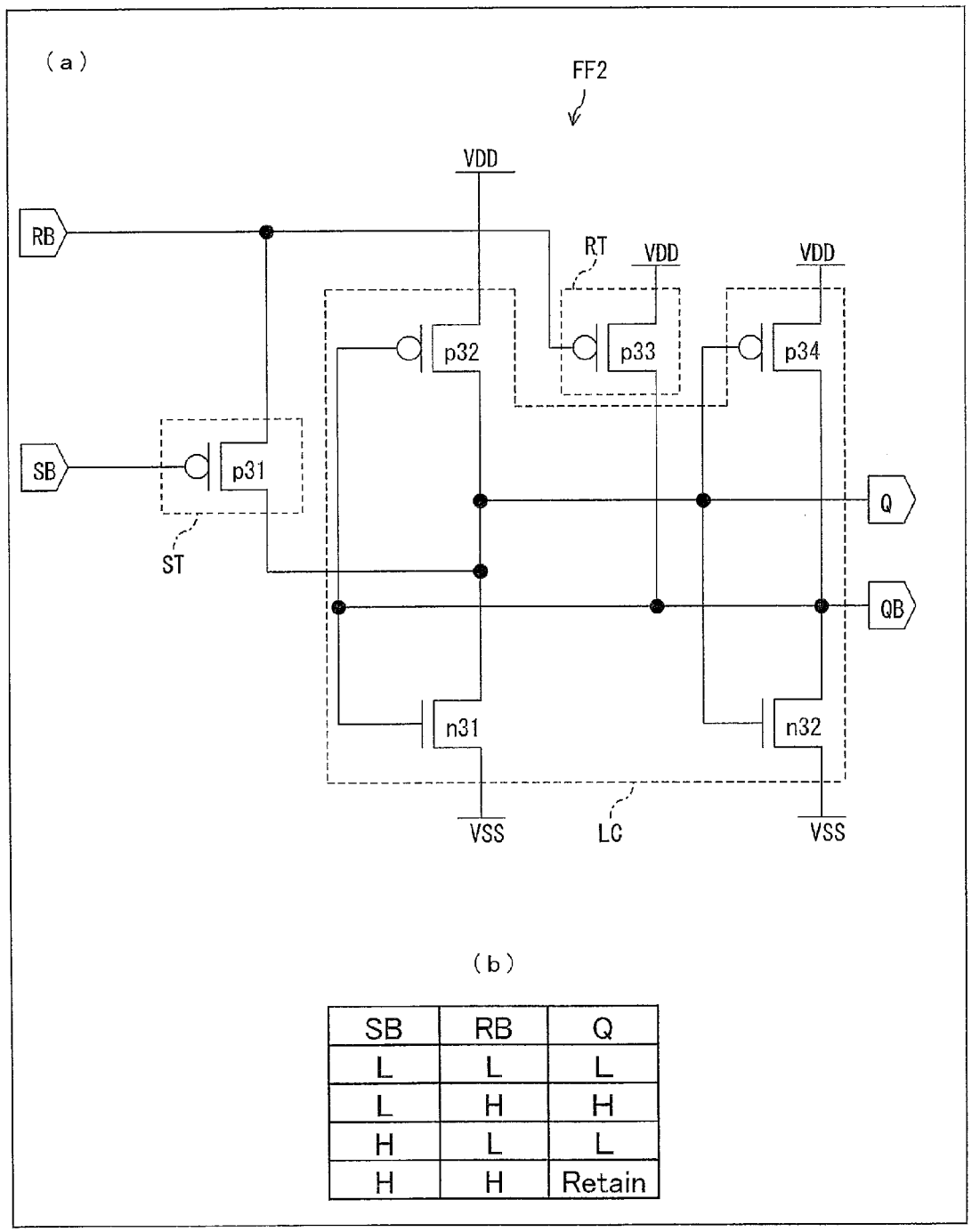
FIG. 12 (a) is a circuit diagram of a flip-flop of the shift register shown in FIG. 11 and (b) is a truth table of the flip-flop.

As the flip-flop FF shown in FIG. 11, a flip-flop FF2 shown in FIG. 12 is used. As shown in FIG. 12, the flip-flop FF2 includes (i) a p-channel transistor p32 and an n-channel transistor n31 which constitute a CMOS circuit, (ii) a p-channel transistor p34 and an n-channel transistor n32 which constitute a CMOS circuit, (iii) p-channel transistors p31 and p33, (iv) an SB-terminal, an RB-terminal, a Q-terminal, and a QB-terminal. A gate of the transistor p32, a gate of the transistor n31, a drain of the transistor p34, a drain of the transistor n32, a drain of the transistor p33, and the QB-terminal are connected with each other. A drain of the transistor p32, a drain of the transistor n31, a gate of the transistor p34, a gate of the transistor n32, a drain of the transistor p31, and the Q-terminal are connected with each other. The SB-terminal is connected to a gate of the transistor p31. The RB-terminal is connected to a source of the transistor p31 and a gate of the transistor p33. Sources of the transistors p32, p33, and p34 are connected to the VDD, and sources of the transistors n31 and n32 are connected to the VSS. Here, the transistors p32, n31, p34, and n32 constitute a latch circuit LC, the transistor p31 serves as a set transistor ST, the transistor p33 serves as a reset transistor RT.

(b) of FIG. 12 is a truth table of the flip-flop FF2. In the flip-flop FF2, a Q-signal is to have a state as follows (see (b) of FIG. 12): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

Figure 13:
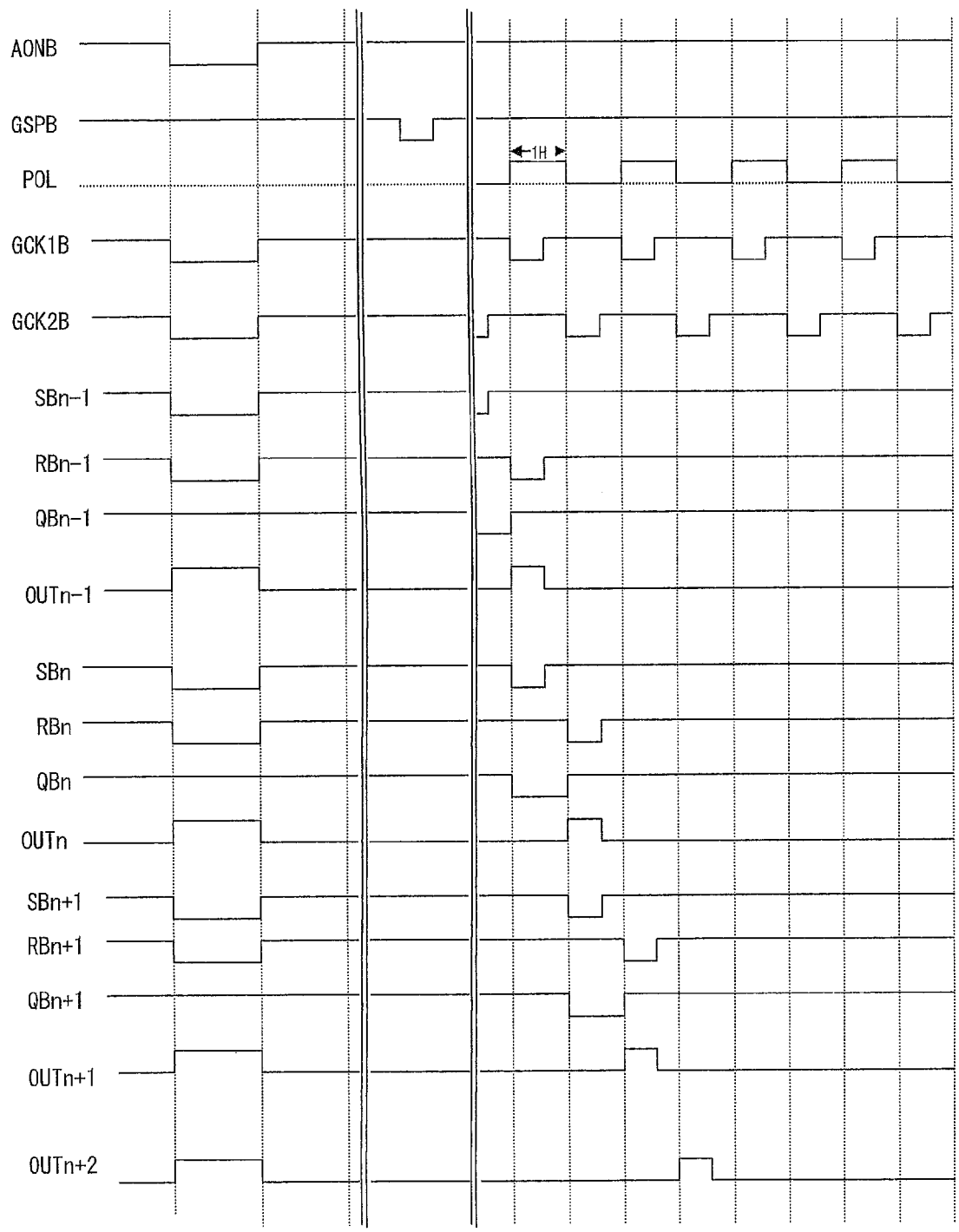
FIG. 13 is a timing chart illustrating how the liquid crystal display device shown in FIG. 10 is driven.

FIG. 13 is a timing chart illustrating how the liquid crystal display device 3d is driven. Note that, in FIG. 13, "AONB" indicates an AONB-signal (all-ON signal), "GSPB" indicates a gate start pulse bar signal, "GCK1B" indicates a GCK1B signal, "GCK2B" indicates a GCK2B signal. Moreover, "SBi", "RBi", "QBi", and "OUTBi" (i=n−1, n, n+1) indicate an SB-signal (i.e., an electric potential at the SB-terminal), an RB-signal (i.e., an electric potential at the RB-terminal), a QB-signal (i.e., an electric potential at the QB-terminal), and an OUTB-signal (i.e., an electric potential at the OUTB terminal) in the i-th stage SRi, respectively.

In the liquid crystal display device 3d, the following display preparation operation is carried out prior to the first frame (vertical scan period) of a displayed video. Specifically, the AONB-signal is caused to be active (Low) for a predetermined period of time. During the predetermined period in which the AONB-signal is being active, the GCKB signals are fixedly active (Low). In each of the stages of the shift register SR, when the AONB-signal becomes active (Low), the AONB-signal is supplied to the NAND circuit 2 via the analog switch ASW7, and accordingly the OUT-signal becomes active (High). This causes all the scanning signal lines to be selected. At the time, the analog switches asw provided for the respective data signal lines are turned on, and accordingly the Vcom is applied to all the data signal lines. Moreover, the SB-signal and the RB-signal supplied to each of the stages become active (Low), and thereby the QB-signal of the flip-flop FF becomes inactive (High). Note that, once the OUT-signal of each of the stages of the shift register becomes active, a feedback signal to the NAND circuit 1 becomes Low, and therefore the analog switch ASW7 is turned off and the analog switch ASW8 is turned on (i.e., the GCK1B or the GCK2B is received by the each stage).

After the end of the display preparation operation (i.e., after the AONB-signal becomes inactive), the Vcom is written into all the pixels PIX of the display section DAR, and the QB-signal outputted from the flip-flop FF provided in the each stage of the shift register becomes inactive (High).

Moreover, in the liquid crystal display device 3d, the following operation is carried out in each vertical scan period (at which a frame is displayed). Specifically, each stage of the shift register SR is configured as follows. When an SB-signal supplied to a stage of the shift register SR becomes active (Low), an output of a flip-flop FF of the stage is set to be active. This causes a GCKB signal to be received by the stage. When the GCKB signal in the stage becomes active (Low), (i) an OUT-signal of the stage becomes active (High) and an SB-signal in a following stage of the stage becomes active, and (ii) the flip-flop FF of the stage is reset and accordingly the QB-signal becomes High (inactive). At the time, the OUT-signal of the stage is High (i.e., an input to the NAND circuit 1 is Low and the analog switch ASW8 is on), and therefore the GCKB signal is continuously being received by the stage. When the GCKB signal becomes High (inactive), the OUT-signal of the stage becomes Low and the input to the NAND circuit 1 becomes High (i.e., ASW7 is turned on). Subsequently, the Vdd (High) and the AONB-signal (High) are applied to the NAND circuit 2, and the OUT-signal becomes Low (inactive).

In the liquid crystal display device 3d, for example, it is possible to apply an identical electric potential (e.g., Vcom) to all the pixels by simultaneously selecting all the scanning signal lines before a display is started. This makes it possible to prevent a disordered screen caused before the display is started or after the display is ended. Moreover, the shift register is initialized (the flip-flops of the respective stages are initialized) when the simultaneous selection of all the scanning signal lines is carried out. This makes it possible to carry out the preparation operation before starting the display more quickly, as compared to the conventional liquid crystal display device which separately carries out the simultaneous selection of all the scanning signal lines and the initialization of the shift register. Furthermore, each of the stages is reset automatically, and it is therefore possible to simplify a relation of connection between the stages. Further, it is not necessary to prepare configurations for generating and transmitting a signal for initializing the shift register, and it is therefore possible to reduce a size of the gate driver.

Figure 14:
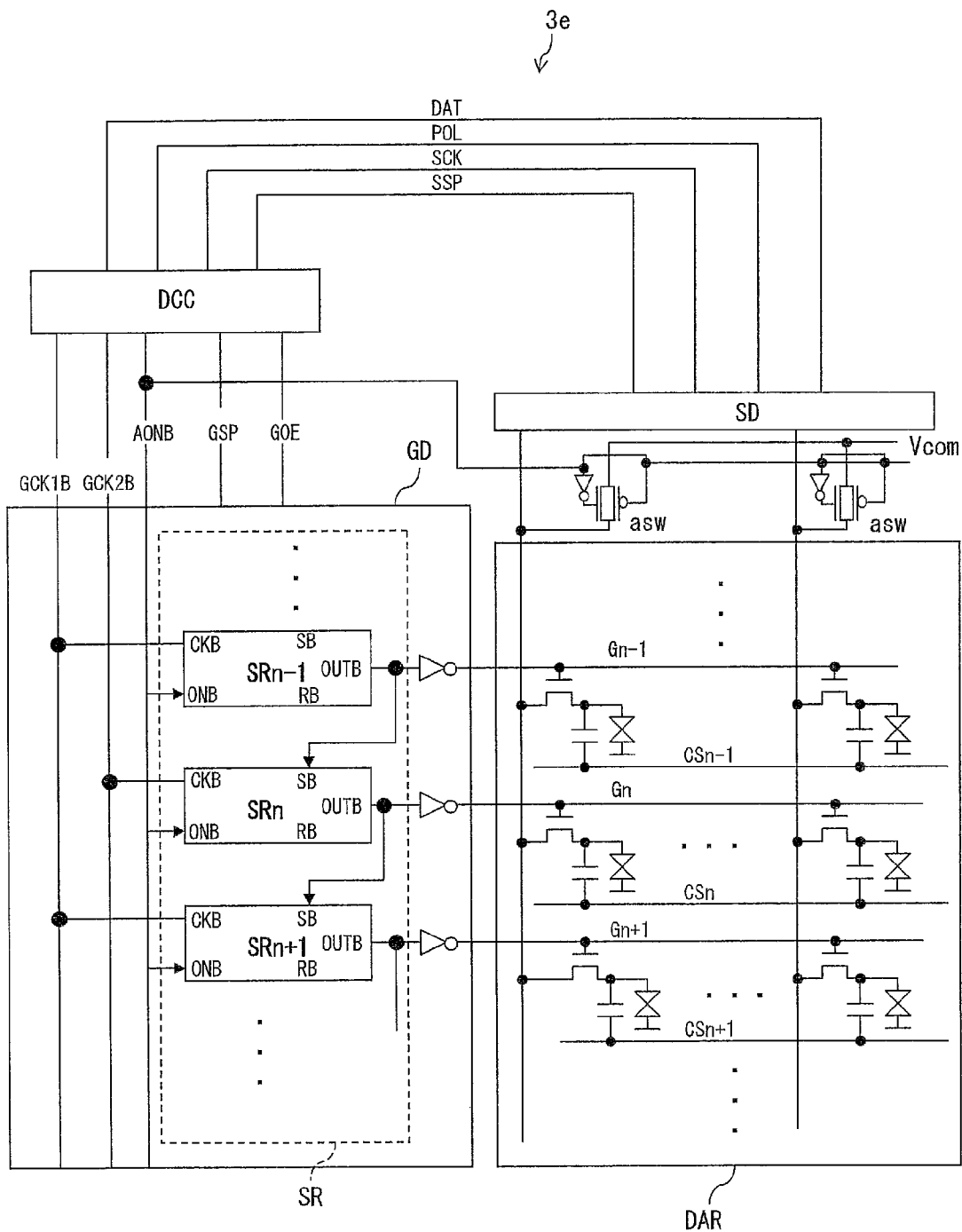
FIG. 14 is a schematic view illustrating another configuration of the liquid crystal display device of Embodiment 2 of the present invention.

The gate driver GD of the liquid crystal display device 3d can also be configured as shown in FIG. 14. In a liquid crystal display device 3e shown in FIG. 14, an output signal (OUTB-signal) of the i-th stage SRi of the shift register is supplied to the scanning signal line Gi of the display section DAR via an inverter. For example, an OUTB-signal of an n-th stage SRn is supplied to a scanning signal line Gn via an inverter. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Figure 15:
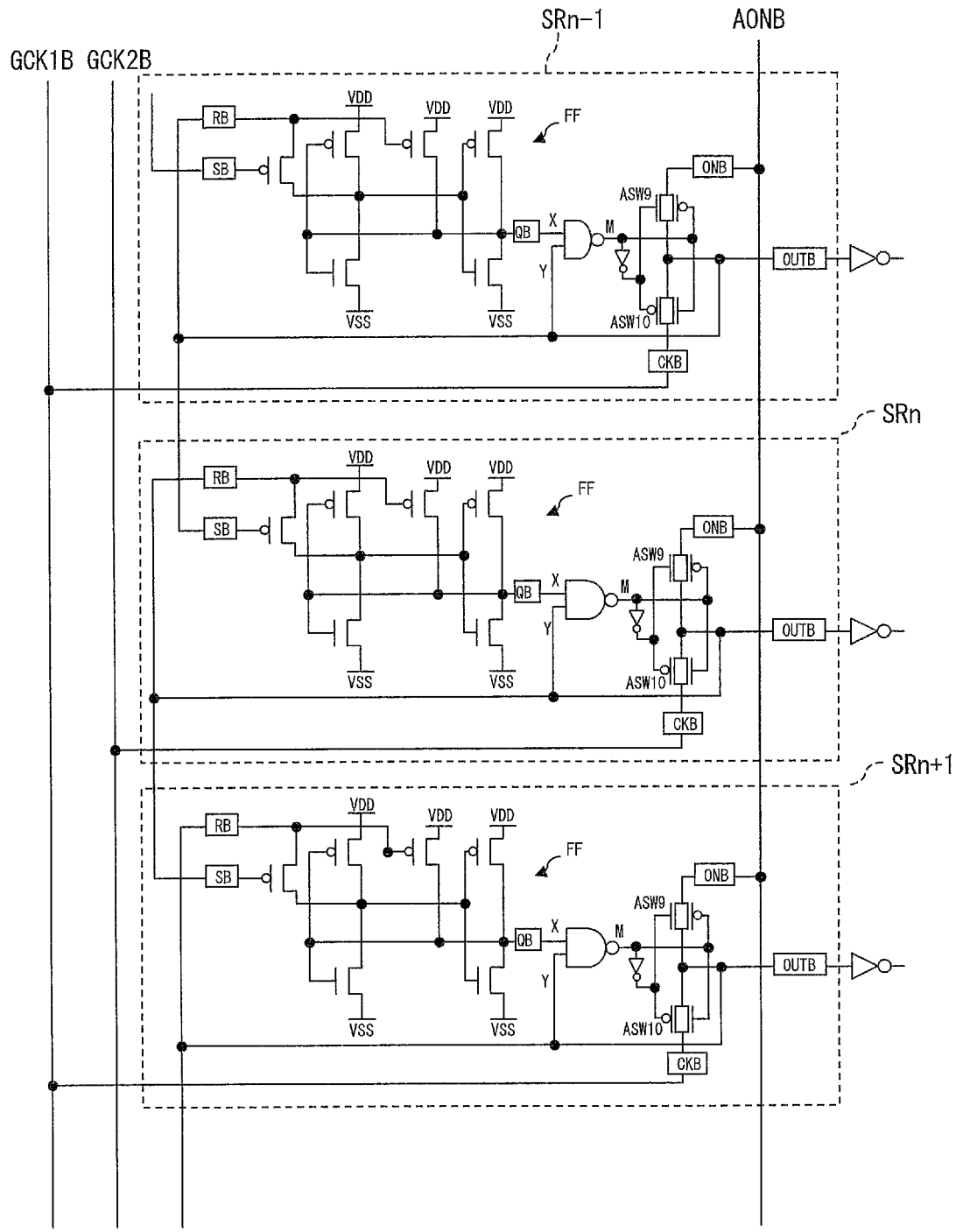
FIG. 15 is a circuit diagram partially illustrating a shift register of the liquid crystal display device shown in FIG. 14.

FIG. 15 is a circuit diagram partially illustrating a concrete configuration of the shift register SR. As shown in FIG. 15, each of the stages of the shift register includes (i) a flip-flop FF having an SB-terminal and an RB-terminal, (ii) two analog switches ASW9 and ASW10 (gate circuit), (iii) an NAND circuit (logical circuit), (iv) an inverter, (v) a CKB terminal, (vi) an ONB terminal, and (vii) an OUTB terminal. A QB-terminal of the flip-flop FF is connected to one input terminal of the NAND circuit, and an output terminal of the NAND circuit is connected to an input terminal of the inverter, a p-channel side gate of the analog switch ASW9, and an n-channel side gate of the analog switch ASW10. An output terminal of the inverter is connected to an n-channel side gate of the analog switch ASW9 and a p-channel side gate of the analog switch ASW10. One conduction electrode of the analog switch ASW9 is connected to the ONB terminal, and one conduction electrode of the analog switch ASW10 is connected to the CKB terminal. The other conduction electrode of the analog switch ASW9, the other conduction electrode of the analog switch ASW10, the OUTB terminal, which serves as an output terminal of that stage, the other input terminal of the NAND circuit, and the RB terminal of the flip-flop FF are connected with each other. Here, the analog switches ASW9 and ASW10 (gate circuit) and the NAND circuit (logical circuit) constitute a signal generating circuit which generates an OUTB-signal.

In the shift register SR, each of the stages has an OUTB terminal which is connected to an SB-terminal of a following stage. In the gate driver GD, a CKB terminal of an odd-numbered stage is connected to a GCK line (via which the gate clock signal GCK is supplied) which is different from a GCK line to which a CKB terminal of an even-numbered stage is connected.

Figure 16:
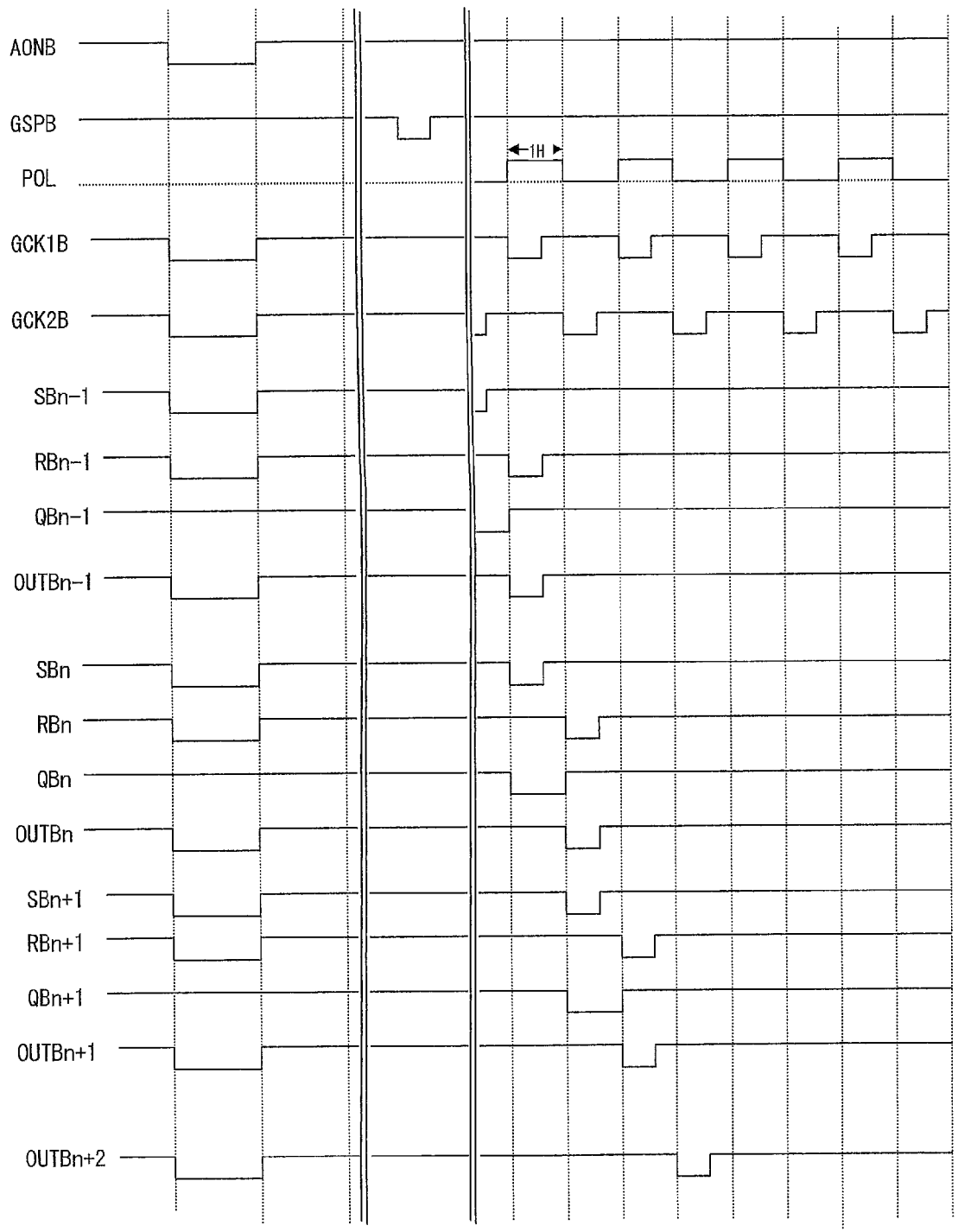
FIG. 16 is a timing chart illustrating how the liquid crystal display device shown in FIG. 14 is driven.
Figure 17:
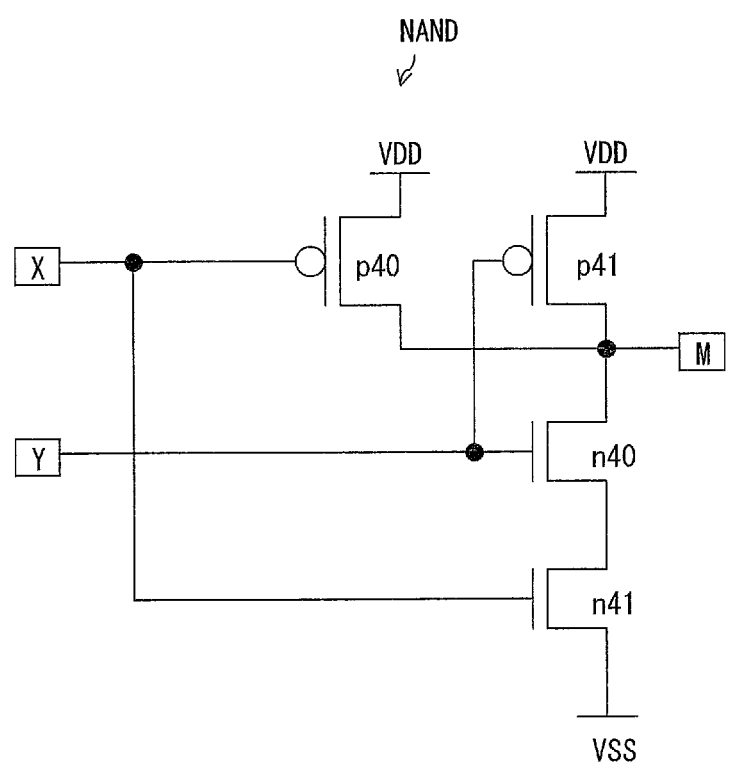
FIG. 17 is a circuit diagram illustrating a concrete configuration of an NAND circuit shown in FIG. 15.

FIG. 16 is a timing chart illustrating how the liquid crystal display device 3e is driven. In the liquid crystal display device 3e, the following display preparation operation is carried out prior to the first frame (vertical scan period) of a displayed video. Specifically, the AONB-signal is caused to be active (Low) for a predetermined period of time. During the predetermined period in which the AONB-signal is being active, the GCKB signals are fixedly active (Low). When the AONB-signal becomes active (Low), the OUTB-signal becomes active (Low) because the analog switch ASW9 is on, and accordingly all the scanning signal lines are selected. At the time, the analog switches asw provided for the respective data signal lines are turned on, and accordingly the Vcom is applied to all the data signal lines. Moreover, the SB-signal and the RB-signal supplied to each of the stages become active (Low), and thereby the QB-signal of the flip-flop FF becomes inactive (High). Note that, once the OUTB-signal of each of the stages of the shift register becomes active, a feedback signal to the NAND circuit becomes Low, and therefore the analog switch ASW9 is turned off and the analog switch ASW10 is turned on (i.e., the GCK1B or the GCK2B is received by each of the stages).

After the end of the display preparation operation (i.e., after the AONB-signal becomes inactive), the Vcom is written into all the pixels PIX of the display section DAR, and the QB-signal outputted from the flip-flop FF provided in the each of the stages of the shift register becomes inactive (High).

Moreover, in the liquid crystal display device 3e, the following operation is carried out in each vertical scan period (at which a frame is displayed). Specifically, each stage of the shift register SR is configured as follows. When an SB-signal supplied to a stage of the shift register SR becomes active (=Low), an output of a flip-flop FF of the stage is set to be active. This causes a GCKB signal to be received by the stage. When the GCKB signal in the stage becomes active (=Low), (i) an OUTB-signal of the stage becomes active (=Low) and an SB-signal in a following stage of the stage becomes active, and (ii) the flip-flop FF of the stage is reset and accordingly the QB-signal becomes High (inactive). At the time, the OUTB-signal of the stage is Low (i.e., an output of the NAND circuit is High), and therefore the GCKB signal is continuously being received by the stage. When the GCKB signal becomes High (inactive), the OUTB-signal of the stage becomes High and the output of the NAND circuit becomes Low. Subsequently, the AONB-signal is outputted from the OUTB terminal, and the OUTB-signal becomes High (inactive).

In the liquid crystal display device 3e, for example, it is possible to apply an identical electric potential (e.g., Vcom) to all the pixels by simultaneously selecting all the scanning signal lines before a display is started. This makes it possible to prevent a disordered screen caused before the display is started or after the display is ended. Moreover, the shift register is initialized (the flip-flops of the respective stages are initialized) when the simultaneous selection of all the scanning signal lines is carried out. This makes it possible to carry out the preparation operation before starting the display more quickly, as compared to the conventional liquid crystal display device which separately carries out the simultaneous selection of all the scanning signal lines and the initialization of the shift register. Furthermore, each of the stages is reset automatically, and it is therefore possible to simplify a relation of connection between the stages. The AONB-signal is supplied to the analog switch ASW9, and it is therefore possible to omit the NAND circuit 2 (outputting circuit), unlike the liquid crystal display device 3d (see FIG. 11). This makes it possible to reduce a size of the shift register. Further, it is not necessary to prepare configurations for generating and transmitting a signal for initializing the shift register, and it is therefore possible to reduce a size of the gate driver.

Note that, in the configuration shown in FIG. 11 or 15 (i.e., the configuration in which the flip-flop FF has reset priority so that each of the stages of the shift register is automatically reset), a feedback of the OUTB-signal to the RB-terminal of the flip-flop may precede a feedback to the NAND circuit. In view of this, it is preferable to employ an NAND circuit shown in FIG. 17, instead of the NAND circuit 1 (shown in FIG. 11) and the NAND circuit (shown in FIG. 15). Specifically, a source of a p-channel transistor p40 is connected to the VDD; a gate of the transistor p40 is caused to serve as an input terminal X of the NAND circuit; a drain of the transistor p40 is caused to serve as an output terminal M of the NAND circuit; a source of a p-channel transistor p41 is connected to the VDD; a gate of the transistor p41 is caused to serve as an input terminal Y of the NAND circuit; a drain of the transistor p41 is connected to a source of an n-channel transistor n40; a gate of the transistor n40 is connected to the input terminal Y; a drain of the transistor n40 is connected to a source of an n-channel transistor n41; a gate of the n-channel transistor n41 is connected to the input terminal X; and a drain of the transistor n41 is connected to the VSS. Each of the p-channel transistors p40 and p41 is set to have operation performance higher than that of each of the n-channel transistors n40 and n41. This causes the OUTB-signal to remain active (=Low) until the QB-signal becomes sufficiently inactive (High). It is therefore possible to prevent the feedback to the RB-terminal of the flip-flop FF from preceding the feedback to the NAND circuit.

Figure 33:
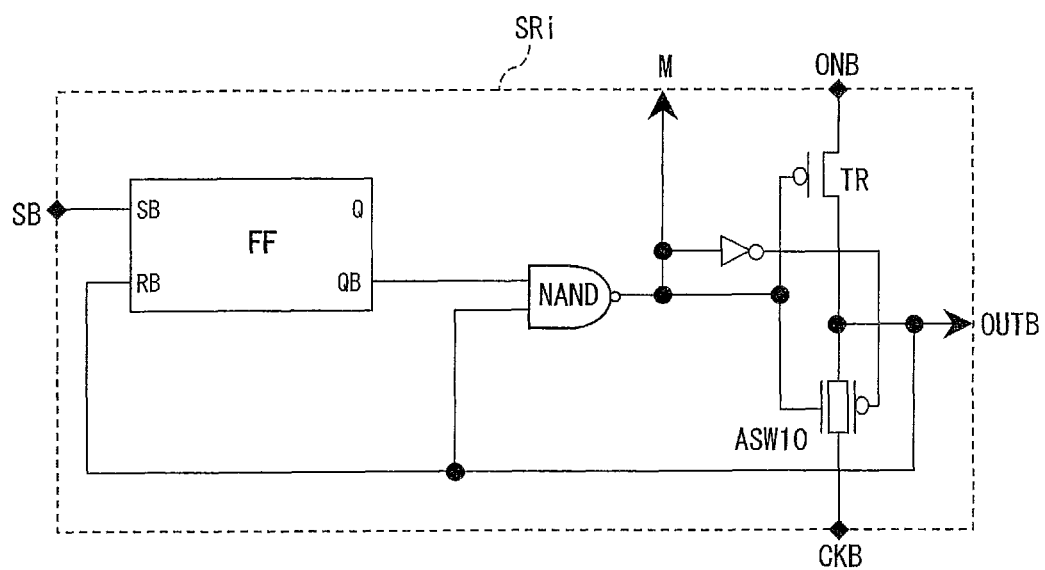
FIG. 33 is a circuit diagram illustrating each stage of the shift register of the liquid crystal display device shown in FIG. 15.
Figure 34:
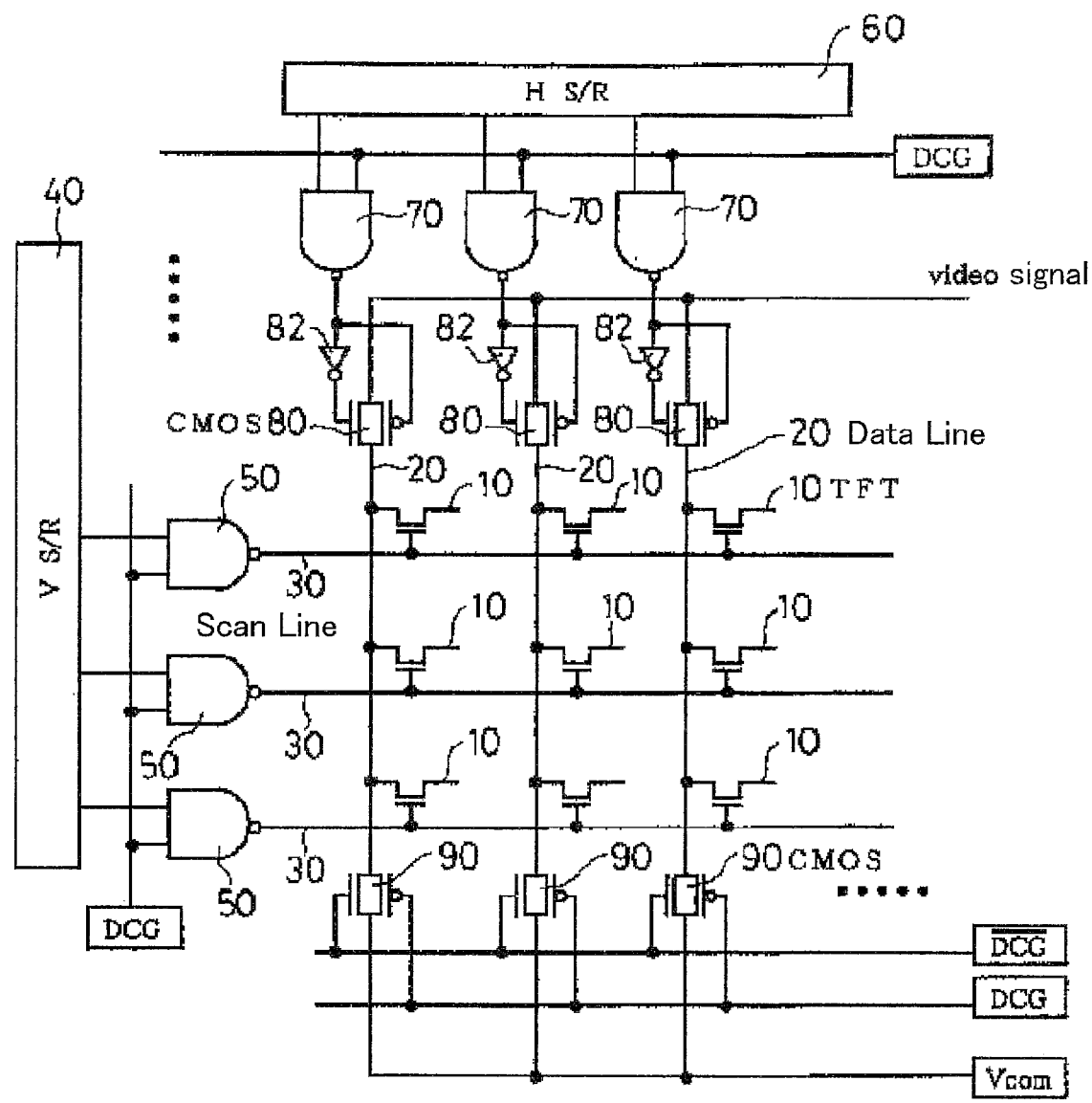
FIG. 34 is a circuit diagram illustrating a configuration of a conventional shift register.
Figure 35:
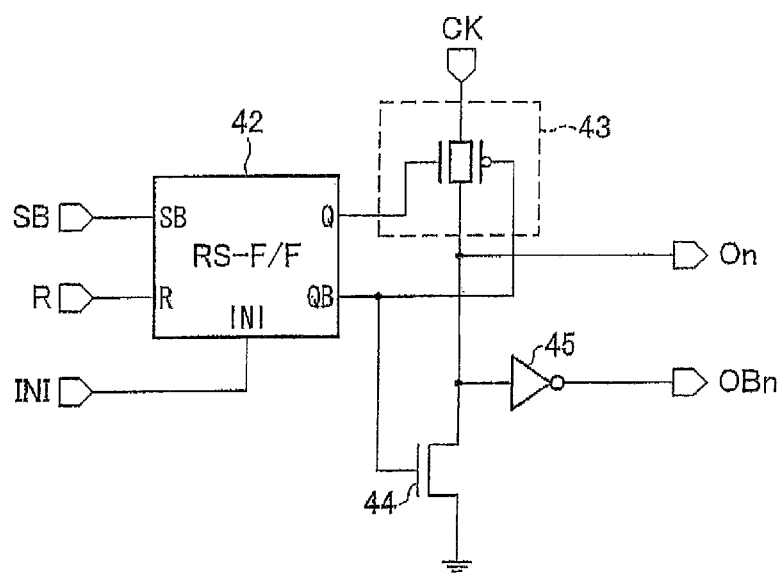
FIG. 35 is a circuit diagram illustrating a configuration of a conventional shift register.

Note that it is possible to change, as shown in FIG. 33, the configuration (see FIG. 15) of each stage of the shift register included in the liquid crystal display device 3e. Specifically, the analog switch ASW9 shown in FIG. 15 may be replaced with a single-channel (p-channel) transistor TR. This makes it possible to further reduce a size of the shift register.

Figure 18:
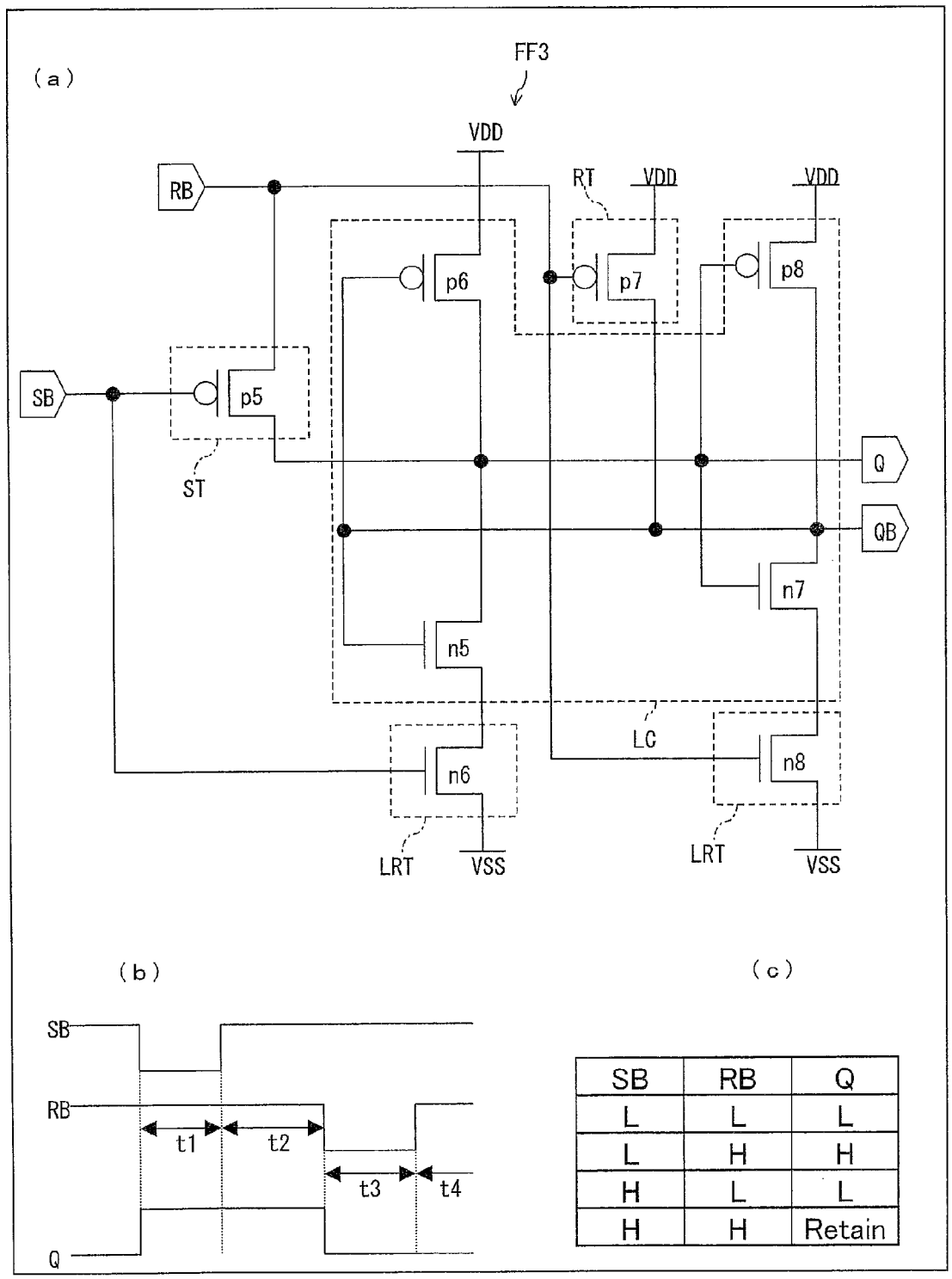
FIG. 18 (a) is another circuit diagram of a flip-flop of the shift register shown in FIG. 10 or 14 and (b) is a truth table of the flip-flop.

As the flip-flop FF shown in FIG. 11 or 15, a flip-flop FF3 shown in FIG. 18 may be used. As shown in FIG. 18, the flip-flop FF3 includes (i) a p-channel transistor p6 and an n-channel transistor n5 which constitute a CMOS circuit, (ii) a p-channel transistor p8 and an n-channel transistor n7 which constitute a CMOS circuit, (iii) p-channel transistors p5 and p7, (iv) n-channel transistors n6 and n8, and (v) an SB-terminal, an RB-terminal, a Q-terminal, and a QB-terminal. A gate of the transistor p6, a gate of the transistor n5, a drain of the transistor p7, a drain of the transistor p8, a drain of the transistor n7, and the QB-terminal are connected with each other. A drain of the transistor p6, a drain of the transistor n5, a drain of the transistor p5, a gate of the transistor p8, a gate of the transistor n7, and the Q-terminal are connected with each other. A source of the transistor n5 is connected to a drain of the transistor n6. A source of the transistor n7 is connected to a drain of the transistor n8. The SB-terminal is connected to a gate of the transistor p5 and a gate of the transistor n6. The RB-terminal is connected to a source of the transistor p5, a gate of the transistor p7, and a gate of the transistor n8. Sources of the transistors p6, p7, and p8 are connected to the VDD, and sources of the transistors n6 and n8 are connected to the VSS. Here, the transistors p6, n5, p8, and n7 constitute a latch circuit LC, the transistor p5 serves as a set transistor ST, the transistor p7 serves as a reset transistor RT, and each of the transistors n6 and n8 serves as a latch release transistor (release transistor) LRT.

(b) of FIG. 18 is a timing chart illustrating how the flip-flop FF3 is driven, and (c) of FIG. 18 is a truth table of the flip-flop FF3. A Q-signal of the flip-flop FF3 is to have a state as follows (see (b) and (c) of FIG. 18): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

For example, during a period t1 in (b) of FIG. 18, the Vdd flows from the RB-terminal to the Q-terminal, and thereby the transistor n7 is turned on. Accordingly, the Vss (Low) is applied to the QB-terminal. During a period t2, the SB-signal is being High, and therefore the transistor p5 is turned off and the transistor n6 is turned on. Accordingly, the state in the period t1 is maintained. During a period t3, the RB-signal is being Low, and therefore the transistor p7 is turned on and accordingly the Vdd (High) is applied to the QB-terminal. Further, the transistor n5 is turned on and accordingly the Vss is applied to the Q-terminal. Note that, in a case where the SB-signal and the RB-signal both become Low (active), the transistor p7 is turned on and accordingly (i) the Vdd (High) is applied to the QB-terminal and (ii) the Vss+Vth (a threshold voltage of the transistor p5) is applied to the Q-terminal via the transistor p5.

Figure 19:
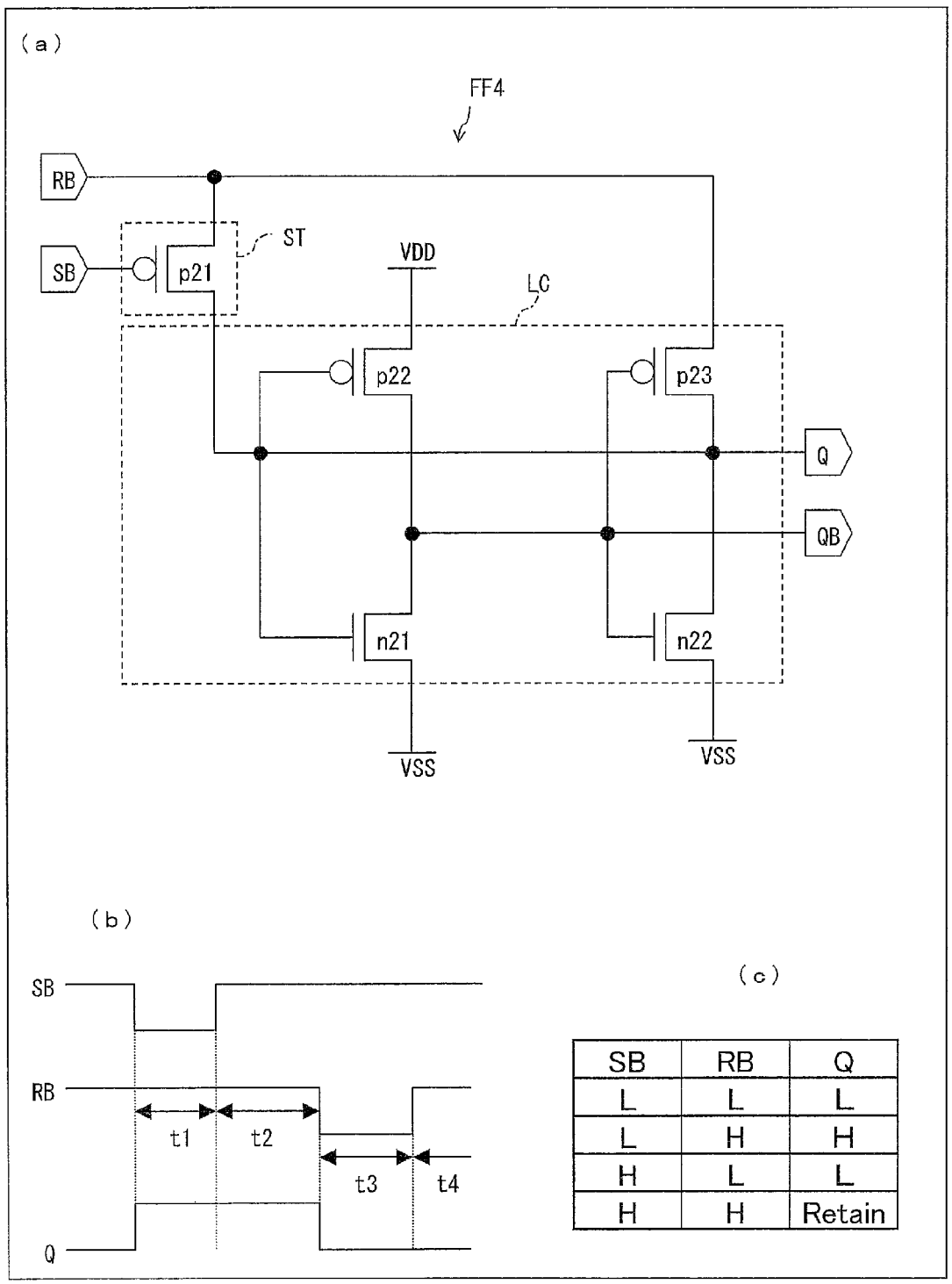
FIG. 19 (a) is another circuit diagram of a flip-flop of the shift register shown in FIG. 10 or 14 and (b) is a truth table of the flip-flop.

As the flip-flop FF shown in FIG. 11 or 15, a flip-flop FF4 shown in FIG. 19 may be used. As shown in FIG. 19, the flip-flop FF4 includes (i) a p-channel transistor p22 and an n-channel transistor n21 which constitute a CMOS circuit, (ii) a p-channel transistor p23 and an n-channel transistor n22 which constitute a CMOS circuit, (iii) a p-channel transistor p21, and (iv) an SB-terminal, an RB-terminal, a Q-terminal, and a QB-terminal. A gate of the transistor p22, a gate of the transistor n21, a drain of the transistor p23, a drain of the transistor n22, a drain of the transistor p21, and the Q-terminal are connected with each other. A drain of the transistor p22, a drain of the transistor n21, a gate of the transistor p23, a gate of the transistor n22, and the QB-terminal are connected with each other. The SB-terminal is connected to a gate of the transistor p21. The RB-terminal is connected to a source of the transistor p21 and a source of the transistor p23. Sources of the transistors n21 and n22 are connected to the VSS. Here, the transistors p22, n21, p23, and n22 constitute a latch circuit LC, and the transistor p21 serves as a set transistor ST.

(b) of FIG. 19 is a timing chart illustrating how the flip-flop FF4 is driven, and (c) of FIG. 19 is a truth table of the flip-flop FF4. A Q-signal of the flip-flop FF4 is to have a state as follows (see (b) and (c) of FIG. 19): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

For example, during a period t1 in (b) of FIG. 19, the Vdd (High) flows from the RB-terminal to the Q-terminal, and thereby the transistor n21 is turned on. Accordingly, the Vss (Low) is applied to the QB-terminal. During a period t2, the SB-signal is being High, and therefore the transistor p21 is turned off. Accordingly, the state in the period t1 is maintained. During a period t3, the RB-signal is being Low, and therefore the Vss+Vth (a threshold voltage of the transistor p23) is once applied to the Q-terminal via the transistor p23. This causes the transistor p22 to be turned on and accordingly the Vdd (High) is applied to the QB-terminal. Further, the transistor n22 is turned on because the Vdd is applied to the QB-terminal, and accordingly the Vss is applied to the Q-terminal. Note that, in a case where the SB-signal and the RB-signal both become Low (active), the Vss+Vth is once applied to the Q-terminal via the transistor p21. This causes the transistor p22 to be turned on and accordingly the Vdd (High) is applied to the QB-terminal. Further, the transistor n22 is turned on because the Vdd is applied to the QB-terminal, and accordingly the Vss is applied to the Q-terminal.

Figure 20:
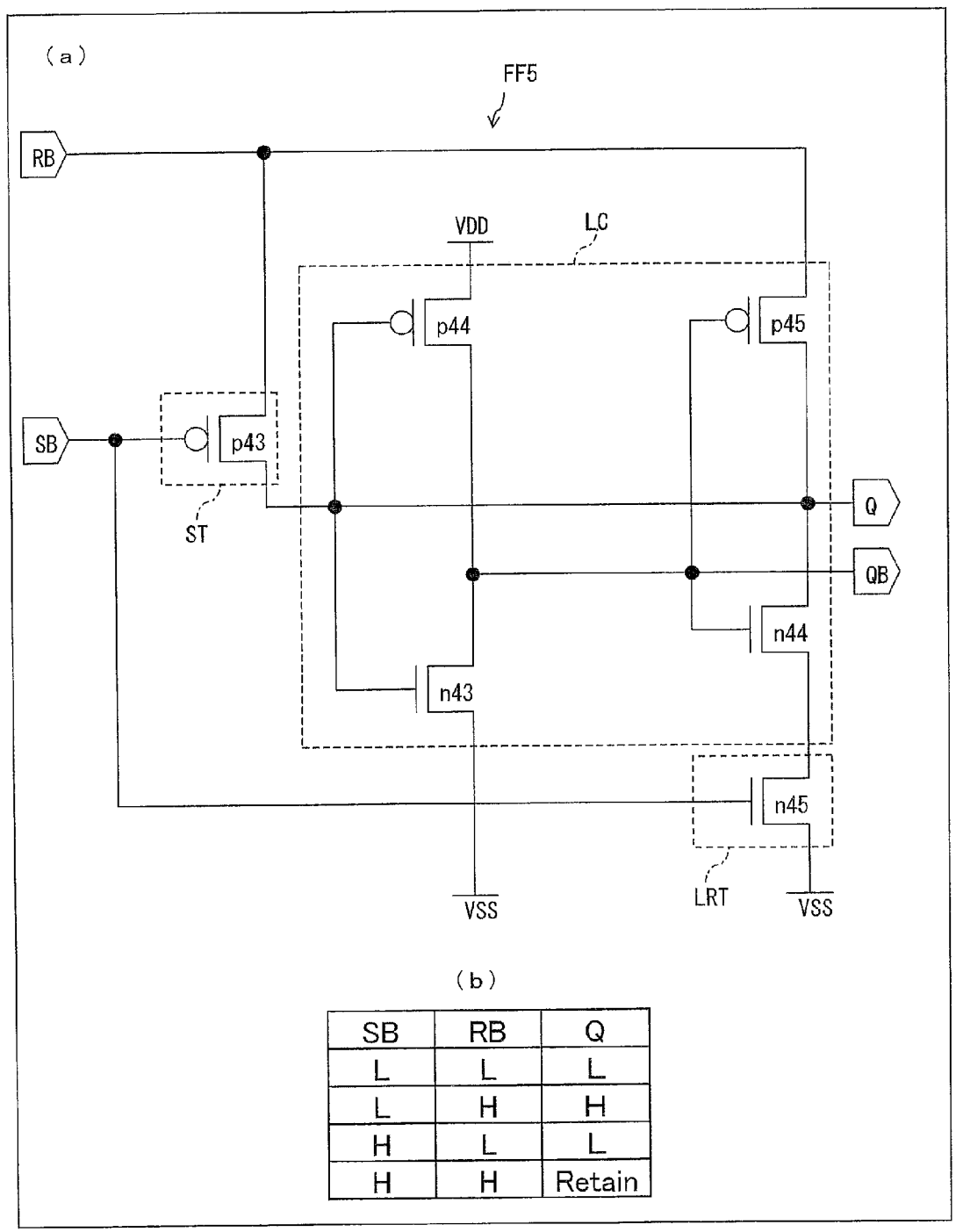
FIG. 20 (a) is another circuit diagram of a flip-flop of the shift register shown in FIG. 10 or 14 and (b) is a truth table of the flip-flop.

As the flip-flop FF shown in FIG. 11 or 15, a flip-flop FF5 shown in FIG. 20 may be used. As shown in FIG. 20, the flip-flop FF5 includes (i) a p-channel transistor p44 and an n-channel transistor n43 which constitute a CMOS circuit, (ii) a p-channel transistor p45 and an n-channel transistor n44 which constitute a CMOS circuit, (iii) a p-channel transistor p43, (iv) an n-channel transistor n45, and (v) an SB-terminal, an RB-terminal, a Q-terminal, and a QB-terminal. A gate of the transistor p44, a gate of the transistor n43, a drain of the transistor p45, a drain of the transistor n44, a drain of the transistor p43, and the Q-terminal are connected with each other. A drain of the transistor p44, a drain of the transistor n43, a gate of the transistor p45, a gate of the transistor n44, and the QB-terminal are connected with each other. A source of the transistor n44 is connected with a drain of the transistor n45. The SB-terminal is connected to a gate of the transistor p43 and a gate of the transistor n45. The RB-terminal is connected to a source of the transistor p43 and a source of the transistor p45. A source of the transistor n43 is connected to the VSS, a source of the transistor p44 is connected to the VDD, and a source of the transistor n45 is connected to the VSS. Here, the transistors p44, n43, p45, and n44 constitute a latch circuit LC, the transistor p43 serves as a set transistor ST, and the transistor n45 serves as a latch release circuit transistor LRT.

(b) of FIG. 20 is a truth table of the flip-flop FF5. A Q-signal of the flip-flop FF5 is to have a state as follows (see (b) of FIG. 20): during a period in which an SB-signal is Low (active) and an RB-signal is Low (active), the Q-signal is Low (inactive); during a period in which the SB-signal is Low (active) and the RB-signal is High (inactive), the Q-signal is High (active); during a period in which the SB-signal is High (inactive) and the RB-signal is Low (active), the Q-signal is Low (inactive); and during a period in which the SB-signal is High (inactive) and the RB-signal is High (inactive), the Q-signal is in a retention state.

Figure 21:
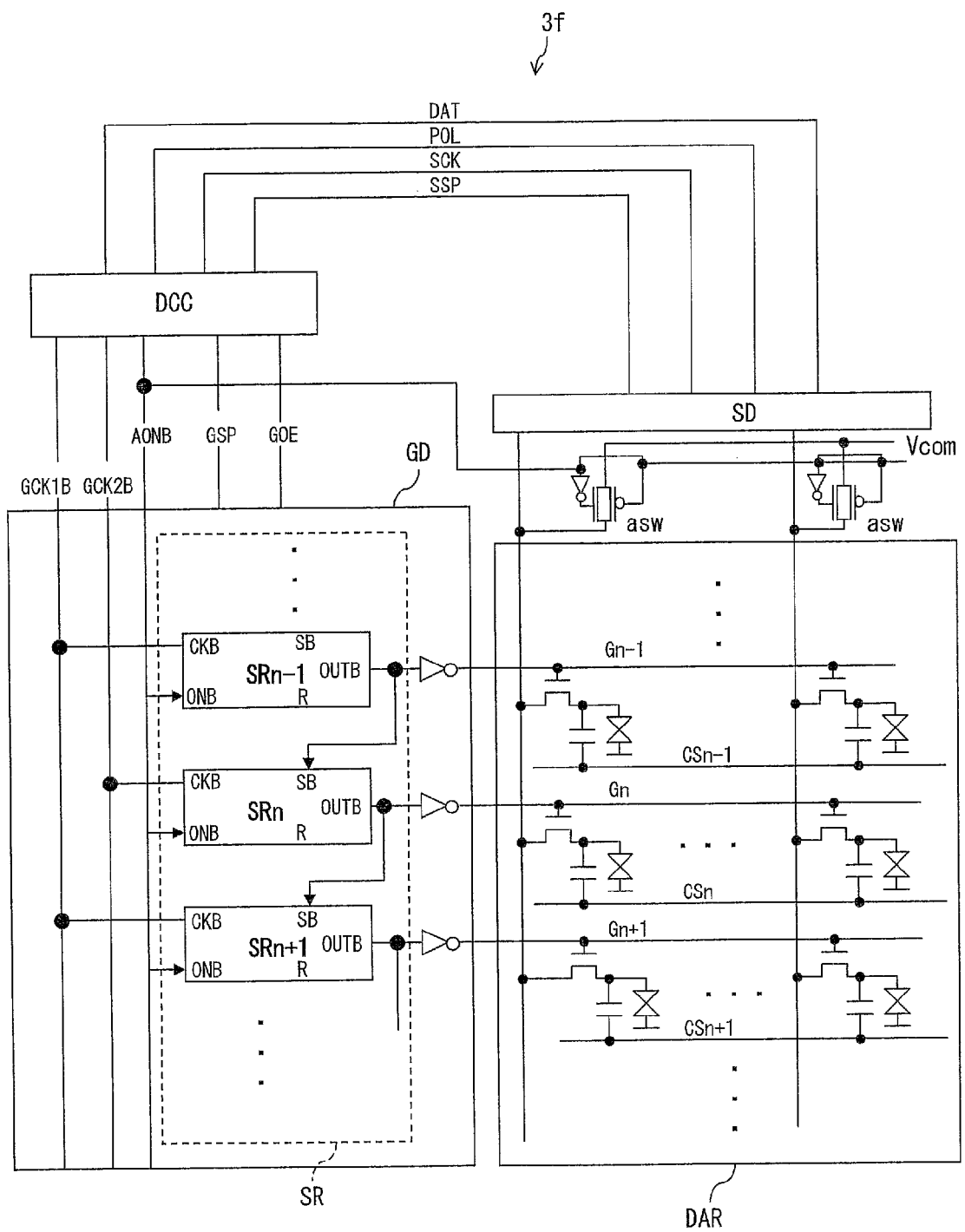
FIG. 21 is a schematic view illustrating yet another configuration of the liquid crystal display device of Embodiment 2 of the present invention.

The gate driver GD of the liquid crystal display device 3e can also be configured as shown in FIG. 21. In a liquid crystal display device 3f shown in FIG. 21, an output signal (OUTB-signal) of the i-th stage SRi of the shift register is supplied to the scanning signal line Gi of the display section DAR via an inverter. For example, an OUTB-signal of an n-th stage SRn is supplied to a scanning signal line Gn via an inverter. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Figure 22:
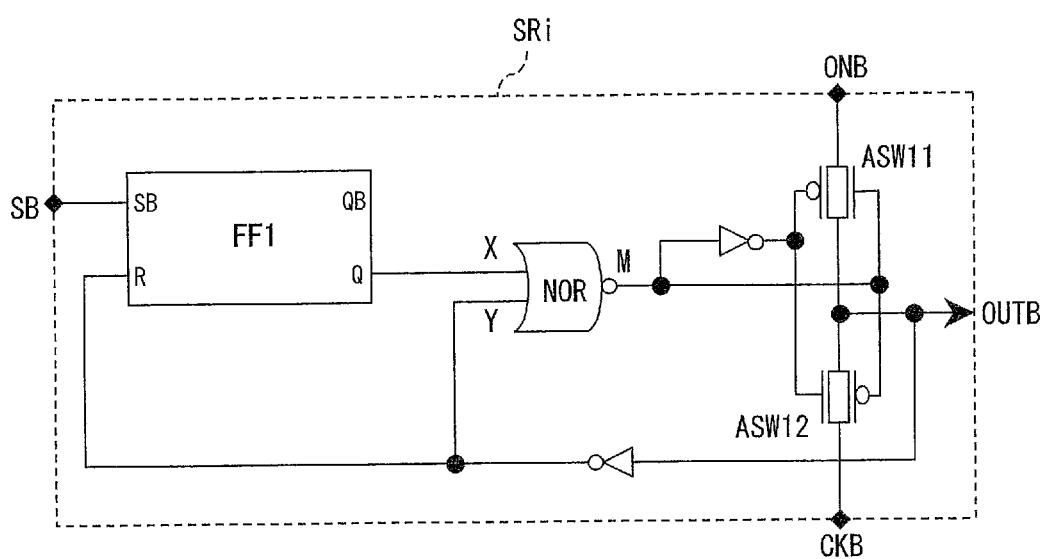
FIG. 22 is a circuit diagram partially illustrating a shift register of the liquid crystal display device shown in FIG. 21.

FIG. 22 is a circuit diagram illustrating a configuration of the i-th stage SRi of the shift register SR. As shown in FIG. 22, each stage of the shift register includes (i) a flip-flop FF having an SB-terminal and an RB-terminal, (ii) two analog switches ASW11 and ASW12 (gate circuit), (iii) an NOR circuit (logical circuit), (iv) a first inverter and a second inverter, (v) a CKB terminal, (vi) an ONB terminal, and (vii) an OUTB terminal. A Q-terminal of the flip-flop FF is connected to one input terminal of the NOR circuit, and an output terminal of the NOR circuit is connected to an input terminal of the first inverter, an n-channel side gate of the analog switch ASW11 and a p-channel side gate of the analog switch ASW12. An output terminal of the first inverter is connected to a p-channel side gate of the analog switch ASW11 and an n-channel side gate of the analog switch ASW12. One conduction electrode of the analog switch ASW11 is connected to the ONB terminal, and one conduction electrode of the analog switch ASW12 is connected to the CKB terminal. The other conduction electrode of the analog switch ASW11, the other conduction electrode of the analog switch ASW12, the OUTB terminal, which serves as an output terminal of that stage, and an input terminal of the second inverter are connected with each other. An output terminal of the second inverter, the other input terminal of the NOR circuit, and the R terminal of the flip-flop FF are connected with each other. Here, the analog switches ASW11 and ASW12 (gate circuit) and the NOR circuit (logical circuit) constitute a signal generating circuit which generates an OUTB-signal.

In the shift register SR, each of the stages has an OUTB terminal which is connected to an SB-terminal of a following stage. In the gate driver GD, a CKB terminal of an odd-numbered stage is connected to a GCK line (via which the gate clock signal GCK is supplied) which is different from a GCK line to which a CKB terminal of an even-numbered stage is connected.

Figure 23:
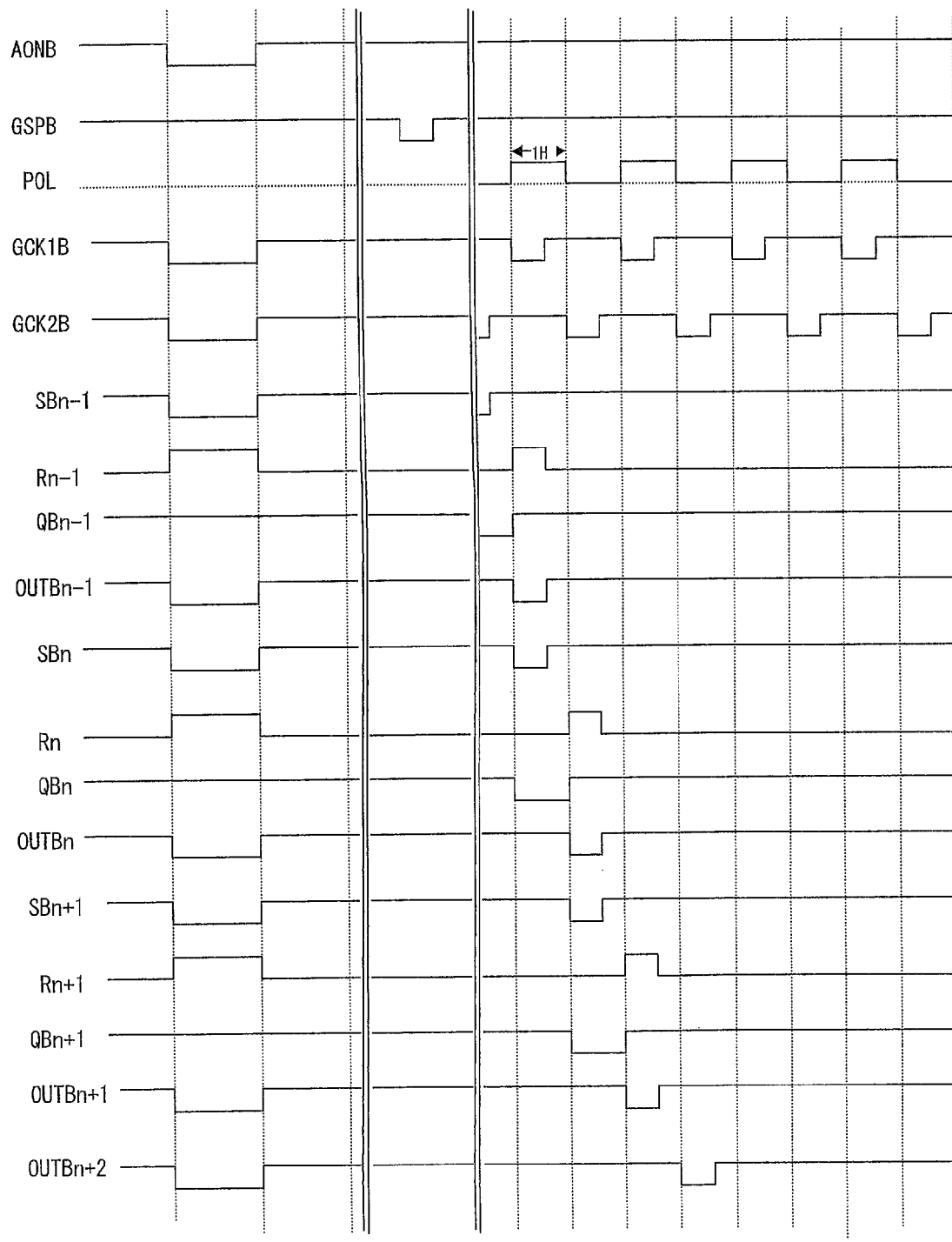
FIG. 23 is a timing chart illustrating how the liquid crystal display device shown in FIG. 21 is driven.
Figure 24:
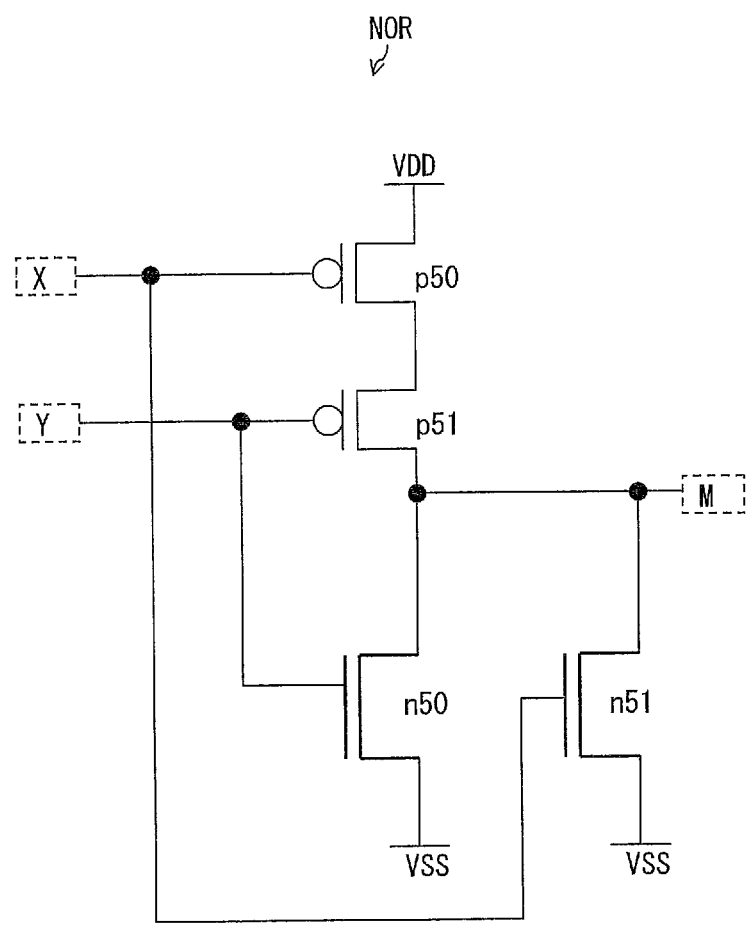
FIG. 24 is a circuit diagram illustrating a concrete configuration of an NOR circuit shown in FIG. 22.

FIG. 23 is a timing chart illustrating how the liquid crystal display device 3f is driven. In the liquid crystal display device 3e, the following display preparation operation is carried out prior to the first frame (vertical scan period) of a displayed video. Specifically, the AONB-signal is caused to be active (Low) for a predetermined period of time. During the predetermined period in which the AONB-signal is being active, the GCKB signals are fixedly active (Low). When the AONB-signal becomes active (Low), the OUTB-signal becomes active (Low) because the analog switch ASW11 is on, and accordingly all the scanning signal lines are selected. At the time, the analog switches asw provided for the respective data signal lines are turned on, and accordingly the Vcom is applied to all the data signal lines. Moreover, the SB-signal and the RB-signal supplied to each of the stages become active (Low), and thereby the QB-signal of the flip-flop FF becomes inactive (High). Note that, once the OUTB-signal of each of the stages of the shift register becomes active, a feedback signal to the NOR circuit becomes High, and therefore the analog switch ASW11 is turned off and the analog switch ASW12 is turned on (i.e., the GCK1B or the GCK2B is received by the each of the stages).

After the end of the display preparation operation (i.e., after the AONB-signal becomes inactive), the Vcom is written into all the pixels PIX of the display section DAR, and the QB-signal outputted from the flip-flop FF provided in the each of the stages of the shift register becomes inactive (High).

Moreover, in the liquid crystal display device 3f, the following operation is carried out in each vertical scan period (at which a frame is displayed). Specifically, each stage of the shift register SR is configured as follows. When an SB-signal supplied to a stage of the shift register SR becomes active (=Low), an output of a flip-flop FF of the stage is set to be active. This causes a GCKB signal to be received by the stage. When the GCKB signal in the stage becomes active (=Low), (i) an OUTB-signal of the stage becomes active (=Low) and an SB-signal in a following stage of the stage becomes active, and (ii) the flip-flop FF of the stage is reset and accordingly the QB-signal becomes High (inactive). At the time, the OUTB-signal of the stage is Low (i.e., an output of the NOR circuit is Low), and therefore the GCKB signal is continuously being received by the stage. When the GCKB signal becomes High (inactive), the OUTB-signal of the stage becomes High and the output of the NOR circuit becomes High. Subsequently, the AONB-signal is outputted from the OUTB terminal, and the OUTB-signal becomes High (inactive).

In the liquid crystal display device 3f, for example, it is possible to apply an identical electric potential (e.g., Vcom) to all the pixels by simultaneously selecting all the scanning signal lines before a display is started. This makes it possible to prevent a disordered screen caused before the display is started or after the display is ended. Moreover, the shift register is initialized (the flip-flops of the respective stages are initialized) when the simultaneous selection of all the scanning signal lines is carried out. This makes it possible to carry out the preparation operation before starting the display more quickly, as compared to the conventional liquid crystal display device which separately carries out the simultaneous selection of all the scanning signal lines and the initialization of the shift register. Furthermore, each of the stages is reset automatically, and it is therefore possible to simplify a relation of connection between the stages. The AONB-signal is supplied to the analog switch ASW11, and it is therefore possible to omit the NAND circuit 2 (outputting circuit), unlike the liquid crystal display device 3d (see FIG. 11). This makes it possible to reduce a size of the shift register. Further, it is not necessary to prepare configurations for generating and transmitting a signal for initializing the shift register, and it is therefore possible to reduce a size of the gate driver.

Note that, in the configuration shown in FIG. 22 (i.e., the configuration in which the flip-flop FF has reset priority so that the each stage of the shift register is automatically reset), a feedback of the OUTB-signal to the R-terminal of the flip-flop may precede a feedback to the NOR circuit. In view of this, it is preferable to employ an NOR circuit shown in FIG. 24, instead of the NOR circuit shown in FIG. 22. Specifically, a source of a p-channel transistor p50 is connected to the VDD; a gate of the transistor p50 is connected to an input terminal X of the NOR circuit and to a gate of an n-channel transistor n51; a drain of the transistor p50 is connected to a source of a p-channel transistor p51; a gate of the transistor p51 is connected to an input terminal Y of the NOR circuit and a gate of an n-channel transistor n50; a drain of the transistor p51 is connected to a source of the transistor n50, a source of the transistor n51, and an output terminal M of the NOR circuit; drains of the respective transistors n50 and n51 are connected to the VSS. Each of the n-channel transistors n50 and n51 is configured to have operation performance higher than that of each of the p-channel transistors p50 and p51. This causes the OUTB-signal to remain active (=Low) until the QB-signal becomes sufficiently inactive (High). It is therefore possible to prevent the feedback to the R-terminal of the flip-flop FF from preceding the feedback to the NOR circuit.

Embodiment 3

Figure 25:
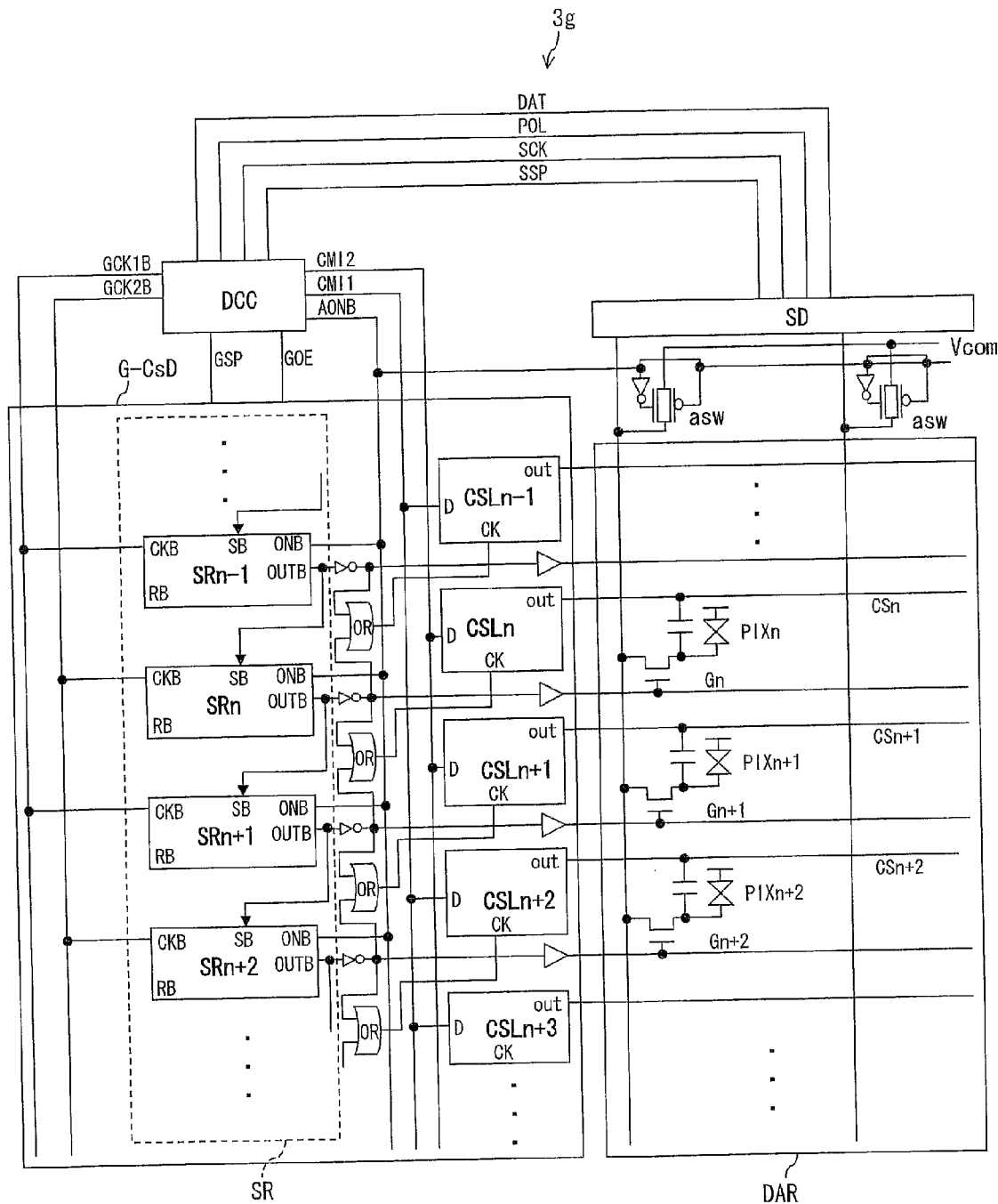
FIG. 25 is a schematic view illustrating a configuration of a liquid crystal display device of Embodiment 3 of the present invention.

FIG. 25 is a circuit diagram illustrating a configuration of a liquid crystal display device 3g of the present invention. The liquid crystal display device 3g is a so-called CC (charge coupled) driven liquid crystal display device which includes a display section DAR, a gate-Cs driver G-CsD, a source driver SD, and a display control circuit DCC. The display control circuit DCC supplies, to the gate driver GD, a gate start pulse GSP, a gate on enable signal GOE, an AONB-signal (all-ON signal), CS inversion signals CMI1 and CMI2, and gate clock signals GCK1B and GCK2B. Moreover, the display control circuit DCC supplies, to the source driver SD, a source start pulse SSP, digital data DAT, a polarity signal POL, and a source clock signal SCK. The gate-Cs driver G-CsD includes (i) a shift register SR having a plurality of stages and (ii) a plurality of D-latch circuits CSL. For each one of the stages of the shift register, one (1) inverter, one (1) OR circuit, and one (1) D-latch circuit CSL are provided. Hereinafter, an i-th stage (i=1, ... n−1, n, n+1, ...) of the shift register is shortly referred to as "i-th stage SRi", as appropriate. Note that a D-latch circuit CSLi is provided for the i-th stage SRi in the shift register.

An output signal (OUTB-signal) from the i-th stage SRi of the shift register is supplied to a scanning signal line Gi of the display section DAR via an inverter and a buffer. An output signal (out-signal, CS-signal) from the D-latch circuit CSLi, which is provided for the i-th stage SRi, is supplied to a retention capacitor line CSi of the display section DAR. For example, an OUTB-signal of an n-th stage SRn is supplied to a scanning signal line Gn via an inverter and a buffer, and an output signal (out-signal, CS-signal) from a D-latch circuit CSLn, which is provided for the n-th stage SRn, is supplied to a retention capacitor line CSn of the display section DAR. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

Figure 26:
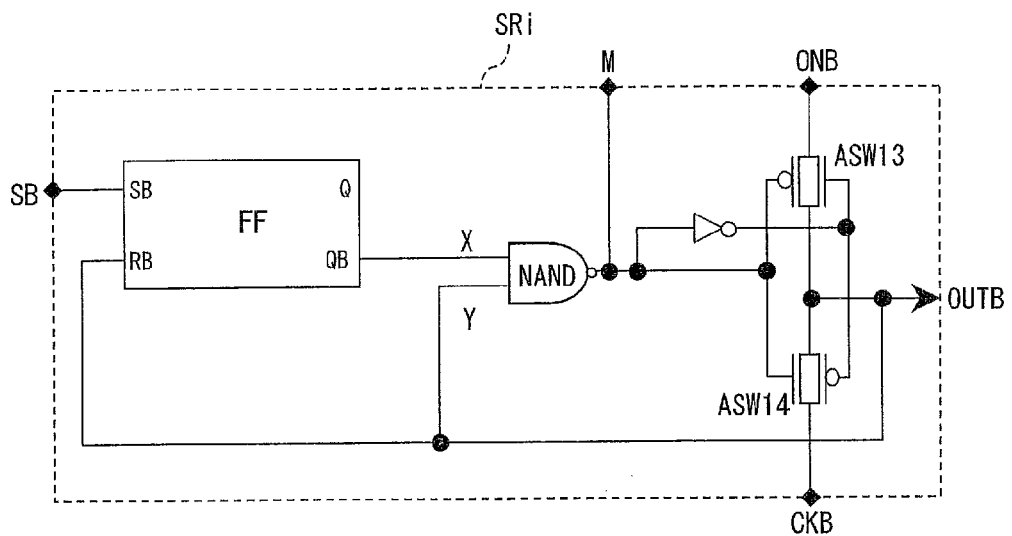
FIG. 26 is a circuit diagram illustrating each stage of a shift register of the liquid crystal display device shown in FIG. 25.

FIG. 26 is a circuit diagram illustrating a configuration of the i-th stage SRi of the shift register SR shown in FIG. 25. As shown in FIG. 26, each of the stages of the shift register includes (i) a flip-flop FF (any of the flip-flops FF1 through FF5) having an SB-terminal and an RB-terminal, (ii) two analog switches ASW13 and ASW14, (iii) an NAND circuit, (iv) an inverter, (v) a CKB terminal, and (vi) an ONB terminal. A QB-terminal of the flip-flop FF is connected to one input terminal of the NAND circuit, and an output terminal (M) of the NAND circuit is connected to an input terminal of the inverter, a p-channel side gate of the analog switch ASW13, and an n-channel side gate of the analog switch ASW14. An output terminal of the inverter is connected to an n-channel side gate of the analog switch ASW13 and a p-channel side gate of the analog switch ASW14. One conduction electrode of the analog switch ASW13 is connected to the ONB terminal, and one conduction electrode of the analog switch ASW14 is connected to the CKB terminal. The other conduction electrode of the analog switch ASW13, the other conduction electrode of the analog switch ASW14, the OUTB terminal, which serves as an output terminal of that stage, the other input terminal of the NAND circuit, and the RB terminal of the flip-flop FF are connected with each other.

In the i-th stage SRi, during a period in which a QB-signal (at one input terminal X of the NAND circuit) in the flip-flop FF is being High (inactive), an output (M) from the NAND circuit becomes Low (i.e., the analog switch ASW13 is turned on and the analog switch ASW14 is turned off), provided that an OUTB-signal (at the other input terminal Y of the NAND circuit) is High (inactive), and accordingly an AONB-signal (which is inactive and has the electric potential Vdd) is outputted from the OUTB terminal. On the other hand, the output (M) from the NAND circuit becomes High (i.e., the analog switch ASW1 is turned off and the analog switch ASW2 is turned on), provided that the OUTB-signal (at the other input terminal Y of the NAND circuit) is Low (active), and accordingly a GCKB signal is passed through and then outputted from the OUTB terminal. During a period in which the QB-signal in the flip-flop FF is being Low (active), the output (M) from the NAND circuit becomes High (i.e., the analog switch ASW13 is turned off and the analog switch ASW14 is turned on) because both the input terminals X and Y of the NAND circuit are Low, and accordingly a GCKB signal passes through and then outputted from the OUTB terminal. That is, the NAND circuit, the inverter, and the analog switches ASW1 and ASW2 (gate circuit) constitute a signal generating circuit which generates the OUTB-signal. In particular, the analog switches ASW13 and ASW14 constitute a gate circuit which outputs the inputted AONB-signal or the inputted clock signal in response to the output M from the NAND circuit.

Figure 27:
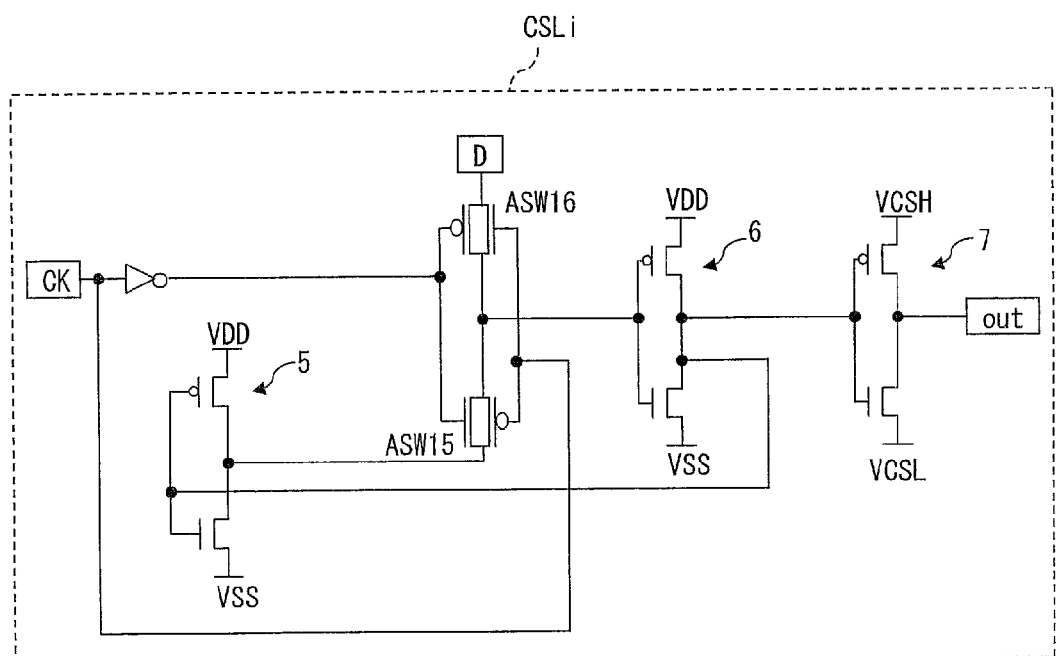
FIG. 27 is a circuit diagram illustrating a D-latch circuit of a gate-CS driver of the liquid crystal display device shown in FIG. 25.

FIG. 27 is a circuit diagram illustrating a configuration of the D-latch circuit CSLi which is provided for the i-th stage SRi of the shift register SR shown in FIG. 26. The D-latch circuit CSLi includes three CMOS circuits 5 through 7, analog switches ASW15 and ASW16, an inverter, a CK-terminal, a D-terminal, and an out-terminal (see FIG. 27). Each of the CMOS circuits 5 and 6 has a p-channel transistor and an n-channel transistor. A gate of the p-channel transistor is connected to a gate of the n-channel transistor, and a drain of the p-channel transistor is connected to a drain of the n-channel transistor. Moreover, a source of the p-channel transistor is connected to the VDD, and a source of the n-channel transistor is connected to the VSS. The CMOS circuit 7 has a p-channel transistor and an n-channel transistor. A gate of the p-channel transistor is connected to a gate of the n-channel transistor, and a drain of the p-channel transistor is connected to a drain of the n-channel transistor. Moreover, a source of the p-channel transistor is connected to a power supply VCSH, and a source of the n-channel transistor is connected to a power supply VCSL. The CK-terminal, an input terminal of the inverter, an n-channel side gate of the analog switch ASW16, and a p-channel side gate of the analog switch ASW15 are connected with each other. An output terminal of the inverter, a p-channel side gate of the analog switch ASW16, and an n-channel side gate of the analog switch ASW15 are connected with each other. A drain side of the CMOS circuit 5 is connected to one conduction terminal of the analog switch ASW15. The other conduction terminal of the analog switch ASW15, one conduction terminal of the analog switch ASW16, and a gate side of the CMOS circuit 6 are connected with each other. The other conduction terminal of the analog switch ASW16 is connected to the D-terminal. A gate side of the CMOS circuit 5 is connected to a drain side of the CMOS circuit 6. The drain side of the CMOS circuit 6 is connected to a gate side of the CMOS circuit 7. A drain side of the CMOS circuit 7 is connected to the out-terminal.

In a period during which a CK-signal (i.e., a signal which is to be supplied to the CK-terminal) is being active (High), the D-latch circuit CSLi receives a D-signal (i.e., a signal which is supplied to the D-terminal) and latches the D-signal. Specifically, when the D-signal is shifted from Low to High in the period during which the CK-signal is being active, an electric potential of an out-signal (which is outputted from the out-terminal) rises from that of the power supply VCSL to that of the power supply VCSH, and after that, the electric potential of the power supply VCSH is maintained. On the other hand, when the D-signal is shifted from High to Low in the period during which the CK-signal is being active, the electric potential of the out-signal (which is outputted from the out-terminal) falls from that of the power supply VCSH to that of the power supply VCSL, and after that, the electric potential of the power supply VCSL is maintained.

In the gate-Cs driver G-CsD of the liquid crystal display device 3g, an OUTB terminal of each stage is connected to an SB-terminal of a following stage of the stage. The OUTB terminal of the stage is connected, via an inverter, to one input terminal of an OR circuit provided for the stage. An OUTB terminal of the following stage of the stage is connected, via an inverter, to the other input terminal of the OR circuit provided for the stage. An output terminal of the OR circuit provided for the stage is connected to a CK-terminal of a D-latch circuit provided for the stage. For example, an OUTB terminal of the n-th stage SRn is connected to an SB-terminal of the (n+1)th stage SRn+1; the OUTB terminal of the n-th stage SRn is connected, via an inverter, to one input terminal of an OR circuit provided for the n-th stage SRn; an OUTB terminal of the (n+1)th stage SRn+1 is connected, via an inverter, to the other input terminal of the OR circuit provided for the n-th stage SRn; and an output terminal of the OR circuit provided for the n-th stage SRn is connected to a CK-terminal of a D-latch circuit CSLn provided for the n-th stage SRn. Note that the first stage of the shift register SR has an SB-terminal to which a GSPB signal is supplied.

Moreover, in the gate-Cs driver G-CsD of the liquid crystal display device 3g, a CKB terminal of each odd-numbered stage and another CKB terminal of each even-numbered stage are connected to respective different GCK lines (via which a gate clock signal GCK is supplied). ONB terminals of the respective stages are connected to an identical AONB line (via which an AON signal is supplied). For example, a CKB terminal of the n-th stage SRn is connected to the GCK2B signal line; a CKB terminal of the (n+1)th stage SRn+1 is connected to a GCK1B signal line; and ONB terminals of the n-th stage SRn and the (n+1)th stage SRn+1 are connected to the identical AONB-signal line. Moreover, every two D-terminals of respective two D-latch circuits provided for two adjacent stages are connected to a different CMI line (via which a CMI signal is supplied). For example, a D-terminal of the D-latch circuit CSLn provided for the n-th stage SRn and a D-terminal of a D-latch circuit CSLn+1 provided for the (n+1)th stage SRn+1 are connected to a CMI2 signal line, and a D-terminal of a D-latch circuit CSLn+2 provided for an (n+2)th stage SRn+2 and a D-terminal of a D-latch circuit CSLn+3 provided for an (n+3)th stage SRn+3 are connected to a CMI1 signal line.

Figure 28:
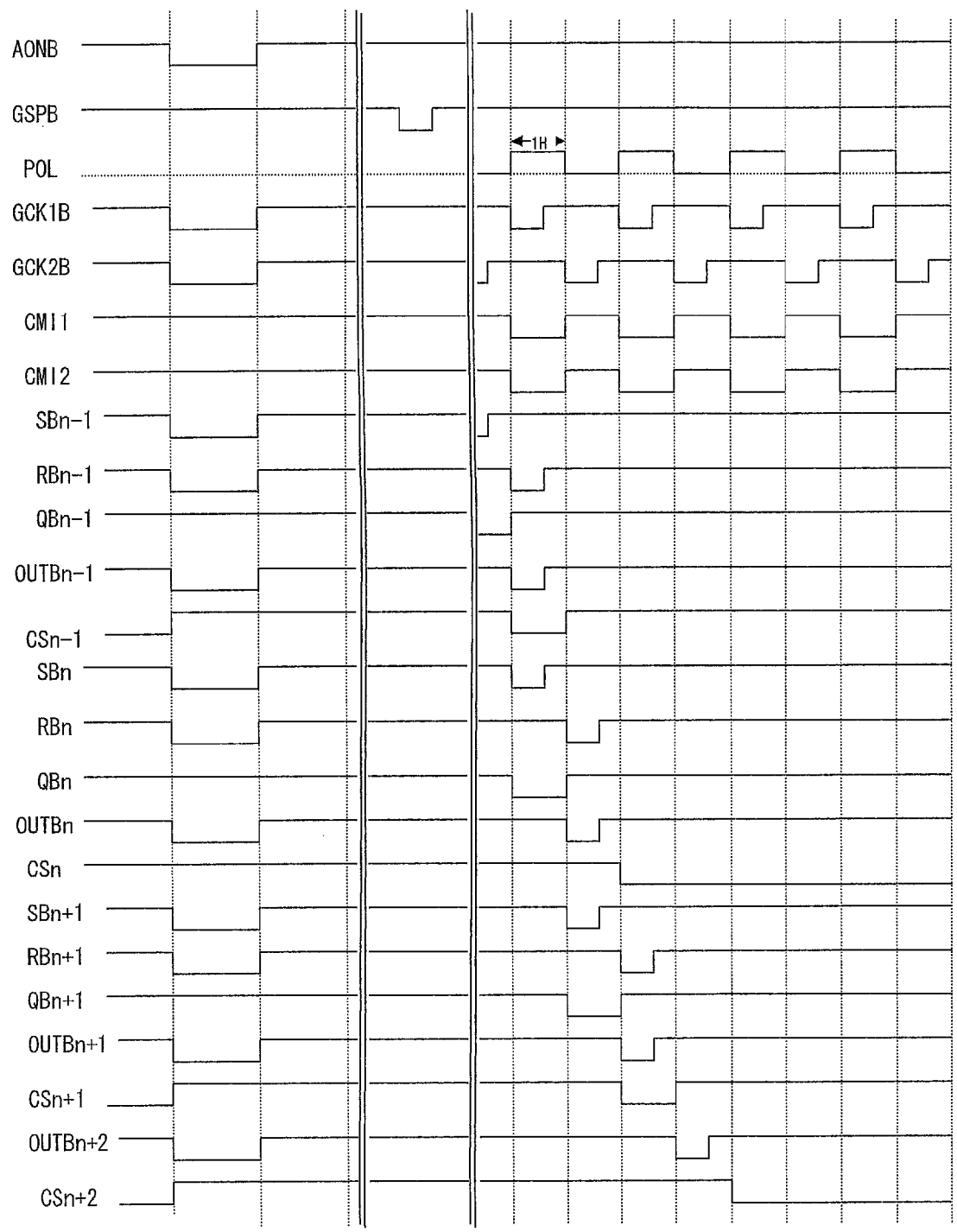
FIG. 28 is a timing chart illustrating how the liquid crystal display device shown in FIG. 25 is driven.
Figure 29:
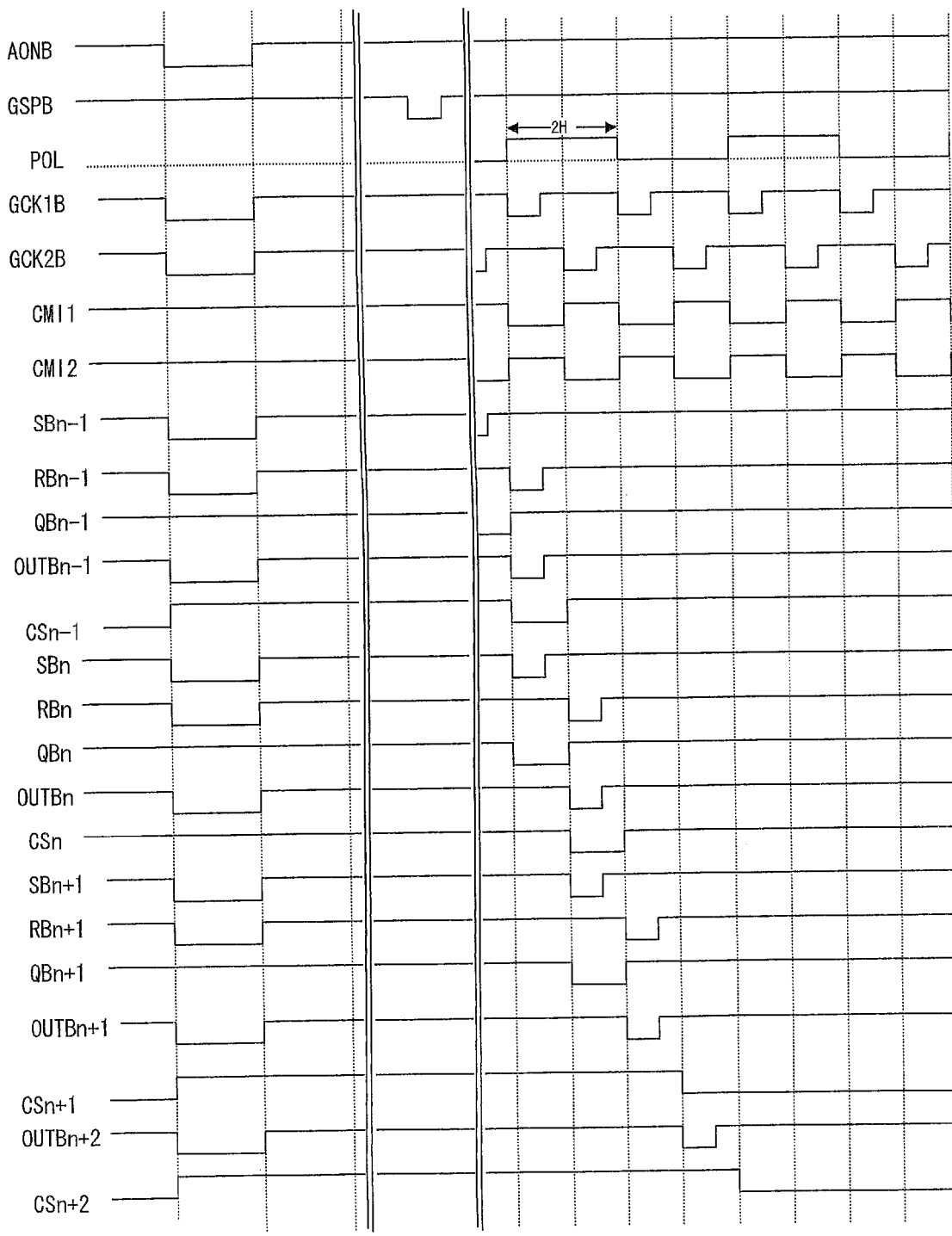
FIG. 29 is a timing chart illustrating how the liquid crystal display device shown in FIG. 25 is driven.

FIG. 28 is a timing chart illustrating how the liquid crystal display device 3g is driven. Note that, in FIG. 28, "AONB" indicates an AON-signal, "GSPB" indicates a gate start pulse bar signal, "GCK1B" indicates a GCK1B signal, "GCK2B" indicates a GCK2B signal, "CMI1" indicates a CMI1 signal, and "CMI2" indicates a CMI2 signal. Moreover, "SBi", "RBi", "QBi", and "OUTBi" (i=n−1, n, n+1) indicate an SB-signal (i.e., an electric potential at the SB-terminal), an RB-signal (i.e., an electric potential at the RB-terminal), a QB-signal (i.e., an electric potential at the QB-terminal), and an OUTB-signal (i.e., an electric potential at the OUTB terminal) in the i-th stage SRi, respectively. "CSi" (i=n−1, n, n+1) indicates an electric potential of a retention capacitor line CSi (i.e., an electric potential at the out-terminal of a D-latch circuit CSLi) provided for the i-th stage SRi. Note that, in FIG. 28, a cycle of the polarity signal POL is assumed to be one (1) horizontal scan period 1H (that is, a polarity of a data signal supplied to an identical data signal line is inverted every 1H), and the CS inversion signals CMI1 and CMI2 are assumed to have identical phases.

In the liquid crystal display device 3g, the following display preparation operation is carried out prior to the first frame (vertical scan period) of a displayed video. Specifically, the AONB-signal is caused to be active (Low) for a predetermined period of time. During the predetermined period in which the AONB-signal is being active, each of the GCKB signals is fixedly active (Low), and each of the CMI signals is fixedly High (or Low). Accordingly, in each of the stages of the shift register SR, the AONB-signal is outputted from the OUTB terminal via the analog switch ASW13. This causes the OUTB-signals of all the stages to become active (Low), and accordingly all the scanning signal lines are selected. At the time, the analog switches asw provided for the respective data signal lines are turned on, and accordingly the Vcom is applied to all the data signal lines. Moreover, the SB-signal and the RB-signal which are supplied to each of the stages become active (Low), and thereby the QB-signal of the flip-flop FF becomes inactive (High). Note that, once the OUT-signal of each of the stages of the shift register becomes active, a feedback signal to the NAND circuit becomes Low, and therefore the analog switch ASW13 is turned off and the analog switch ASW14 is turned on (i.e., the GCK1B or the GCK2B is received by each of the stages). Moreover, an output of the OR circuit provided for each of the stages becomes active (High). This causes each of the D-latch circuits to latch the CMI1 signal (Low) or the CMI2 signal (Low), and thereby the out-signal (CS-signal), which is supplied to the retention capacitor line, is caused to have the electric potential of the power supply VCSL. After the end of the display preparation operation, the Vcom is written into all the pixels PIX of the display section DAR, the QB output of the flip-flop FF provided in each of the stages of the shift register becomes inactive (High), and the out-signal (i.e., an electric potential of the retention capacitor line) from each of the D-latch circuits is caused to have the electric potential of the power supply VCSL.

In the liquid crystal display device 3g, the following operation is carried out when the first frame is displayed (i.e., at the first vertical scan period). Specifically, each stage of the shift register SR is configured as follows. When an SB-signal supplied to a stage of the shift register SR becomes active (=Low), an output of a flip-flop FF of the stage is set to be active. This causes a GCKB signal to be received by the stage. When the GCKB signal in the stage becomes active (=Low), (i) an OUTB-signal of the stage becomes active (=Low) and an SB-signal in a following stage of the stage becomes active, and (ii) the flip-flop FF of the stage is reset to be High (inactive). At the time, the OUTB-signal of the stage is Low (i.e., an output of the NAND circuit is High), and therefore the GCKB signal is continuously being received by the stage. When the GCKB signal becomes High (inactive), the OUTB-signal of the stage becomes High and the output of the NAND circuit becomes Low. Subsequently, the AONB-signal is outputted from the OUTB terminal, and the OUTB-signal becomes High (inactive).

When the OUTB-signal of the stage becomes active, the D-latch circuit provided for the stage latches the CMI1 signal or the CMI2 signal (because the output of the OR circuit provided for the stage becomes active). Further, when the OUTB-signal of the following stage of the stage becomes active, the D-latch circuit provided for the stage latches the CMI1 signal or the CMI2 signal again (because the output of the OR circuit provided for the stage becomes active). With the configuration, after the OUTB-signal of the stage becomes inactive (i.e., the scanning signal line provided for the stage is not selected), an out-signal (i.e, the electric potential of the retention capacitor line provided for the stage) from the D-latch circuit provided for the stage rises from the electric potential of the power supply VCSL to the electric potential of the power supply VCSH (in a case where a data signal having a positive polarity is written into a pixel corresponding to the stage) or falls from the electric potential of the power supply VCSH to the electric potential of the power supply VCSL (in a case where a data signal having a negative polarity is written into the pixel corresponding to the stage).

For example, when an OUTB-signal of the n-th stage SRn becomes active, the D-latch circuit CSLn provided for the n-th stage SRn latches the CMI2 signal (because the output of the OR circuit provided for the n-th stage SRn becomes active). Further, when an OUTB-signal of the (n+1)th stage SRn+1 becomes active, the D-latch circuit CSLn latches the CMI2 signal again (because the output of the OR circuit provided for the n-th stage SRn becomes active). With the configuration, after the OUTB-signal of the n-th stage SRn becomes inactive (i.e., a scanning signal line Gn provided for the n-th stage SRn is selected and then not selected), an out-signal (i.e, an electric potential of the retention capacitor line CSn provided for the n-th stage SRn) from the D-latch circuit CSLn provided for the n-th stage SRn falls from the electric potential of the power supply VCSH to the electric potential of the power supply VCSL. Here, a data signal having a negative polarity, as indicated by the polarity signal POL, is written into the pixel PIXn which corresponds to the n-th stage SRn. Therefore, it is possible to cause an effective electric potential to be lower than the electric potential of the data signal (i.e., a luminance of the pixel PIXn is heightened) by causing the electric potential of the retention capacitor line CSn to fall.

When an OUTB-signal of the (n+1)th stage SRn+1 becomes active, the D-latch circuit CSLn+1 provided for the (n+1)th stage SRn+1 latches the CMI2 signal. Further, when the OUTB-signal of the (n+2)th stage SRn+2 becomes active, the D-latch circuit CSLn+1 latches the CMI2 signal again. With the configuration, after the OUTB-signal of the (n+1)th stage SRn+1 becomes inactive (i.e., a scanning signal line Gn+1 is selected and then not selected), an out-signal (i.e, an electric potential of a retention capacitor line CSn+1) from the D-latch circuit CSLn+1 provided for the (n+1)th stage SRn+1 rises from the electric potential of the power supply VCSL to the electric potential of the power supply VCSH. Here, a data signal having a positive polarity, as indicated by the polarity signal POL, is written into a pixel PIXn+1 which corresponds to the (n+1)th stage SRn+1. Therefore, it is possible to cause an effective electric potential to be higher than the electric potential of the data signal (i.e., a luminance of the pixel PIXn+1 is heightened) by causing the electric potential of the retention capacitor line CSn+1 to rise.

When an OUTB-signal of the (n+2)th stage SRn+2 becomes active, the D-latch circuit CSLn+2 provided for the (n+2)th stage SRn+2 latches the CMI1 signal. Further, when the OUTB-signal of the (n+3)th stage SRn+3 becomes active, the D-latch circuit CSLn+2 latches the CMI1 signal again. With the configuration, after the OUTB-signal of the (n+2)th stage SRn+2 becomes inactive (i.e., a scanning signal line Gn+2 is selected and then not selected), an out-signal (i.e, an electric potential of a retention capacitor line CSn+2) from the D-latch circuit CSLn+2 provided for the (n+2)th stage SRn+2 falls from the electric potential of the power supply VCSH to the electric potential of the power supply VCSL. Here, a data signal having a negative polarity, as indicated by the polarity signal POL, is written into a pixel PIXn+2 which corresponds to the (n+2)th stage SRn+2. Therefore, it is possible to cause an effective electric potential to be higher than the electric potential of the data signal (i.e., a luminance of the pixel PIXn+2 is heightened) by causing the electric potential of the retention capacitor line CSn+2 to fall.

In each of the second and subsequent frames, a display is carried out in a manner similar to that in the first frame. Note, however, that the phase of the polarity signal POL is shifted by a half cycle every frame. This causes a polarity of a data signal, which is supplied to an identical pixel, to be inverted every frame. In accordance with this, a rise and a fall of the out-signal of the D-latch circuit CSLi (i.e., the electric potential of the retention capacitor line CSi) are switched every frame.

In the liquid crystal display device 3g, for example, it is possible to apply an identical electric potential (e.g., Vcom) to all the pixels by simultaneously selecting all the scanning signal lines before a display is started. This makes it possible to prevent a disordered screen caused before the display is started or after the display is ended. Moreover, the shift register is initialized (the flip-flops of the respective stages are initialized) when the simultaneous selection of all the scanning signal lines is carried out. This makes it possible to carry out, more quickly, the preparation operation before starting the display, as compared to the conventional liquid crystal display device which separately carries out the simultaneous selection of all the scanning signal lines and the initialization of the shift register. Further, it is not necessary to prepare configurations for generating and transmitting a signal for initializing the shift register, and it is therefore possible to reduce a size of the gate-CS driver. Furthermore, each of the stages is reset automatically, and it is therefore possible to simplify a relation of connection between the stages. The AONB-signal is supplied to the analog switch ASW13, and it is therefore possible to omit the NAND circuit 2 (outputting circuit), unlike the liquid crystal display device 3d (see FIG. 11). This makes it possible to reduce a size of the shift register. Moreover, each of pixel rows is appropriately driven from the first frame by a CC driving. This makes it possible to solve a problem of the conventional CC driving, that is, it is possible to prevent a disordered screen (lateral stripes) in the first frame.

A further remarkable characteristic of the liquid crystal display device 3g is that (i) a cycle of the polarity signal POL is switched to 2H (i.e., a polarity of a data signal supplied to an identical data signal line is inverted every 2H) only by shifting the phase of the CMI2 signal (from the state shown in FIG. 28) by a half cycle (see FIG. 29) and (ii) each of the pixel rows is appropriately driven from the first frame by the CC driving. That is, in the liquid crystal display device 3g, (i) the cycle of the polarity signal POL can be switched from 1H to 2H only by controlling the phases of the respective CS inversion signals CMI1 and CMI2 and (ii) a disordered screen at the time can be prevented.

Embodiment 4

Figure 30:
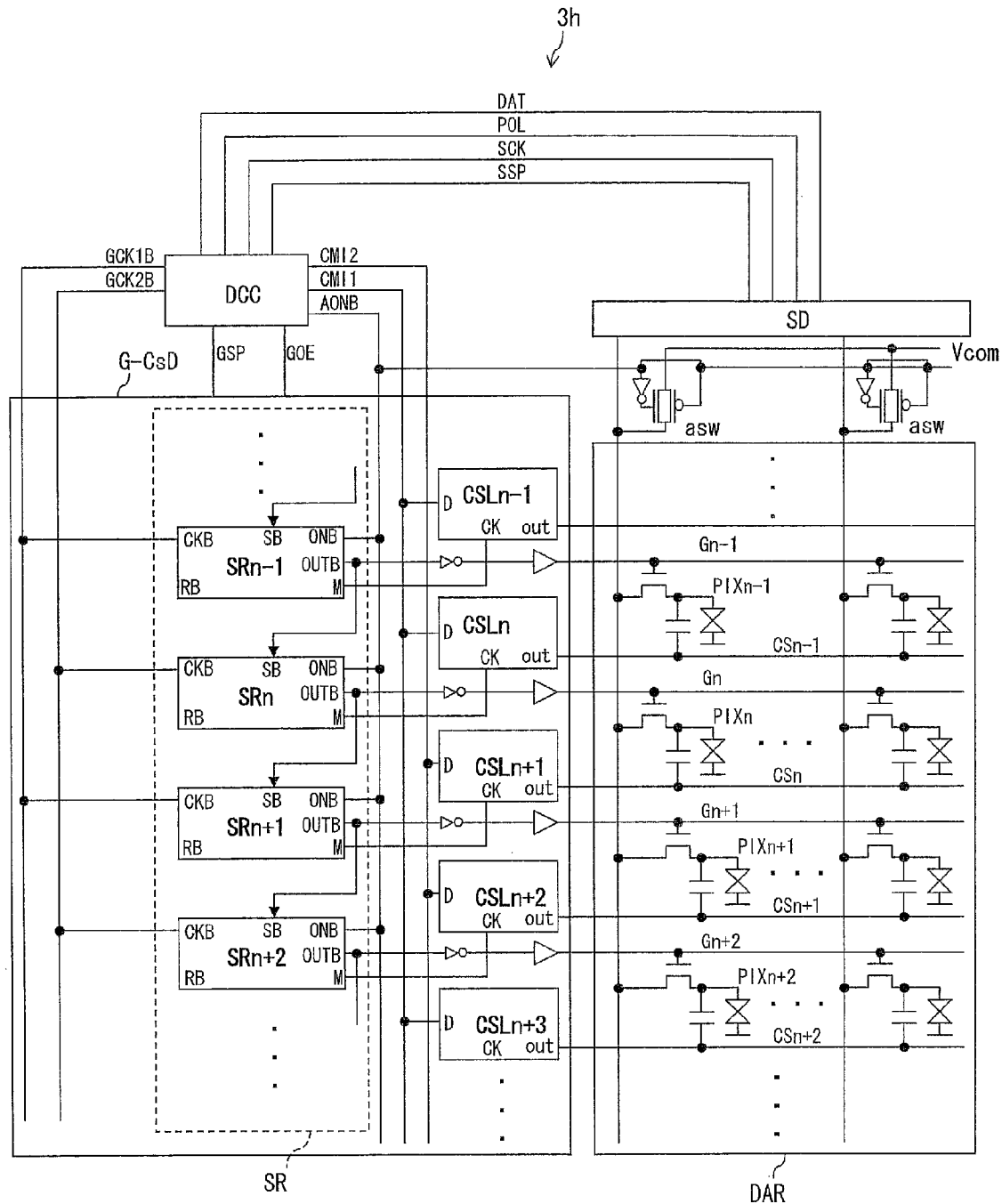
FIG. 30 is a schematic view illustrating a configuration of a liquid crystal display device of Embodiment 4 of the present invention.

FIG. 30 is a circuit diagram illustrating a configuration of a liquid crystal display device 3h of the present invention. The liquid crystal display device 3h is a so-called CC (charge coupled) driven liquid crystal display device which includes a display section DAR, a gate-Cs driver G-CsD, a source driver SD, and a display control circuit DCC. The display control circuit DCC supplies, to the gate driver GD, a gate start pulse GSP, a gate on enable signal GOE, an AONB-signal (all-ON signal), CS inversion signals CMI1 and CMI2, and gate clock signals GCK1B and GCK2B. Moreover, the display control circuit DCC supplies, to the source driver SD, a source start pulse SSP, digital data DAT, a polarity signal POL, and a source clock signal SCK. The gate-Cs driver G-CsD includes (i) a shift register SR having a plurality of stages and (ii) a plurality of D-latch circuits CSL. For each one of the stages of the shift register, one (1) inverter, one (1) D-latch circuit CSL, and one (1) buffer are provided. Hereinafter, an i-th stage (i=1, ... n–1, n, n+1, ... ) of the shift register is shortly referred to as "i-th stage SRi", as appropriate. Note that a D-latch circuit CSLi is provided for the i-th stage SRi in the shift register.

An output signal (OUTB-signal) from the i-th stage SRi of the shift register is supplied to a scanning signal line Gi of the display section DAR via an inverter and a buffer. An output signal (out-signal, CS-signal) from the D-latch circuit CSLi, which is provided for the i-th stage SRi, is supplied to a retention capacitor line CSi–1 of the display section DAR. For example, an OUTB-signal of an n-th stage SRn is supplied to a scanning signal line Gn via an inverter and a buffer, and an output signal (out-signal, CS-signal) from a D-latch circuit CSLn, which is provided for the n-th stage SRn, is supplied to a retention capacitor line CSn–1 of the display section DAR. In the display section DAR, the scanning signal line Gn is connected to a gate of a transistor which is connected with a pixel electrode in a pixel PIXn. A retention capacitor (auxiliary capacitor) is formed by the pixel electrode in the pixel PIXn and a retention capacitor line CSn. Moreover, a scanning signal line Gn–1 is connected to a gate of a transistor which is connected with a pixel electrode in a pixel PIXn–1. A retention capacitor (auxiliary capacitor) is formed by the pixel electrode in the pixel PIXn–1 and the retention capacitor line CSn–1.

Moreover, one (1) analog switch asw and one (1) inverter are provided for each data signal line. The inverter has an input terminal connected to an AONB-signal line. One conduction terminal of the analog switch asw is connected to an end of the data signal line, and the other conduction terminal of the analog switch asw is connected to a Vcom (common electrode electric potential) power supply. An n-channel side gate of the analog switch asw is connected to an output terminal of the inverter, and a p-channel side gate of the analog switch asw is connected to the AONB-signal line.

Note that the i-th stage SRi of the shift register SR shown in FIG. 30 has a configuration shown in FIG. 26, and the D-latch circuit CSLi has a configuration shown in FIG. 27.

In the shift register SR provided in the gate-Cs driver G-CsD of the liquid crystal display device 3h, an OUTB terminal of each of the stages is connected to an SB-terminal of a following stage of the stage. An M-terminal of each of the stages is connected to a CK-terminal of a D-latch circuit provided for each of the stages. For example, an OUTB terminal of the n-th stage SRn is connected to an SB-terminal of the (n+1)th stage SRn+1, and an M-terminal of the n-th stage SRn is connected to a CK-terminal of a D-latch circuit CSLn provided for the n-th stage SRn. Note that the first stage of the shift register SR has an SB-terminal to which a GSPB signal is supplied.

Moreover, in the gate-Cs driver G-CsD, a CKB terminal of each odd-numbered stage and another CKB terminal of each even-numbered stage are connected to respective different GCK lines (via which a gate clock signal GCK is supplied). ONB terminals of the respective stages are connected to an identical AONB line (via which an AON signal is supplied). For example, a CKB terminal of the n-th stage SRn is connected to the GCK2B signal line; a CKB terminal of the (n+1)th stage SRn+1 is connected to the GCK1B signal line; and ONB terminals of the n-th stage SRn and the (n+1)th stage SRn+1 are connected to the identical AONB-signal line. Moreover, every two D-terminals of respective two D-latch circuits provided for two adjacent stages are connected to a different CMI line (via which a CMI signal is supplied). For example, a D-terminal of the D-latch circuit CSLn–1 provided for an (n–1)th stage SRn–1 and a D-terminal of the D-latch circuit CSLn provided for the n-th stage SRn are connected to the CMI1 signal line, and a D-terminal of a D-latch circuit CSLn+1 provided for the (n+1)th stage SRn+1 and a D-terminal of a D-latch circuit CSLn+2 provided for an (n+2)th stage SRn+2 are connected to the CMI2 signal line.

Figure 31:
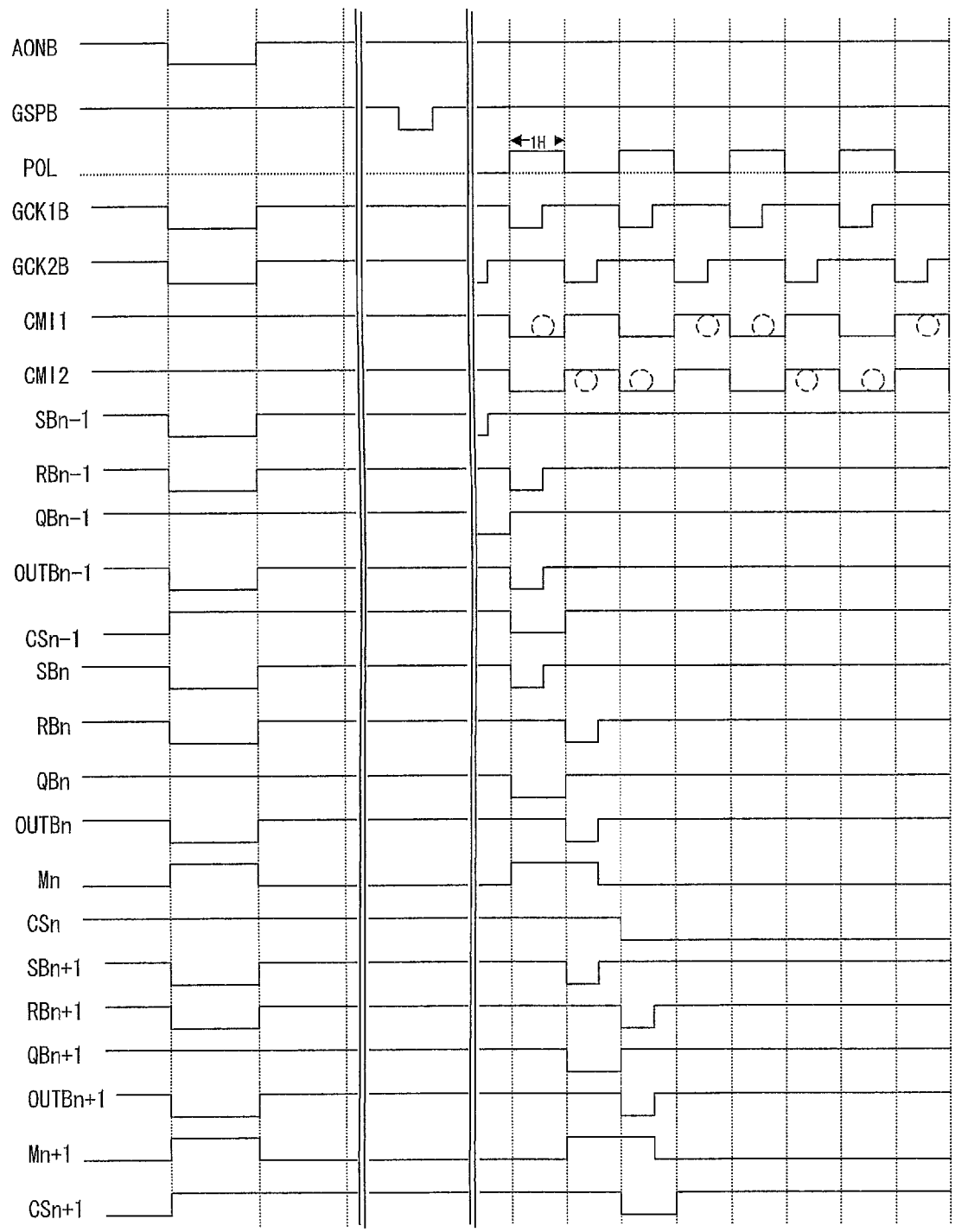
FIG. 31 is a timing chart illustrating how the liquid crystal display device shown in FIG. 30 is driven.
Figure 32:
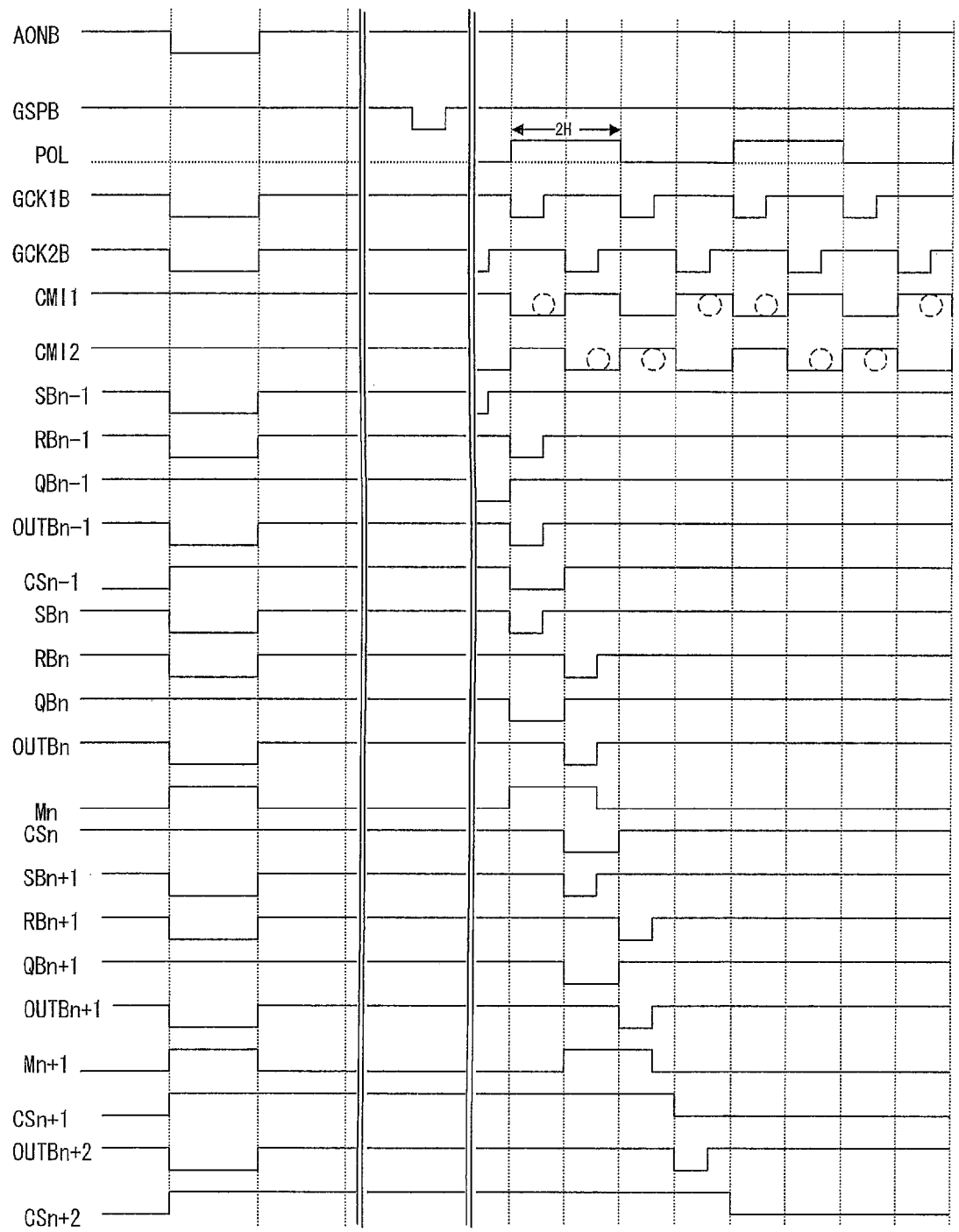
FIG. 32 is a timing chart illustrating how the liquid crystal display device shown in FIG. 30 is driven.

FIG. 31 is a timing chart illustrating how the liquid crystal display device 3h is driven. Note that, in FIG. 31, "AONB" indicates an AON-signal, "GSPB" indicates a gate start pulse bar signal, "GCK1B" indicates a GCK1B signal, "GCK2B" indicates a GCK2B signal, "CMI1" indicates a CMI1 signal, and "CMI2" indicates a CMI2 signal. Moreover, "SBi", "RBi", "QBi", and "OUTBi" (i=n–1, n, n+1) indicate an SB-signal (i.e., an electric potential at the SB-terminal), an RB-signal (i.e., an electric potential at the RB-terminal), a QB-signal (i.e., an electric potential at the QB-terminal), and an OUTB-signal (i.e., an electric potential at the OUTB terminal) in the i-th stage SRi, respectively. "CSi" (i=n−1, n, n+1) indicates an electric potential of a retention capacitor line CSi (i.e., an electric potential at the out-terminal of a D-latch circuit CSLi) provided for the i-th stage SRi. Note that, in FIG. 31, a cycle of the polarity signal POL is assumed to be one (1) horizontal scan period 1H (that is, a polarity of a data signal supplied to an identical data signal line is inverted every 1H), and the CS inversion signals CMI1 and CMI2 are assumed to have identical phases.

In the liquid crystal display device 3e, the following display preparation operation is carried out prior to the first frame (vertical scan period) of a displayed video. Specifically, the AONB-signal is caused to be active (Low) for a predetermined period of time. During the predetermined period in which the AONB-signal is being active, each of the GCKB signals is fixedly active (Low), and each of the CMI signals is fixedly High (or Low). Accordingly, in the each stage of the shift register SR, the AONB-signal is outputted from the OUTB terminal via the analog switch ASW13 (see FIG. 26). This causes the OUTB-signals of all the stages to become active (Low), and accordingly all the scanning signal lines are selected. At the time, the analog switches asw provided for the respective data signal lines are turned on, and accordingly the Vcom is applied to all the data signal lines. Moreover, the SB-signal and the RB-signal which are supplied to each of the stages become active (Low), and thereby the QB-signal of the flip-flop of each of the stages becomes inactive (High). Note that, once the OUT-signal of the each stage of the shift register becomes active, a feedback signal to the NAND circuit becomes Low, and therefore the analog switch ASW13 is turned off and the analog switch ASW14 is turned on (i.e., the GCK1B or the GCK2B is received by the each stage). Moreover, an M-signal (i.e., a signal outputted from the M-terminal) of each of the stages becomes active (High). This causes each of the D-latch circuits to latch the CMI1 signal (Low) or the CMI2 signal (Low), and thereby the out-signal (CS-signal), which is supplied to the retention capacitor line, is caused to have the electric potential of the power supply VCSL. After the end of the display preparation operation, the Vcom is written into all the pixels PIX of the display section DAR, the QB-signal outputted from the flip-flop provided in each of the stages of the shift register becomes inactive (High), and the out-signal (i.e., an electric potential at the retention capacitor line) from each of the D-latch circuits is caused to have the electric potential of the power supply VCSL.

In the liquid crystal display device 3h, the following operation is carried out when the first frame is displayed (i.e., at the first vertical scan period). Specifically, each stage of the shift register SR is configured as follows. When an SB-signal supplied to a stage of the shift register SR becomes active (=Low), an output of a flip-flop FF of the stage is set to be active. This causes a GCKB signal to be received by the stage. When the GCKB signal in the stage becomes active (=Low), (i) an OUTB-signal of the stage becomes active (=Low) and an SB-signal in a following stage of the stage becomes active, and (ii) the flip-flop FF of the stage is reset to be High (inactive). At the time, the OUTB-signal of the stage is Low (i.e., an output of the NAND circuit is High), and therefore the GCKB signal is continuously being received by the stage. When the GCKB signal becomes High (inactive), the OUTB-signal of the stage becomes High and the output of the NAND circuit becomes Low. Subsequently, the AONB-signal is outputted from the OUTB terminal, and the OUTB-signal becomes High (inactive).

When an M-signal of the following stage of the stage becomes active, a D-latch circuit provided for the following stage of the stage latches the CMI1 signal or the CMI2 signal. With the configuration, after the OUTB-signal of the stage becomes inactive (i.e., the scanning signal line provided for the stage is not selected), the out-signal (i.e, the electric potential of the retention capacitor line provided for the stage) from the D-latch circuit provided for the stage (i) rises from the electric potential of the power supply VCSL to the electric potential of the power supply VCSH (in a case where a data signal having a positive polarity is written into a pixel corresponding to the stage) or (ii) falls from the electric potential of the power supply VCSH to the electric potential of the power supply VCSL (in a case where a data signal having a negative polarity is written into the pixel corresponding to the stage).

For example, when an M-signal of the n-th stage SRn becomes active, the D-latch circuit CSLn provided for the n-th stage SRn latches the CMI1 signal. With the configuration, after the OUT-signal of the (n−1)th stage SRn−1 becomes inactive (i.e., the scanning signal line Gn−1 is selected and then not selected), an out-signal (i.e, an electric potential of the retention capacitor line CSn−1) from the D-latch circuit CSLn rises from the electric potential of the power supply VCSL to the electric potential of the power supply VCSH. Here, a data signal having a positive polarity, as indicated by the polarity signal POL, is written into a pixel PIXn−1 which corresponds to the (n−1)th stage SRn−1. It is therefore possible to cause an effective electric potential to be higher than the electric potential of the data signal (i.e., a luminance of the pixel PIXn−1 is heightened) by causing the electric potential of the retention capacitor line CSn−1 to rise.

When an M-signal of the (n+1)th stage SRn+1 becomes active, the D-latch circuit CSLn+1 provided for the (n+1)th stage SRn+1 latches the CMI2 signal. With the configuration, after the OUT-signal of the n-th stage SRn becomes inactive (i.e., the scanning signal line Gn is selected and then not selected), an out-signal (i.e, an electric potential of the retention capacitor line CSn) from the D-latch circuit CSLn+1 falls from the electric potential of the power supply VCSH to the electric potential of the power supply VCSL. Here, a data signal having a negative polarity, as indicated by the polarity signal POL, is written into a pixel PIXn which corresponds to the n-th stage SRn. It is therefore possible to cause an effective electric potential to be lower than the electric potential of the data signal (i.e., a luminance of the pixel PIXn is heightened) by causing the electric potential of the retention capacitor line CSn to fall.

When an M-signal of the (n+2)th stage SRn+2 becomes active, the D-latch circuit CSLn+2 provided for the (n+2)th stage SRn+2 latches the CMI2 signal. With the configuration, after the OUT-signal of the (n+1)th stage SRn+1 becomes inactive (i.e., a scanning signal line Gn+1 is selected and then not selected), an out-signal (i.e, an electric potential of a retention capacitor line CSn+1) from the D-latch circuit CSLn+2 rises from the electric potential of the power supply VCSL to the electric potential of the power supply VCSH. Here, a data signal having a positive polarity, as indicated by the polarity signal POL, is written into a pixel PIXn+1 which corresponds to the (n+1)th stage SRn+1. It is therefore possible to cause an effective electric potential to be higher than the electric potential of the data signal (i.e., a luminance of the pixel PIXn+1 is heightened) by causing the electric potential of the retention capacitor line CSn+1 to rise.

In each of the second and subsequent frames, a display is carried out in a manner similar to that in the first frame. Note, however, that the phase of the polarity signal POL is shifted by a half cycle every frame. This causes a polarity of a data signal, which is supplied to an identical pixel electrode PIXi, to be inverted every frame. In accordance with this, a rise and a fall of an out-signal of the D-latch circuit CSLi (i.e., an electric potential of the retention capacitor line CSi) are switched every frame.

The liquid crystal display device 3e includes the flip-flop described in each of the above embodiments. Therefore, it is possible to reduce a size of the gate-Cs driver.

In the liquid crystal display device 3h, for example, it is possible to apply an identical electric potential (e.g., Vcom) to all the pixels by simultaneously selecting all the scanning signal lines before a display is started. This makes it possible to prevent a disordered screen caused before the display is started or after the display is ended. Moreover, the shift register is initialized (the flip-flops of the respective stages are initialized) when the simultaneous selection of all the scanning signal lines is carried out. This makes it possible to carry out, more quickly, the preparation operation before starting the display, as compared to the conventional liquid crystal display device which separately carries out the simultaneous selection of all the scanning signal lines and the initialization of the shift register. Further, it is not necessary to prepare configurations for generating and transmitting a signal for initializing the shift register, and it is therefore possible to reduce a size of the gate-CS driver. Furthermore, each of the stages is reset automatically, and it is therefore possible to simplify a relation of connection between the stages. The AONB-signal is supplied to the analog switch ASW13, and it is therefore possible to omit the NAND circuit 2 (outputting circuit), unlike the liquid crystal display device 3d (see FIG. 11). This makes it possible to reduce a size of the shift register. An internal signal (M-signal) of the shift register is supplied to the CK-terminal of the D-latch circuit, and it is therefore possible to further reduce the size of the gate-Cs driver because it is not necessary to provide an NOR circuit or an OR circuit in the gate-Cs driver. Moreover, each of pixel rows is appropriately driven from the first frame by a CC driving. This makes it possible to solve a problem of the conventional CC driving, that is, it is possible to prevent a disordered screen (lateral stripes) in the first frame.

A further remarkable characteristic of the liquid crystal display device 3h is that (i) a cycle of the polarity signal POL is switched to 2H (i.e., a polarity of a data signal supplied to an identical data signal line is inverted every 2H) only by shifting the phase of the CMI2 signal (form the state shown in FIG. 31) by a half cycle (see FIG. 32) and (ii) each of the pixel rows is appropriately driven from the first frame by the CC driving. That is, in the liquid crystal display device 3h, (i) the cycle of the polarity signal POL can be switched from 1H to 2H only by controlling the phases of the respective CS inversion signals CMI1 and CMI2 and (ii) a disordered screen at the time can be drastically reduced.

Note that (i) the gate driver, (ii) the source driver or the gate-Cs driver, and (iii) the pixel circuit in the display section may be formed monolithically (i.e., formed on a single substrate).

In the above embodiments, the preparation operation before starting a display (e.g., when the power supply is turned on or when the displayed video is switched) is described as an example. Alternatively, a similar operation (i.e., simultaneous selection of the scanning signal lines and initialization of the shift register) may be carried out when the power supply is turned off.

In the present invention, an output side of the two conduction electrodes of the transistor (p-channel or n-channel) is referred to as the "drain terminal".

A shift register of the present invention is, for example, a shift register for use in a display-driving circuit which carries out simultaneous selection of a plurality of signal lines at a predetermined timing, wherein: a stage of the shift register includes (i) a set-reset type flip-flop and (ii) a signal generating circuit receiving a simultaneous selection signal, the signal generating circuit generating an output signal of the stage by use of an output of the flip-flop; the output signal of the stage (i) becomes active due to an activation of the simultaneous selection signal and then (ii) remains active during the simultaneous selection; and the output of the flip-flop is inactive during a period in which a setting signal and a resetting signal are both being active.

During the period in which the simultaneous selection is being carried out, the output signal of the each of the stages is being active. This causes both the setting signal and the resetting signal, which are supplied to the flip-flop of the each of the stages, to be active. The configuration employs the flip-flop which remains inactive during a period in which both the setting signal and the resetting signal are being active. Accordingly, the flip-flop of the each of the stages is initialized (i.e., caused to be inactive) while the simultaneous selection is carried out. This makes it possible to quickly complete the simultaneous selection and the initialization of the shift register because the shift register is initialized while the simultaneous selection is carried out. Moreover, it is possible to reduce a size of each of various kinds drives encompassing the shift register, because it is not necessary to provide a configuration for generating and transmitting a signal for initializing the shift register.

In the shift register of the present invention, it is possible that the signal generating circuit includes a gate circuit which selectively outputs one of inputted signals in response to a switching signal supplied to the gate circuit.

In the shift register of the present invention, it is possible that the output of the flip-flop is supplied, as the switching signal, to the gate circuit.

In the shift register of the present invention, it is possible that the signal generating circuit further includes a logical circuit; and the output of the flip-flop is supplied to the logical circuit, an output of the logical circuit is supplied to the gate circuit as the switching signal, and the output signal of the stage is fed back to the logical circuit and to a reset terminal of the flip-flop.

In the shift register of the present invention, it is possible that an output of the gate circuit serves as the output signal of the stage.

In the shift register of the present invention, it is possible that the signal generating circuit includes an outputting circuit which outputs, in accordance with the output of the gate circuit and the simultaneous selection signal, the output signal of the stage.

In the shift register of the present invention, it is possible that the gate circuit selectively outputs the simultaneous selection signal or a clock signal.

In the shift register of the present invention, it is possible that the gate circuit selectively outputs (i) a clock signal or (ii) a signal having a constant potential which is equal to an electric potential of a power supply.

In the shift register of the present invention, it is possible that the logical circuit includes an NAND circuit or an NOR circuit.

In the shift register of the present invention, it is possible that the NAND circuit is made up of a plurality of p-channel transistors and a plurality of n-channel transistors; and in the NAND circuit, operation performance of each of the plurality of p-channel transistors is higher than that of each of the plurality of n-channel transistors.

In the shift register of the present invention, it is possible that the NOR circuit is made up of a plurality of p-channel transistors and a plurality of n-channel transistors; and in the NAND circuit, operation performance of each of the plurality of n-channel transistors is higher than that of each of the plurality of p-channel transistors.

In the shift register of the present invention, it is possible that both the setting signal and the resetting signal are active before the end of the simultaneous selection; and after the end of the simultaneous selection, the setting signal becomes inactive before the resetting signal becomes inactive.

In the shift register of the present invention, it is possible that the flip-flop has a set terminal and a reset terminal as its input terminals, but have no other terminals as its input terminals.

In the shift register of the present invention, it is possible that the flip-flop includes: a first CMOS circuit having a p-channel first transistor and an n-channel second transistor, a gate terminal of the p-channel first transistor being connected with a gate terminal of the n-channel second transistor, and a drain terminal of the p-channel first transistor being connected with a drain terminal of the n-channel second transistor, a second CMOS circuit having a p-channel third transistor and an n-channel fourth transistor, a gate terminal of the p-channel third transistor being connected with a gate terminal of the n-channel fourth transistor, and a drain terminal of the p-channel third transistor being connected with a drain terminal of the n-channel fourth transistor, a set transistor, a set terminal and a reset terminal, and a first output terminal and a second output terminal; a gate side of the first CMOS circuit, a drain side of the second CMOS circuit, and the first output terminal are connected with each other, and a gate side of the second CMOS circuit, a drain side of the first CMOS circuit, and the second output terminal are connected with each other; and the set transistor has (i) a gate terminal which is connected to the set terminal, (ii) a source terminal which is connected to the reset terminal, and (iii) a drain terminal which is connected to the first output terminal.

In the shift register of the present invention, it is possible that the set transistor is a p-channel transistor; and the setting signal has (i) a first electric potential when the setting signal is inactive or (ii) a second electric potential when the setting signal is active, the second electric potential being lower than the first electric potential.

The shift register of the present invention may further includes: a reset transistor which has (i) a gate terminal connected to the reset terminal, (ii) a source terminal connected to a first power supply line, and (iii) a drain terminal connected to the second output terminal.

The shift register of the present invention may further includes at least one of: a release transistor which has (i) a gate terminal connected to the reset terminal, (ii) a source terminal connected to a second power supply line, and (iii) a drain terminal connected to a source terminal of the second transistor; and a release transistor which has (i) a gate terminal connected to the set terminal, (ii) a source terminal connected to the second power supply line, and (iii) a drain terminal connected to a source terminal of the fourth transistor.

A display-driving circuit of the present invention includes the above described shift register.

A display-driving circuit of the present invention includes the shift register (which is automatically reset), the clock signal being fixedly active while the simultaneous selection is being carried out.

A displaying panel of the present invention includes the display-driving circuit and a pixel circuit, the display-driving circuit and the pixel circuit being formed monolithically.

A displaying device of the present invention includes the above described shift register.

A display-driving circuit of the present invention includes the shift register, the display-driving circuit being used in a displaying device having a pixel electrode connected to a data signal line and a scanning signal line via a switching element, the displaying device supplying, to a retention capacitor line, a modulating signal in accordance with a polarity of a signal potential written into the pixel electrode, the pixel electrode and the retention capacitor line forming a capacitor therebetween.

In the display-driving circuit of the present invention, it is possible that a retaining circuit, which receives a retention target signal, is provided for the stage, the retaining circuit (i) receiving the retention target signal when a control signal generated in the stage becomes active and then (ii) retaining the retention target signal; and the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a stage followed by the stage.

In the display-driving circuit of the present invention, it is possible that a retaining circuit, which receives a retention target signal, is provided for the stage; the retaining circuit (i) receives the retention target signal when a control signal generated in the stage becomes active and then (ii) retains the retention target signal; an output of the retaining circuit is supplied, as the modulating signal, to the retention capacitor line; and the control signal generated in the stage becomes active prior to an earliest vertical scan period of a displayed video.

In the display-driving circuit of the present invention, it is possible that a polarity of an electric potential of a signal supplied to the data signal line is inverted every plural horizontal scan periods.

In the display-driving circuit of the present invention, it is possible that a retaining circuit, which receives a retention target signal, is provided for the stage; the logical circuit receives (i) an output signal of the stage and (ii) an output signal of a following stage following the stage, and the retaining circuit which is provided for the stage (i) receives the retention target signal when an output of the logical circuit becomes active and then (ii) retains the retention target signal; the output signal of the stage is supplied to the scanning signal line connected to a pixel corresponding to the stage, and an output of the retaining circuit is supplied, as the modulating signal, to the retention capacitor line forming a capacitor with the pixel electrode of the pixel corresponding to the stage; and a phase of the retention target signal which is supplied to ones of the retaining circuits is different from that of a retention target signal which is supplied to other ones of the retaining circuits.

In the display-driving circuit of the present invention, it is possible that a retaining circuit, which receives a retention target signal, is provided for the stage, the retaining circuit (i) receiving the retention target signal when a control signal generated in the stage becomes active and then (ii) retaining the retention target signal; the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a followed stage followed by the stage; and a phase of the retention target signal which is supplied to ones of the retaining circuits is different from that of a retention target signal which is supplied to other ones of the retaining circuits.

The display-driving circuit of the present invention may have a first mode in which a polarity of an electric potential of a signal supplied to the data signal line is inverted every n horizontal scan period(s) (n is a natural number); and a second mode in which a polarity of an electric potential of a signal supplied to the data signal line is inverted every m horizontal scan period(s) (m is a natural number different from n), the display-driving circuit switching between the first mode and the second mode.

In the display-driving circuit of the present invention, it is possible that a retention target signal which is supplied to a first group of the retaining circuits has a first phase; and another retention target signal which is supplied to a second group of the retaining circuits has a second phase, the first phase and the second phase are set in accordance with whether the display-driving circuit is in the first mode or the second mode.

The present invention is not limited to the embodiments, but can be altered as appropriate based on a known technique or common technical knowledge. An embodiment derived from a proper combination of such alterations is also encompassed in the technical scope of the present invention. Moreover, the effects and functions, and the like described in the embodiments are merely examples.

INDUSTRIAL APPLICABILITY

The shift register of the present invention is suitable for use in various kinds of drivers, in particular, a driver of a liquid crystal display device.

REFERENCE SIGNS LIST 3a through 3h: Liquid crystal display device
ASW1 through ASW12, and asw: Analog switch
SR: Shift register
SRi: i-th stage of shift register
DCC: Display control circuit
GD: Gate driver
SD: Source driver
G-CsD: Gate-Cs driver
DAR: Display section
Gn: Scanning signal line
CSn: Retention capacitor line
PIXn: Pixel
CSLi: D-latch circuit provided for i-th stage of a shift register
FF: Flip-flop
ST: Set transistor (input transistor)
RT: Reset transistor (input transistor)
LRT: Latch release transistor
LC: Latch circuit
POL: (Data) polarity signal
CMI1, CMI2: CS inversion signal

The invention claimed is:

1. A shift register for use in a display-driving circuit which carries out simultaneous selection of a plurality of signal lines at a timing, the shift register comprising:
a stage, the stage including,
a set-reset type flip-flop, and
a signal generating circuit configured to receive a simultaneous selection signal, the signal generating circuit configured to generate an output signal of the stage based on an output of the flip-flop wherein,
the output signal of the stage (i) becomes active due to an activation of the simultaneous selection signal and then (ii) remains active during the simultaneous selection,
the output of the flip-flop (a) is active during a set period in which a setting signal is active, and (b) is inactive during a reset period in which a resetting signal is active,
the flip-flop is configured to cause the resetting signal to have priority over the setting signal such that the output of the flip-flop is a same state as the reset period while (i) the setting signal has the same state as the set period, and (ii) the resetting signal has the same state as the reset period,
the flip-flop is configured to (1) receive as the setting signal one of an output signal from a preceding stage, and an inverted version of the output signal from the preceding stage, and (2) receive as the resetting signal one of the output signal of the stage, an inverted version of the output signal of the stage, an output signal from a successive stage, and an inverted version of the output signal from the successive stage, and
the output of the flip-flop is the same state as the reset period during the simultaneous selection.

2. The shift register as set forth in claim 1, wherein:
the signal generating circuit is configured to (1) bring in a clock signal during the set period, and (2) cut off the clock signal during the simultaneous selection.

3. The shift register as set forth in claim 2, wherein:
the output of the flip-flop is supplied, as the switching signal, to the gate circuit.

4. The shift register as set forth in claim 1, wherein:
the signal generating circuit further includes a logical circuit and a gate circuit; and
the output of the flip-flop is supplied to the logical circuit, an output of the logical circuit is supplied to the gate circuit, and the output signal of the stage is fed back to the logical circuit and to a reset terminal of the flip-flop.

5. The shift register as set forth in claim 4, wherein:
the output of the gate circuit serves as the output signal of the stage.

6. The shift register as set forth in claim 4, wherein:
the signal generating circuit includes an outputting circuit which outputs, in accordance with the output of the gate circuit and the simultaneous selection signal, the output signal of the stage.

7. The shift register as set forth in claim 1, wherein:
the signal generating circuit includes an analog switch which is configured to (1) supply the simultaneous selection signal to an output terminal of the stage while the output of the flip-flop is inactive and (2) supply a clock signal to the output terminal of the stage while the output terminal of the flip-flop is active.

8. The shift register as set forth in claim 6, wherein:
the gate circuit selectively outputs (i) a clock signal or (ii) a signal having a constant potential which is equal to an electric potential of a power supply.

9. The shift register as set forth in claim 4, wherein:
the logical circuit includes an NAND circuit or an NOR circuit.

10. The shift register as set forth in claim 9, wherein:
the NAND circuit is made up of a plurality of p-channel transistors and a plurality of n-channel transistors; and
in the NAND circuit, operation performance of each of the plurality of p-channel transistors is higher than that of each of the plurality of n-channel transistors.

11. The shift register as set forth in claim 9, wherein:
the NOR circuit is made up of a plurality of p-channel transistors and a plurality of n-channel transistors; and
in the NOR circuit, operation performance of each of the plurality of n-channel transistors is higher than that of each of the plurality of p-channel transistors.

12. The shift register as set forth in claim 1, wherein:
both the setting signal and the resetting signal are active before the end of the simultaneous selection; and
after the end of the simultaneous selection, the setting signal becomes inactive before the resetting signal becomes inactive.

13. The shift register as set forth in claim 1, wherein:
the flip-flop has a set terminal and a reset terminal as its input terminals, but have no other terminals as its input terminals.

14. The shift register as set forth in claim 1, wherein the flip-flop includes:
a first CMOS circuit having a p-channel first transistor and an n-channel second transistor, a gate terminal of the p-channel first transistor being connected with a gate terminal of the n-channel second transistor, and a drain terminal of the p-channel first transistor being connected with a drain terminal of the n-channel second transistor,
a second CMOS circuit having a p-channel third transistor and an n-channel fourth transistor, a gate terminal of the p-channel third transistor being connected with a gate terminal of the n-channel fourth transistor, and a drain terminal of the p-channel third transistor being connected with a drain terminal of the n-channel fourth transistor,
a set transistor,
a set terminal and a reset terminal, and
a first output terminal and a second output terminal;
a gate side of the first CMOS circuit, a drain side of the second CMOS circuit, and the first output terminal are connected with each other, and a gate side of the second CMOS circuit, a drain side of the first CMOS circuit, and the second output terminal are connected with each other; and
the set transistor has (i) a gate terminal which is connected to the set terminal, (ii) a source terminal which is connected to the reset terminal, and (iii) a drain terminal which is connected to the first output terminal.

15. The shift register as set forth in claim 14, wherein:
the set transistor is a p-channel transistor; and
the setting signal has (i) a first electric potential when the setting signal is inactive or (ii) a second electric potential when the setting signal is active, the second electric potential being lower than the first electric potential.

16. The shift register as set forth in claim 14, further comprising:
a reset transistor which has (i) a gate terminal connected to the reset terminal, (ii) a source terminal connected to a first power supply line, and (iii) a drain terminal connected to the second output terminal.

17. The shift register as set forth in claim 14, further comprising at least one of:
a release transistor which has (i) a gate terminal connected to the reset terminal, (ii) a source terminal connected to a second power supply line, and (iii) a drain terminal connected to a source terminal of the second transistor; and
a release transistor which has (i) a gate terminal connected to the set terminal, (ii) a source terminal connected to the second power supply line, and (iii) a drain terminal connected to a source terminal of the fourth transistor.

18. A display-driving circuit comprising the shift register recited in claim 1.

19. A display-driving circuit comprising the shift register recited in claim 7, the clock signal being fixedly active during the simultaneous selection.

20. A displaying panel, comprising:
the display-driving circuit recited in claim 18; and
a pixel circuit,
the display-driving circuit and the pixel circuit being formed monolithically.

21. A displaying device comprising the shift register recited in claim 1.

22. A display-driving circuit comprising:
the shift register recited in claim 1, said display-driving circuit being used in a displaying device having a pixel electrode connected to a data signal line and a scanning signal line via a switching element, wherein
the displaying device is configured to supply, to a retention capacitor line, a modulating signal in accordance with a polarity of a signal potential written into the pixel electrode, the pixel electrode and the retention capacitor line forming a capacitor therebetween.

23. The display-driving circuit as set forth in claim 22, wherein:
a retaining circuit, which receives a retention target signal, is provided for the stage, the retaining circuit (i) receiving the retention target signal when a control signal generated in the stage becomes active and then (ii) retaining the retention target signal; and
the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a stage followed by the stage.

24. The display-driving circuit as set forth in claim 22, wherein:
a retaining circuit, which receives a retention target signal, is provided for the stage;
the retaining circuit (i) receives the retention target signal when a control signal generated in the stage becomes active and then (ii) retains the retention target signal;
an output of the retaining circuit is supplied, as the modulating signal, to the retention capacitor line; and
the control signal generated in the stage becomes active prior to an earliest vertical scan period of a displayed video.

25. The display-driving circuit as set forth in claim 22, wherein:
a polarity of an electric potential of a signal supplied to the data signal line is inverted every plural horizontal scan periods.

26. The display-driving circuit as set forth in claim 25, wherein:
a retaining circuit, which receives a retention target signal, is provided for the stage;
the logical circuit receives (i) an output signal of the stage and (ii) an output signal of a following stage following the stage, and the retaining circuit which is provided for the stage (i) receives the retention target signal when an output of the logical circuit becomes active and then (ii) retains the retention target signal;

the output signal of the stage is supplied to the scanning signal line connected to a pixel corresponding to the stage, and an output of the retaining circuit is supplied, as the modulating signal, to the retention capacitor line forming a capacitor with the pixel electrode of the pixel corresponding to the stage; and a phase of the retention target signal which is supplied to ones of the retaining circuits is different from that of a retention target signal which is supplied to other ones of the retaining circuits.

27. The display-driving circuit as set forth in claim 25, wherein:

a retaining circuit, which receives a retention target signal, is provided for the stage, the retaining circuit (i) receiving the retention target signal when a control signal generated in the stage becomes active and then (ii) retaining the retention target signal;

the output signal of the stage is supplied to the scanning signal line connected to a pixel corresponding to the stage, and an output of the retaining circuit provided for the stage is supplied, as the modulating signal, to a followed retention capacitor line forming a capacitor with a pixel electrode of a pixel corresponding to a followed stage followed by the stage; and a phase of the retention target signal which is supplied to ones of the retaining circuits is different from that of a retention target signal which is supplied to other ones of the retaining circuits.

28. The display-driving circuit as set forth in claim 26, having:

a first mode in which a polarity of an electric potential of a signal supplied to the data signal line is inverted every n horizontal scan period(s) (n is a natural number); and a second mode in which a polarity of an electric potential of a signal supplied to the data signal line is inverted every m horizontal scan period(s) (m is a natural number different from n), said display-driving circuit switching between the first mode and the second mode.

29. The display-driving circuit as set forth in claim 28, wherein:

a retention target signal which is supplied to a first group of the retaining circuits has a first phase; and another retention target signal which is supplied to a second group of the retaining circuits has a second phase, the first phase and the second phase are set in accordance with whether the display-driving circuit is in the first mode or the second mode.

30. The shift register as set forth in claim 1, wherein the shift register is configured to perform a shift register initialization to make outputs of the flip-flops included in respective stages of the shift register inactive during the simultaneous selection.

* * * * *